(12) United States Patent
Nakamura et al.

(10) Patent No.: US 8,013,052 B2
(45) Date of Patent: Sep. 6, 2011

(54) CURABLE RESIN, PRODUCTION METHOD THEREOF, EPOXY RESIN COMPOSITION, AND ELECTRONIC DEVICE

(75) Inventors: Shinya Nakamura, Tsukuba (JP); Tomoya Masuda, Tsukuba (JP); Mitsuo Katayose, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 627 days.

(21) Appl. No.: 11/816,571

(22) PCT Filed: Jan. 31, 2006

(86) PCT No.: PCT/JP2006/301584
§ 371 (c)(1),
(2), (4) Date: Aug. 17, 2007

(87) PCT Pub. No.: WO2006/087906
PCT Pub. Date: Aug. 24, 2006

(65) Prior Publication Data
US 2009/0023855 A1 Jan. 22, 2009

(30) Foreign Application Priority Data

Feb. 18, 2005 (JP) .............................. P2005-042108
Feb. 18, 2005 (JP) .............................. P2005-042117
Feb. 18, 2005 (JP) .............................. P2005-042131
Nov. 4, 2005 (JP) .............................. P2005-321439

(51) Int. Cl.
*C08G 65/48* (2006.01)
*C08G 77/00* (2006.01)

(52) U.S. Cl. ............... 524/540; 528/21; 528/23; 528/29

(58) Field of Classification Search ................... 524/540
See application file for complete search history.

(56) References Cited

U.S. PATENT DOCUMENTS 2,964,499 A * 12/1960 Weigel et al. ................. 526/195
(Continued)

FOREIGN PATENT DOCUMENTS

CN 1293685 5/2001
(Continued)

OTHER PUBLICATIONS

International Search Report, PCT/JP2006/301584, mailed Jun. 13, 2006.

(Continued)

*Primary Examiner* — Robert Loewe
(74) *Attorney, Agent, or Firm* — Antonelli, Terry, Stout & Kraus, LLP.

(57) ABSTRACT

A curable resin which exhibits excellent heat resistance while including an extremely smaller amount of volatile component is disclosed, and an electronic component device having excellent reliability in heat resistance and the like which contains the above curable resin is provided. A curable resin obtained in reaction of at least one compound (a) selected from the group consisting of the silane compounds represented by the following Formula (I-1) and the partial condensates thereof with a phenol compound (b), comprising a remaining volatile component in an amount of 10 wt % or less with respect to the total weight of the curable resin is used as a curing agent.

[Formula 1]

$$R^1{}_n SiR^2{}_{(4-n)} \qquad (I-1)$$

(Wherein, n denotes a number of 0 to 2; $R^1$ represent a hydrogen atom, or substituted or unsubstituted hydrocarbon groups having 1 to 18 carbon atoms; $R^2$ represent a halogen atom, a hydroxyl group, substituted or unsubstituted oxy groups, amino groups, and carbonyloxy groups having 1 to 18 carbon atoms; and two or more of $R^1$ and $R^2$ may bind to each other to form a cyclic structure).

23 Claims, 20 Drawing Sheets

U.S. PATENT DOCUMENTS

| | | | |
|---|---|---|---|
| 3,360,525 A * | 12/1967 | Frye | 546/14 |
| 3,461,095 A * | 8/1969 | Plueddemann et al. | 528/27 |
| 3,465,020 A * | 9/1969 | Frye | 556/443 |
| 3,565,859 A * | 2/1971 | Calas et al. | 528/34 |
| 3,652,484 A * | 3/1972 | Weissermel et al. | 524/265 |
| 3,926,896 A * | 12/1975 | Dumoulin | 524/261 |
| 4,055,546 A * | 10/1977 | Chu et al. | 525/480 |
| 4,198,498 A * | 4/1980 | LeGrand et al. | 528/38 |
| 4,307,212 A | 12/1981 | Stark, Jr. | |
| 4,503,243 A | 3/1985 | Spivack et al. | |
| 4,546,018 A * | 10/1985 | Ryuzo et al. | 427/407.2 |
| 4,775,497 A * | 10/1988 | Pastor et al. | 530/213 |
| 4,808,483 A | 2/1989 | Nakasuji et al. | 428/447 |
| 4,868,320 A * | 9/1989 | Meier et al. | 556/408 |
| 4,904,504 A * | 2/1990 | Isozaki et al. | 427/387 |
| 4,924,021 A * | 5/1990 | Kotzsch et al. | 556/464 |
| 5,019,607 A * | 5/1991 | Coltrain et al. | 523/435 |
| 5,391,691 A * | 2/1995 | Yokoyama et al. | 528/198 |
| 5,728,770 A * | 3/1998 | Yamamoto et al. | 524/755 |
| 5,834,551 A * | 11/1998 | Haraguchi et al. | 524/492 |
| 6,423,416 B1* | 7/2002 | Nanavati | 428/447 |
| 6,441,106 B1* | 8/2002 | Goda et al. | 525/487 |
| 6,444,412 B1 | 9/2002 | Clarke et al. | 430/372 |
| 6,506,868 B1* | 1/2003 | Goda et al. | 528/27 |
| 2004/0198925 A1* | 10/2004 | Morita et al. | 525/525 |
| 2004/0214003 A1* | 10/2004 | Umeno et al. | 428/413 |
| 2005/0075474 A1 | 4/2005 | Horimoto et al. | |

FOREIGN PATENT DOCUMENTS

| | | |
|---|---|---|
| EP | 1 086 972 | 3/2001 |
| JP | 59-134799 | 8/1984 |
| JP | 2000-281756 | 10/2000 |
| JP | 2001-059013 | 3/2001 |
| JP | 2001-294639 | 10/2001 |
| JP | 2002-249539 | 9/2002 |
| JP | 2004-156036 | 6/2004 |
| JP | 2005-048110 | 2/2005 |
| JP | 2005-298794 | 10/2005 |

OTHER PUBLICATIONS

M. Kira, et al.., "Pentacoordinate Allylsillicates: Characterization and Highly Stereoselective Reaction with Aldehydes" Journal of American Chemical Society, Jan. 1988, 110, pp. 4599-4602.

Taiwanese Official Action issued Jun. 30, 2009, for Application No. 95104251.

M. Kira, et al., "Pentacoordinate Allylsilicates: Characterization and Highly Stereoselective Reaction with Aldehydes", *Journal of the American Chemical Society,* vol. 110, No. 14, 1988, pp. 4599-4602.

Chinese Official Action issued Mar. 15, 2010, for Application No. 200680005449.0.

* cited by examiner

Y1 axis: chromatogram
Mn= 431 : Mw= 574 : Mz= 754 : Mw/Mn= 1.331

CURABLE RESIN, PRODUCTION METHOD THEREOF, EPOXY RESIN COMPOSITION, AND ELECTRONIC DEVICE

FIELD OF THE INVENTION

The present invention relates to a novel curable resin and a production method thereof. More specifically, it relates to a novel curable resin useful as an epoxy resin-curing agent and a production method thereof, a molding material containing the curable resin as a curing agent, an epoxy resin composition favorably used in a wide range of applications such as laminated sheet, adhesive agent, paint, and ink, and an electronic device having an element sealed with the epoxy resin composition.

BACKGROUND OF THE INVENTION

Conventionally, curable resins including epoxy resins have been widely used in a variety of applications including molding materials, materials for laminated sheet or adhesive agent, various electronic or electric parts, paint and ink materials, and others. In particular, epoxy resin compositions have been used widely as sealants in the applications demanding sealing of electronic parts and elements such as transistor and IC. It is because epoxy resins are well balanced in various properties including moldability, electrical properties, moisture resistance, heat resistance, mechanical properties, adhesion to inserted parts, and others.

On the other hand, in the recent trend toward acceleration and increase in density of electronic parts, heat generation from the electronic devices is becoming more significant. There are also an increasing number of electronic parts that operate at high temperature. Accordingly, there are severe requirements in heat resistance imposed on plastics, in particular epoxy resin hardened products, used in electronic parts.

For improvement in the various properties of epoxy resin hardened product, Japanese Patent Application Laid-Open Nos. 2001-59013 and 2002-249539 disclose methods of using an alkoxy group-containing silane-modified epoxy resin that is obtained by modifying at least part of a hydroxyl group-containing epoxy resin such as bisphenol epoxy resin with an alkoxysilane or the partial condensate thereof as a curing agent. Alternatively, Japanese Patent Application Laid-Open Nos. 2000-281756 and 2001-294639 disclose methods of using an alkoxy group-containing silane-modified phenol resin obtained by modifying part of a phenol resin with an alkoxysilane or the partial condensates thereof as a curing agent.

SUMMARY OF THE INVENTION

It is possible to improve the heat resistance of epoxy resin hardened products by the method above. However, all of the curing agents used in the methods above have an alkoxysilyl group, and thus, generate an alcohol such as methanol or ethanol in the curing reaction of the curing agent with an epoxy resin. Presence of the volatile component such as alcohols is undesirable, because it leads to generation of voids in the hardened product and thus to expansion of the curing shrinkage ratio (molding shrinkage ratio) of the hardened product. In addition, use of a resin that includes almost no volatile component including solvent in the methods above results in increase in the molecular weight of the resulting resin, which in turn leads to occasional gelation of the resin and thus, decrease in handleability efficiency. Further, the hardened product obtained did not have an effect to sufficiently improve heat resistance.

An object of the present invention, which was made under the circumstances above, is to provide a novel curable resin superior in various properties including heat resistance that includes an extremely smaller amount of volatile component and allows favorable control of the molecular weight. Another object of the present invention is to provide an electronic device having high reliability in heat resistance or the like by using its elements as a sealant, an epoxy resin composition containing the curable resin above as a curing agent.

After intensive studies to solve the problems above, the inventors have found that a curable resin obtained in reaction of a particular silane compound with a phenol compound is useful and it is possible to achieve the desired object by using the curable resin, and thus, completed the present invention.

Embodiments of the present invention will be listed below:

As an embodiment of the present invention, there is provided a curable resin obtained in reaction of at least one compound (a) selected from the group consisting of the silane compounds represented by the following Formula (I-1) and the partial condensates thereof with a phenol compound (b), characterized in that the content of volatile component remaining in the curable resin is 10 wt % or less with respect to the total weight of the curable resin.

[Formula 1]

$$R^1_n SiR^2_{(4-n)} \quad (I-1)$$

(Wherein, n denotes a number of 0 to 2;

$R^1$ each independently represent a group selected from the group consisting of a hydrogen atom and substituted or unsubstituted hydrocarbon groups having 1 to 18 carbon atoms, and may be identical or different from each other;

$R^2$ each independently represent a group selected from the group consisting of a halogen atom, a hydroxyl group, substituted or unsubstituted oxy groups having 1 to 18 carbon atoms, substituted or unsubstituted amino groups having 1 to 18 carbon atoms, and carbamoyloxy groups having 2 to 18 carbon atom, and may be identical or different from each other; and two or more of $R^1$ and $R^2$ may bind to each other to form a cyclic structure).

In the embodiment above, the number of the unreacted $R^2$ groups in the curable resin obtained in reaction of at least one compound (a) selected from the group consisting of the silane compounds represented by the following Formula (I-1) with a phenol compound (b) is preferably 10% or less with respect to the total number of the $R^2$ groups in the silane compound (a) when the reaction is initiated. Preferably, there is a divalent phenol compound contained in the phenol compound (b) in an amount of 70 wt % or more with respect to the total weight of the phenol compounds. In addition, 50 wt % or more of the phenol compounds (b), with respect to the total weight of the phenol compounds, is preferably a phenol compound cyclizable with at least one compound (a). Further, at least one compound (a) is preferably a compound having a hydroxyl group or a monovalent oxy group as $R^2$.

As another embodiment of the present invention, there is provided a curable resin having an aryloxysilyl (ArO—Si) bond, characterized by including at least one structural unit selected from the group consisting of the structural units represented by following Formula (I-2a), (I-3a), (I-2b), and (I-3b):

[Formula 2]

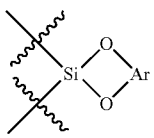
(I-2a)

(Wherein, Ar represents a divalent organic group having 2 to 30 carbon atoms and having aromatic cyclic compound-derived groups at both sides);

[Formula 3]

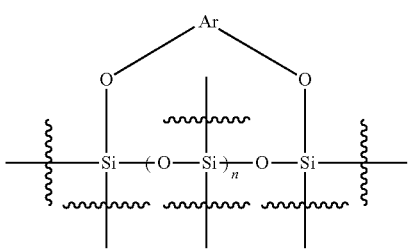
(I-3a)

(Wherein, Ar represents a divalent organic group having 2 to 30 carbon atoms and having aromatic cyclic compound-derived groups at both sides; and n denotes a number of 0 or more);

[Formula 4]

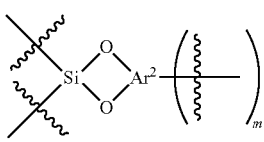
(I-2b)

(Wherein, $Ar^2$ represents a (m+2)-valent organic group having 2 to 30 carbon atoms and having at least two aromatic cyclic compound-derived binding sites; and m denotes an integer of one or more); and

[Formula 5]

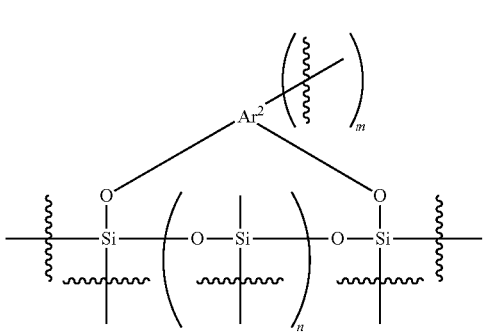
(I-3b)

(Wherein, $Ar^2$ represents a (m+2)-valent organic group having 2 to 30 carbon atoms and having at least two aromatic cyclic compound-derived binding sites; n denotes a number of 0 or more; and m denotes an integer of one or more).

In the embodiment above, the aryloxysilyl bond constituting at least one structural unit selected from the group consisting of Formula (I-2a), (I-3a), (I-2b), and (I-3b) is contained at an number of 30% or more with respect to the total number of the aryloxysilyl bonds in the curable resin. In addition, the amount of the volatile component in the curable resin is preferably 10 wt % or less with respect to the total weight of the curable resin.

As yet another embodiment of the present invention, there is provided a curable resin, characterized by including at least one of a compound having the structural unit represented by the following Formula (I-4a) and a compound having the structural unit represented by the following Formula (I-4b):

[Formula 6]

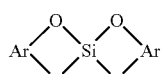
(I-4a)

(Wherein, Ar represents a divalent organic group having 2 to 30 carbon atoms and having aromatic cyclic compound-derived groups at both sides); and

[Formula 7]

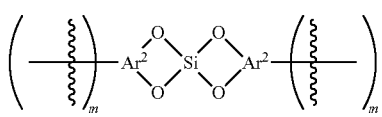
(I-4b)

(Wherein, $Ar^2$ represents a (m+2)-valent organic group having 2 to 30 carbon atoms and having at least two aromatic cyclic compound-derived binding sites; and each m independently denotes an integer of 1 or more).

As yet another embodiment of the present invention, there is provided a method of producing the curable resin above, characterized by including a step of allowing at least one compound (a) selected from the group consisting of the silane compounds represented by the following Formula (I-1) and the partial condensates thereof to react with a phenol compound (b):

[Formula 8]

$$R^1{}_n SiR^2{}_{(4-n)} \qquad (I\text{-}1)$$

(Wherein, n denotes a number of 0 to 2;
$R^1$ each independently represent a group selected from the group consisting of a hydrogen atom and substituted or unsubstituted hydrocarbon groups having 1 to 18 carbon atoms, and may be identical or different from each other;
$R^2$ each independently represent a group selected from the group consisting of a halogen atom, a hydroxyl group, substituted or unsubstituted oxy groups having 1 to 18 carbon atoms, substituted or unsubstituted amino groups having 1 to 18 carbon atoms, and carbonyloxy groups having 2 to 18 carbon atom, and may be identical or different from each other; and
two or more of $R^1$ and $R^2$ may bind to each other to form a cyclic structure).

In the embodiment above, the reaction between compounds (a) and (b) is performed under the presence of a catalyst selected from the group consisting of phosphine compounds, phosphonium salt compounds, cyclic amidine compounds, and cyclic amidinium salts. In addition, the catalyst is preferably a phosphine compound represented by the following Formula (I-5) or the intermolecular salt thereof.

[Formula 9]

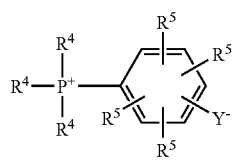

(I-5)

(Wherein, $R^4$ each independently represent a group selected from the group consisting of a hydrogen atom and substituted or unsubstituted hydrocarbon groups having 1 to 18 carbon atoms, and may be identical or different from each other; and two or more of $R^4$ may bind to each other to form a cyclic structure;

$R^5$ each independently represent a group selected from the group consisting of a hydrogen atom, a hydroxyl group, and substituted or unsubstituted organic groups having 1 to 18 carbon atoms, and may be identical or different from each other; and two or more $R^5$ may bind to each other to form a cyclic structure;

$Y^-$ represents an organic group resulting from the release of a proton from an organic group having 0 to 18 carbon atoms and having one or more releasable protons ($H^+$); and $Y^-$ may bind to one or more $R^5$ to form a cyclic structure).

As yet another embodiment of the present invention, there is provided a curable resin composition, characterized by including the curable resin described above.

Yet another embodiment of the present invention is an epoxy resin composition containing an epoxy resin (A) and a curing agent (B), characterized in that the curing agent (B) includes a curable resin in one of the embodiments of the present invention above. In the embodiment above, the composition preferably includes an accelerator (C) additionally. In addition, the composition preferably includes an inorganic filler (D) additionally. Further, the epoxy resin (A) preferably includes at least one epoxy resin selected from the group consisting of biphenyl epoxy resins, stilbene epoxy resins, diphenylmethane epoxy resins, sulfur atom-containing epoxy resins, novolak epoxy resins, dicyclopentadiene epoxy resins, salicyl aldehyde epoxy resins, naphthol/phenol copolymerization epoxy resins, and aralkyl phenol resin epoxides, and naphthalene epoxy resins.

As yet another embodiment of the present invention, there is provided an electronic device, characterized by containing an element sealed with the epoxy resin composition in an embodiment of the present invention.

As yet another embodiment of the present invention, there is provided an electronic device, characterized by containing an element sealed with the curable resin composition in an embodiment of the present invention.

The novel curable resin the in the embodiment of the present invention can be used in various applications. For example, the novel curable resin is useful as an epoxy resin-curing agent, and an epoxy resin composition containing the same is superior in heat resistance and gives a hardened product with fewer voids or cracks. In particular, it is possible to provide a high-reliability electronic device by preparing an epoxy resin composition in the embodiment of the invention and sealing an electronic device such as IC or LSI with the composition, and thus, the industrial value of the present invention is high. The entire disclosures of Japanese Patent Application Nos. 2005-42108, 2005-42117, and 2005-42131 filed on Feb. 18, 2005 and ibid., 2005-321439 filed on Nov. 4, 2005 are incorporated by reference in the present description.

DESCRIPTION OF THE PREFERRED EMBODIMENTS

Figure 1:
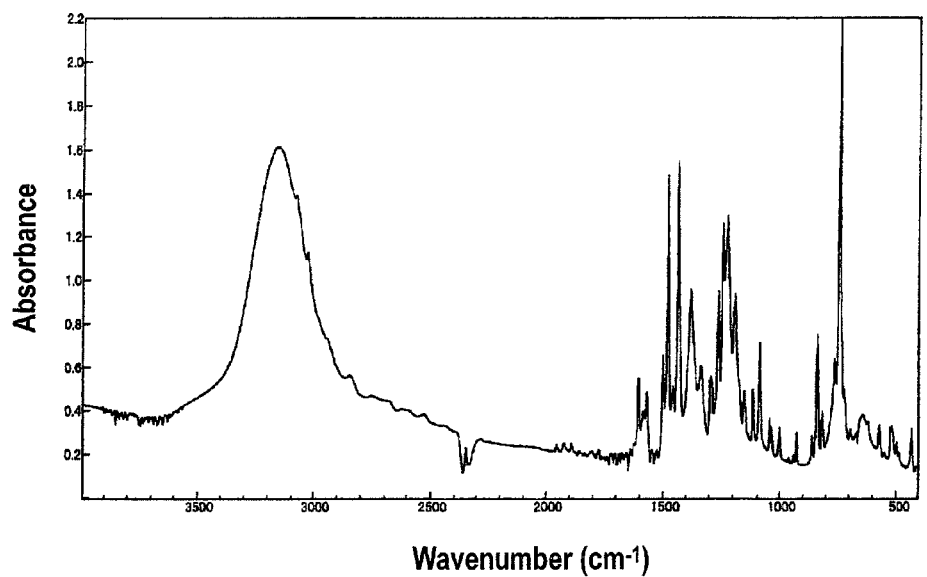
FIG. 1 is an IR spectrum of the 2,2'-biphenol used in a Synthesis example of the curable resin according to the present invention.

Hereinafter, embodiments of the present invention will be described in detail.

The novel curable resin in an embodiment of the present invention characteristically includes a curable resin obtained in reaction of at least one compound (a) selected from the group consisting of the silane compounds represented by the following Formula (I-1) and the partial condensates thereof with a phenol compound (b), wherein the content of remaining volatile component is 10 wt % or less with respect to the total weight of the curable resin.

[Formula 10]

(I-1)

(Wherein, n denotes a number of 0 to 2;

$R^1$ each independently represent a group selected from the group consisting of a hydrogen atom and substituted or unsubstituted hydrocarbon groups having 1 to 18 carbon atoms, and may be identical or different from each other;

$R^2$ each independently represent a group selected from the group consisting of a halogen atom, a hydroxyl group, substituted or unsubstituted oxy groups having 1 to 18 carbon atoms, substituted or unsubstituted amino groups having 1 to 18 carbon atoms, and carbonyloxy groups having 2 to 18 carbon atoms, and may be identical or different from each other; and two or more of $R^1$ and $R^2$ may bind to each other to form a cyclic structure).

In Formula (I-1) above, "n" is not particularly limited if it denotes a number of 0 to 2. However, n is preferably 0 or 1 from the viewpoint of heat resistance, and n is preferably 2 from the viewpoint of the low stress of the curable resin obtained.

The "volatile component" above mean by-products of the reaction of a silane compound (a) and a phenol compound (b) such as water, alcohol, ammonia, amine, carboxylic acid, hydrogen halide, a solvent used arbitrarily needed during reaction, and a solvent contained arbitrarily for example for adjustment of resin viscosity; and the unreacted $R^2$ groups in the curable resin, main product of the reaction are also regarded as potential volatile component. In other words, when used for example as an epoxy resin-curing agent, a curable resin containing unreacted $R^2$ groups gives volatile component such as water, alcohol, ammonia, amine, carboxylic acid, or hydrogen halide during curing reaction.

Preferably when the curable resin according to the present invention is used as a molding material such as sealer, most of the by-products and solvents are normally separated and removed from the curable resin during the reaction and the curable resin finally obtained does not essentially include such components. For that reason, the "content of the remaining volatile component in curable resin" described in the present description is a value with respect to the total weight of the curable resin after separation-removal of the by-products and solvents. The "volatile component remaining in the curable resin" mean the by-products and the solvents remaining without separation during reaction and the components derived from the groups $R^2$ remaining unreacted; and, in the present invention, the total weight of the volatile component is characteristically 10 wt % or less with respect to the total weight of the curable resin. The content of the volatile component in the curable resin according to the present invention is preferably less than 5 wt %, more preferably less than 2 wt %, and still more preferably less than 0.5 wt %. When there are unreacted $R^2$ groups, the weight thereof is calculated, by assuming that the groups are converted in reaction, for example, to volatile component such as water, alcohol, ammonia, amine, and carboxylic acid.

When the curable resin according to the present invention is used in applications other than molding material such as laminated sheet, adhesive agent, and paint, the resin may contain the by-products and the solvent used as needed. In these applications, it is easily possible to remove the by-product and the solvent by properly selecting the condition, but it is difficult to prevent the void generation by the components $R^2H$ generated from the unreacted $R^2$ groups, because reaction of the unreacted $R^2$ groups and hardening of the curable resin proceed almost under the same condition. From the viewpoints above, the curable resin according to the present invention is preferably a curable resin obtained in reaction of a silane compound (a) represented by Formula (I-1) above and/or the partial condensate thereof with a phenol compound (b), wherein the curable resin includes preferably a unreacted $R^2$ group number of 10% or less, more preferably 5% or less, and still more preferably 3% or less, with respect to the total number of the $R^2$ groups in the silane compound (a) when the reaction is initiated.

(Silane Compound)

The "substituted or unsubstituted hydrocarbon groups having 1 to 18 carbon atoms" represented by $R^1$ in the silane compound represented by Formula (I-1) above include aliphatic and aromatic hydrocarbon groups having 1 to 18 carbon atoms that may be unsubstituted or substituted.

Specific examples of the substituted or unsubstituted aliphatic hydrocarbon groups include aliphatic hydrocarbon groups such as methyl, ethyl, propyl, isopropyl, n-butyl, sec-butyl, tert-butyl, pentyl, hexyl, octyl, decyl, dodecyl, allyl, and vinyl group; and those substituted with an alkyl group, an alkoxy group, an aryl group, a hydroxyl group, an amino group, a halogen atom, an epoxy group-containing group such as glycidyloxy, epoxycyclohexyl, or epoxy, a methacryloxy group, a mercapto group, an imino group, a ureido group, or an isocyanate group.

The substituted or unsubstituted aliphatic hydrocarbon groups also include substituted or unsubstituted alicyclic hydrocarbon groups. Examples of the substituted or unsubstituted alicyclic hydrocarbon groups include cyclopentyl, cyclohexyl, cycloheptyl, cyclopentenyl, and cyclohexenyl groups; and those further substituted with an alkyl group, an alkoxy group, an aryl group, an aryloxy group, a hydroxyl group, an amino group, a halogen atom, an epoxy group-containing group such as glycidyloxy, epoxycyclohexyl or epoxy, a methacryloxy group, a mercapto group, an imino group, a ureido group, or an isocyanate group.

Examples of the substituted or unsubstituted aromatic hydrocarbon groups include aryl group such as phenyl and toluoyl; alkyl group-substituted aryl groups such as dimethylphenyl, ethylphenyl, butylphenyl, and tert-butylphenyl; alkoxy group-substituted aryl groups such as methoxyphenyl, ethoxyphenyl, butoxyphenyl, and tert-butoxyphenyl; and the like, and additionally, those further substituted with an alkyl group, an alkoxy group, an aryl group, an aryloxy group, an amino group, a halogen atom, an epoxy group-containing group such as glycidyloxy, epoxycyclohexyl or epoxy, a methacryloxy group, a mercapto group, an imino group, an ureido group, or isocyanate group.

$R^1$ in Formula (I-1) above is not particularly limited, but preferably a monovalent group selected from the group consisting of alkyl and aryl groups. Among them, from the viewpoint of availability of the raw material is a group selected from unsubstituted or alkyl group and/or alkoxy group and/or hydroxyl group-substituted aryl groups such as phenyl, p-toluoyl, m-toluoyl, o-toluoyl, p-methoxyphenyl, m-methoxyphenyl, and o-methoxyphenyl; and substituted or unsubstituted linear or cyclic alkyl groups such as methyl, ethyl, propyl, isopropyl, butyl, sec-butyl, tert-butyl, octyl, cyclohexyl, epoxycyclohexylethyl, glycidoxypropyl, chloropropyl, methacryloxypropyl, mercaptopropyl, aminopropyl, N-phenylaminopropyl, N-aminopropylaminopropyl, ureidopropyl, and isocyanatopropyl.

Examples of the "halogen atom" represented by $R^2$ in Formula (I-1) include fluorine, chlorine, bromine, and iodine atoms.

Examples of the "substituted or unsubstituted oxy group having 1 to 18 carbon atoms" represented by $R^2$ in Formula (I-1) include "substituted or unsubstituted aliphatic hydrocarbon oxy groups having 1 to 18 carbon atoms", and "substituted or unsubstituted aromatic hydrocarbon oxy groups having 1 to 18 carbon atoms". Typical preferable examples thereof include the followings.

Examples of the "substituted or unsubstituted aliphatic hydrocarbon oxy groups having 1 to 18 carbon atoms" include groups having a structure of an aliphatic hydrocarbon group described above as $R^1$ and an oxygen atom bound thereto such as methoxy, ethoxy, propoxy, isopropoxy, n-butoxy, sec-butoxy, tert-butoxy, cyclopropyloxy, cyclohexyloxy, cyclopentyloxy, allyloxy, and vinyloxy; and those further substituted with an alkyl group, an alkoxy group, an aryl group, an aryloxy group, an amino group, a halogen atom, or the like.

Examples of the "substituted or unsubstituted aromatic hydrocarbon oxy groups having 1 to 18 carbon atoms" include groups having a structure of an aromatic hydrocarbon group described above as $R^1$ bound to an oxygen atom such as phenoxy, methylphenoxy, ethylphenoxy, methoxyphenoxy, butoxyphenoxy and phenoxyphenoxy; and those further substituted with an alkyl group, an alkoxy group, an aryl group, an aryloxy group, an amino group, or a halogen atom.

Examples of the "substituted or unsubstituted amino group having 0 to 18 carbon atoms" represented by $R^2$ in Formula (I-1) include unsubstituted amino groups, substituted or unsubstituted aliphatic hydrocarbon amino groups, aromatic hydrocarbon amino groups, dialiphatic hydrocarbon amino groups, diaromatic hydrocarbon amino groups, aliphatic hydrocarbon aromatic hydrocarbon amino groups, and silylamino groups having 1 to 18 carbon atoms. Specific examples are as follows:

Examples of the "substituted or unsubstituted aliphatic hydrocarbon amino groups having 1 to 18 carbon atoms" include amino groups substituted with an aliphatic hydrocarbon group described above as $R^1$ such as methylamino, ethylamino, propylamino, isopropylamino, n-butylamino, sec-butylamino, tert-butylamino, pentylamino, hexylamino, octylamino, decylamino, dodecylamino, cyclopentylamino, cyclohexylamino, cycloheptylamino, allylamino, vinylamino, cyclopentenylamino, and cyclohexenylamino; and those having its aliphatic hydrocarbon group region further substituted with an alkyl group, an alkoxy group, an aralkyl group, an aryl group, a hydroxyl group, an amino group, or a halogen atom.

Examples of the "substituted or unsubstituted aromatic hydrocarbon amino groups having 1 to 18 carbon atoms" include amino groups substituted with an aliphatic hydrocarbon group described above as $R^1$ such as phenylamino, naphthylamino, toluoylamino, dimethylphenylamino, ethylphenylamino, butylphenylamino, tert-butylphenylamino, methoxyphenylamino, ethoxyphenylamino, butoxyphenylamino, and tert-butoxyphenylamino; and those having its aromatic hydrocarbon group region further substituted with an alkyl group, an alkoxy group, an aryl group, an aryloxy group, an amino group, or a halogen atom.

Examples of the "substituted or unsubstituted dialiphatic hydrocarbon amino groups having 1 to 18 carbon atoms" include amino groups substituted with two aliphatic hydrocarbon groups described above as $R^1$ such as dimethylamino, diethylamino, dipropylamino, diisopropylamino, di-n-butylamino, di-sec-butylamino, di-tert-butylamino, dicyclopentylamino, dicyclohexylamino, dicycloheptylamino, ethylmethylamino, methylisopropylamino, methyl-n-butylamino, methyl-sec-butylamino, methyl-tert-butylamino, methylcyclohexylamino, diallylamino, divinylamino, dicyclopentenylamino, dicyclohexenylamino, and allylmethylamino; and those having its aliphatic hydrocarbon group region further substituted with an alkyl group, an alkoxy group, an aralkyl group, an aryl group, a hydroxyl group, an amino group, or a halogen atom.

Examples of the "substituted or unsubstituted diaromatic hydrocarbon amino groups having 1 to 18 carbon atoms" include amino group substituted with two aromatic hydrocarbon groups described above as $R^1$ such as diphenylamino, dinaphthylamino, ditolylamino, bis(dimethylphenyl)amino, bis(ethylphenyl)amino, bis(butylphenyl)amino, bis(tert-butylphenyl)amino, bis(methoxyphenyl)amino, bis(ethoxyphenyl)amino, bis(butoxyphenyl)amino, and bis(tert-butoxyphenyl)amino; and those having its aromatic hydrocarbon group region further substituted with an alkyl group, an alkoxy group, an aryl group, an aryloxy group, an amino group, or a halogen atom.

Examples of the "substituted or unsubstituted aliphatic hydrocarbon aromatic hydrocarbon amino groups having 1 to 18 carbon atoms" include amino groups substituted with an aliphatic hydrocarbon group and an aromatic hydrocarbon group described above as $R^1$ such as methylphenylamino, methylnaphthylamino, and butylphenylamino.

Examples of the "substituted or unsubstituted silylamino groups having 0 to 18 carbon atoms" include unsubstituted silylamino groups, silylamino groups with its silyl group and/or amino group substituted with aliphatic hydrocarbon groups and/or aromatic hydrocarbon groups described above as R¹ such as unsubstituted silylamino, trimethylsilylamino, triethylsilylamino, triphenylsilylamino, methyl(trimethylsilyl)amino, methyl(triphenylsilyl)amino, phenyl(trimethylsilyl)amino, and phenyl(triphenylsilyl)amino; and those with its aliphatic hydrocarbon group and/or its aromatic hydrocarbon group region further substituted with an alkyl group, an alkoxy group, an aryl group, an aryloxy group, an amino group, or a halogen atom.

Examples of the "substituted or unsubstituted carbonyloxy group having 2 to 18 carbon atoms" represented by R² in Formula (I-1) include "substituted or unsubstituted aliphatic hydrocarbon carbonyloxy groups having 2 to 18 carbon atoms" and "substituted or unsubstituted aromatic hydrocarbon carbonyloxy groups having 2 to 18 carbon atoms", and the like. Specific examples thereof include the follows:

Examples of the "substituted or unsubstituted aliphatic hydrocarbon carbonyloxy groups having 2 to 18 carbon atoms" include carbonyloxy groups substituted with an aliphatic hydrocarbon group described above as R¹ such as methylcarbonyloxy, ethylcarbonyloxy, propylcarbonyloxy, isopropylcarbonyloxy, n-butylcarbonyloxy, sec-butylcarbonyloxy, tert-butylcarbonyloxy, cyclopropylcarbonyloxy, cyclohexylcarbonyloxy, cyclopentylcarbonyloxy, allylcarbonyloxy, and vinylcarbonyloxy;

and those with its aliphatic hydrocarbon group region further substituted with an alkyl group, an alkoxy group, an aryl group, an aryloxy group, an amino group, or a halogen atom.

Examples of the "substituted or unsubstituted aromatic hydrocarbon carbonyloxy groups having 2 to 18 carbon atoms" include carbonyloxy groups substituted with an aromatic hydrocarbon group described above as R¹ such as phenylcarbonyloxy, methylphenylcarbonyloxy, ethylphenylcarbonyloxy, methoxyphenylcarbonyloxy, butoxyphenylcarbonyloxy, and phenoxyphenylcarbonyloxy; and those with its aromatic hydrocarbon group region further substituted with an alkyl group, an alkoxy group, an aryl group, an aryloxy group, an amino group, or a halogen atom.

R² in Formula (I-1) above is not particularly limited, but preferably a chlorine atom, a hydroxyl group, or a substituted or unsubstituted monovalent oxy group having 1 to 8 carbon atoms because of availability. More preferable among them from the viewpoint of reactivity is a chlorine atom, a hydroxyl group or an oxy group; and still more preferably, considering the influence on the long-term reliability of the hardened product prepared by using the curable resin according to the present invention as an epoxy resin-curing agent, at least one of the groups R² is a hydroxyl group or an oxy group having 1 to 8 carbon atoms.

The phrase "two or more of R¹ and R² may bind to each other to form a cyclic structure" used in Formula (I-1) means that R¹ and R² bind to each other to form a divalent or higher organic group as a whole. Examples of the organic groups used when two groups R¹ bind to a Si atom forming a cyclic structure include alkylene groups such as ethylene, propylene, butylene, pentylene, and hexylene; alkenyl groups such as ethylenyl, propylenyl, and butyleneyl; aralkylene groups such as methylenephenylene; and arylene groups such as phenylene, naphthylene, and anthracenylene; and the like.

Examples the groups used when one R¹ and one R² bind to a Si atom forming a cyclic structure include oxy groups of the alkylene, alkenyl, aralkylene, and arylene groups above. Examples thereof used when two groups R² bind to a Si atom forming a cyclic structure include dioxy groups of the alkylene, alkenyl, and aralkylene groups above. The organic groups above may be additionally substituted with an alkyl group, an alkoxy group, an aryl group, an aryloxy group, an amino group, a hydroxyl group, a halogen atom, an epoxy group-containing group such as glycidyloxy, epoxycyclohexyl or epoxy, methacryloxy group, a mercapto group, an imino group, a ureido group, or an isocyanate group.

Typical compounds represented by Formula (I-1) above are listed below, but are not limited thereto. Silane compounds wherein n is 0 include tetraethoxysilane, tetramethoxysilane, tetrabutoxysilane, tetrakis(ethoxyethoxy)silane, tetrakis(methoxyethoxy)silane, tetrapropoxysilane, tetraaryloxysilane, tetrachlorosilane, tetrabromosilane, tetraacetoxysilane, tetrakis(dimethylamino)silane and the like.

Silane compounds wherein n is 1 include phenyltriethoxysilane, phenyltrimethoxysilane, phenyltrichlorosilane, phenyltrifluorosilane, phenylacetoxysilane, phenylbis(dimethylamino)chlorosilane, methyltriethoxysilane, methyltrimethoxysilane, methyltrichlorosilane, methylacetoxysilane, ethyltriethoxysilane, ethyltrimethoxysilane, ethyltrichlorosilane, ethylacetoxysilane, vinyltriethoxysilane, vinyltrimethoxysilane, vinyltrichlorosilane, vinylacetoxysilane, n-propyltriethoxysilane, n-propyltrimethoxysilane, γ-methacryloxypropyltriethoxysilane, γ-methacryloxypropyltrimethoxysilane, γ-mercaptopropyltriethoxysilane, γ-mercaptopropyltrimethoxysilane, γ-isocyanatopropyltriethoxysilane, γ-isocyanatopropyltrimethoxysilane, γ-aminopropyltrimethoxysilane, γ-ureidopropyltrimethoxysilane, γ-chloropropyltrimethoxysilane, γ-anilinopropyltrimethoxysilane, β-(3,4-epoxycyclohexyl)ethyltrimethoxysilane, γ-glycidoxypropyltrimethoxysilane, γ-glycidoxypropyltriethoxysilane and the like.

Silane compounds wherein n is 2 include substituted or unsubstituted diaryl dialkoxysilanes such as diphenyldimethoxysilane, diphenyldiethoxysilane, and dimesityldimethoxysilane; substituted or unsubstituted dialkyl dialkoxysilanes such as dimethyldimethoxysilane, dimethyldiethoxysilane, dimethyldipropoxysilane, diethyldiethoxysilane, decylmethyldiethoxysilane, dicyclopentyldimethoxysilane, divinyl diethoxysilane, vinylmethyldimethoxysilane, γ-methacryloxypropylmethyldimethoxysilane, γ-glycidoxypropylmethyldimethoxysilane, and γ-glycidoxypropylmethyldiethoxysilane; aryl alkyl dialkoxysilanes such as phenylmethyldiethoxysilane, phenylmethyldimethoxysilane, and vinylphenyldiethoxysilane; substituted or unsubstituted diarylsilanediols such as diphenylsilanediol; substituted or unsubstituted diaryl dichlorosilanes such as diphenyldichlorosilane, ditolyldichlorosilane, and dimesityldichlorosilane; substituted or unsubstituted dialkyl dichlorosilanes such as dimethyldichlorosilane, dodecylmethyldichlorosilane, divinyldichlorosilane, and diisopropyldichlorosilane; substituted or unsubstituted aryl alkyl dichlorosilanes such as phenylethyldichlorosilane and phenylmethyldichlorosilane; dialkyl diacetoxysilanes such as dimethyldiacetoxysilane; substituted or unsubstituted dialkyl diaminosilanes such as bis(dimethylamino)propyldimethylsilane and bis(dimethylamino)propyldiethylsilane; substituted or unsubstituted diaryl diaminosilanes such as bis(dimethylamino)propyldiphenylsilane; cyclic silane compounds such as phenylmethylbis(dimethylamino)silane and hexamethylcyclotrisilazane; dialkylalkoxychlorosilanes such as dimethylmethoxychlorosilane; and the like.

The compounds in the specific examples described above are all commercially available as industrial products or reagents. A commercially available industrial product or reagent or a compound prepared by a known method may be used as the compound represented by Formula (I-1) above. Among the silane compounds above, silane compounds in which R² is an oxy group are preferable, from the viewpoints of the long-term stability of hardened product, the long-term reliability of electronic part, and others.

(Partial Condensate of Silane Compound)

The partial condensates of the silane compound represented by Formula (I-1) above include compounds formed by self condensation of a compound represented by Formula (I-1) above and compounds formed by mutual condensation by reacting two or more compounds. The condensation reaction is not particularly limited, and may be performed by use of water if needed or by adding a known substance accelerating condensation reaction such as acid or alkali as needed. One condensation reaction occurs by elimination of one water molecule in common condensation reaction, giving 2 moles of $R^2H$ as by-products (2 $\equiv$Si—$R^2$+$H_2O$→$\equiv$Si—O—Si$\equiv$+2$R^2H$).

Because the degree of condensation can be adjusted according to the reaction condition, the molecular number of the condensation product is not particularly limited, but is preferably 1.5 molecules or more on average, more preferably 2 to 50 molecules, and still more preferably 2 to 20 molecules.

The silane compound for use in the present invention preferably contains a partially condensed compound as described above, but part of the molecular may remain as it is represented by Formula (I-1) above without condensation.

The partial condensate of the particular silane compound according to the present invention may be prepared by condensation of a silane compound represented by Formula (I-1) above or by condensation simultaneously in reaction with the phenol compound; or alternatively, a commercially available product may be used; or the partial condensate may be prepared in combination of the methods above. Specific examples of the commercially available partial condensates of the compound represented by Formula (I-1) above include M Silicate 51 (product name, manufactured by Tama Chemicals Co., Ltd.) wherein $R^2$ in Formula (I-1) represents a methoxy group; n is 0; and the average condensation molecular number is 3 to 5; Methyl Silicate 56 (product name, manufactured by Tama Chemicals Co., Ltd.) wherein $R^2$ represents a methoxy group; n is 0; and the average condensation molecular number is 8 to 12; Silicate 40 (product name, manufactured by Tama Chemicals Co., Ltd.) wherein $R^2$ represents an ethoxy group; n is 0; and the average condensation molecular number is approximately 5; Silicate 45 (product name, manufactured by Tama Chemicals Co., Ltd.) wherein $R^2$ represents an ethoxy group; n is 0; and the average condensation molecular number is 6 to 8; 1,3-dimethyltetramethoxydisiloxane (reagent available from AZmax Co., Ltd.) wherein $R^1$ represents a methyl group; $R^2$ represents a methoxy group; n is 1; and the molecular number is 2; 1,3-di-n-octyltetraethoxydisiloxane (reagent available from AZmax Co., Ltd.) wherein $R^1$ represents a n-octyl group; $R^2$ represents an ethoxy group; n is 1; and the molecular number is 2, and the like.

(Phenol Compound)

The phenol compound (b) for use in the present invention is not particularly limited, if it has one or more phenolic hydroxyl groups in a molecule. Examples thereof include compounds having a phenolic hydroxyl group in a molecule (i.e., monovalent phenol compounds) including phenols such as phenol, cresol, xylenol, cumylphenol, phenylphenol and aminophenol, naphthols such as α-naphthol, β-naphthol, methylnaphthalene, and dimethylnaphthalene, and the like; and phenol compounds having two or more phenolic hydroxyl groups in a molecule including: compounds having two phenolic hydroxyl groups in a molecule (i.e., divalent phenol compounds) such as resorcin, catechol, hydroquinone, bisphenol A, bisphenol F, dihydroxynaphthalene, and substituted or unsubstituted biphenols;

novolak phenol resins prepared by condensation or cocondensation of a phenol such as phenol, cresol, xylenol, resorcin, catechol, bisphenol A, bisphenol F, phenylphenol, or aminophenol and/or a naphthol such as α-naphthol, β-naphthol, or dihydroxynaphthalene with an aldehyde such as formaldehyde, acetaldehyde, propionaldehyde, benzaldehyde, or salicyl aldehyde under the presence of an acidic catalyst;

aralkyl phenol resins prepared from a phenol and/or a naphthol and dimethoxy-para-xylene or bis(methoxymethyl) biphenyl such as phenol aralkyl resins and naphthol aralkyl resins;

para-xylylene and/or meta xylylene-modified phenol resins;

melamine-modified phenol resins;

terpene-modified phenol resins;

dicyclopentadiene phenol resins and dicyclopentadiene naphthol resins synthesized by copolymerization of a phenol and/or a naphthol with dicyclopentadiene;

cyclopentadiene-modified phenol resins;

polycyclic aromatic ring-modified phenol resins;

biphenyl phenol resins;

triphenylmethane phenol resins; and phenol resins prepared by copolymerization of two or more of the resins above.

The phenol compounds above may be used alone or in combination of two or more.

The phenol compound (a) for use in the present invention is not particularly limited, but preferably a compound having two or fewer phenolic hydroxyl groups in a molecule from the viewpoint of the viscosity of curable resin. Increase in the number of the phenolic hydroxyl groups in a molecule often leads to increase in the viscosity of the curable resin generated and deterioration in handleability efficiency during and/or after production. In particular, use of a novolak or resol phenol resin, which has a greater number of phenolic hydroxyl groups in a molecule and thus a smaller molecular weight between reaction sites, often results in gel formation.

On the other hand, compounds having two or more phenolic hydroxyl groups in a molecule are preferable from the viewpoint of the heat resistance of the curable resin after hardening. However, as described above, increase in the number of intramolecular phenolic hydroxyl groups often results in increase in the viscosity of the reaction product obtained. Thus, in a embodiment, the phenol compound (a) according to the present invention has a divalent phenol compound content of preferably 70 wt % or more, more preferably 80 wt % or more, and still more preferably 85 wt % or more, with respect to the total amount of the phenol compound. For example, a divalent phenol compound content of 70 wt % or less, i.e., a content of compounds having three or more phenolic hydroxyl groups in a molecule at 30 wt % or more, leads to increase in the viscosity of the reaction product obtained in reaction and deterioration in handleability.

In another embodiment, a phenol compound having two or more phenolic hydroxyl groups in a molecule that can cyclize with a silane compound may be used as the phenol compound (a) according to the present invention. In such a case, the viscosity of the reaction product obtained in reaction is not drastically increased and the convenience in handleability does not decrease significantly, even when the content of the compounds containing three or more phenolic hydroxyl groups in a molecule is 30 wt % or more. When a compound in a structure having two or more phenolic hydroxyl groups in a molecule that can cyclize with a silane compound is used, the amount of the phenolic hydroxyl groups derived from the compound is preferably 50 wt % or more, more preferably 70 wt % or more, with respect to the total amount of the phenolic hydroxyl groups.

More specifically when a phenol compound that can cyclize with a silane compound is used, the content of the compound containing two phenolic hydroxyl groups in a molecule is preferably 30 wt % or more, more preferably 50 wt % or more, from the viewpoint of fluidity. The content of the compounds containing three or more phenolic hydroxyl groups in a molecule is preferably 30 wt % or more, more preferably 50 wt % or more, from the viewpoint of heat resistance. However, the ratio of the compounds containing three or more phenolic hydroxyl groups in a molecule to the compound containing two phenolic hydroxyl groups in a molecule is not particularly limited and may be adjusted properly according to the desirable degree of fluidity and heat resistance. The at least two phenolic hydroxyl groups in the cyclizable phenolic compound preferably have any one of the positional relationships shown in Formula (I-1a) to (I-1d) below.

The divalent phenol compound cyclizable with a silane compound is not particularly limited, and examples thereof include phenol compounds represented by Formula (I-1a) to (I-1d), and these compounds may be used alone or in combination of two or more.

[Formula 11]

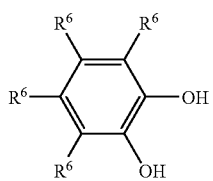

(I-1a)

(Wherein, $R^6$ each independently represent a group selected from the group consisting of a hydrogen atom and substituted or unsubstituted organic groups having 1 to 18 carbon atoms, and may be identical or different from each other; and two or more of $R^6$ may bind to each other to form a cyclic structure).

The phenol compound represented by Formula (I-1a) above is not particularly limited, and examples thereof include catechol and 2,3-dihydroxynaphthalene.

[Formula 12]

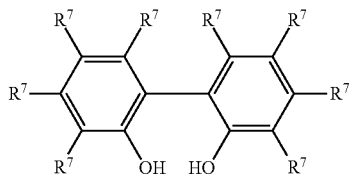

(I-1b)

(Wherein, $R^7$ each independently represent a group selected from the group consisting of a hydrogen atom and substituted or unsubstituted organic groups having 1 to 18 carbon atoms and may be identical or different from each other; and two or more $R^7$ may bind to each other to form a cyclic structure).

The phenol compound represented by Formula (I-1b) above is not particularly limited, and examples thereof include 2,2'-biphenol and 1,1'-bi-2-naphthol.

[Formula 13]

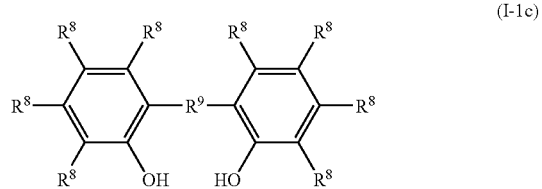

(I-1c)

(Wherein, $R^8$ each independently represent a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 0 to 18 carbon atoms).

The phenol compound represented by Formula (I-1C) above is not particularly limited, and examples thereof include 2,2'-dihydroxydiphenylmethane, 2,2'-dihydroxy-5,5'-dimethyldiphenylmethane, 2,2'-dihydroxy-3,3',5,5'-tetramethyldiphenylmethane, 2,2'-dihydroxydiphenylsulfide, 2,2'-dihydroxydiphenylether, 2,2'-dihydroxydiphenylsulfone, and 1,1'-methylene-di-2-naphthol.

[Formula 14]

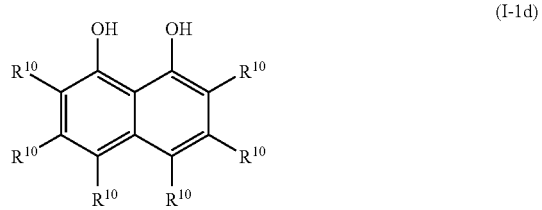

(I-1d)

(Wherein, $R^{10}$ each independently represent a group selected from the group consisting of a hydrogen atom and substituted or unsubstituted organic groups having 1 to 18 carbon atoms and may be identical or different from each other; and two or more of $R^{10}$ may bind to each other to form a cyclic structure).

Examples of the phenol compounds represented by Formula (I-1d) above include, but are not limited to, 1,8-dihydroxynaphthalene.

Examples of the phenol compounds containing a compound having three or more phenolic hydroxyl groups in a molecule that is cyclizable with a silane compound include phenol compounds represented by Formula (I-1e) to (I-1g), and these compounds may be used alone or in combination of two or more.

[Formula 15]

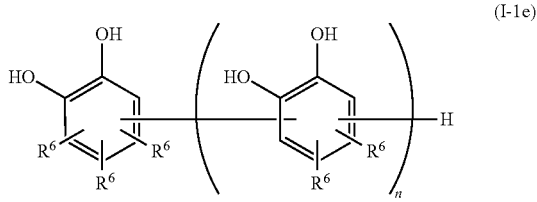

(I-1e)

(Wherein, $R^6$ each independently represent a group selected from the group consisting of a hydrogen atom and substituted or unsubstituted organic groups having 1 to 18 carbon atoms and may be identical or different from each other; two or more of $R^6$ may bind to each other to form a cyclic structure; and n is an average number of higher than 0).

Examples of the phenol compounds represented by Formula (I-1e) above include, but are not particularly limited to, catechol novolak resins.

[Formula 16]

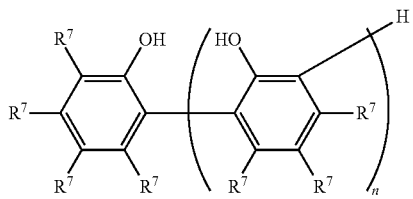

(I-1f)

(Wherein, $R^7$ each independently represent a group selected from the group consisting of a hydrogen atom and substituted or unsubstituted organic groups having 1 to 18 carbon atoms and may be identical or different from each other; two or more of $R^7$ may bind to each other to form a cyclic structure; and n is an average number of higher than 1).

[Formula 17]

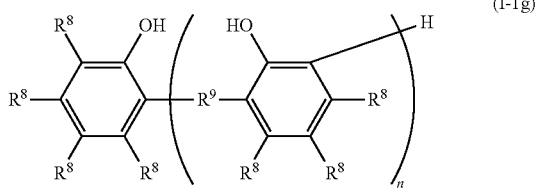

(I-1g)

(Wherein, $R^8$ each independently represent a group selected from the group consisting of a hydrogen atom and substituted or unsubstituted organic groups having 1 to 18 carbon atoms and may be identical or different from each other; two or more of $R^8$ may bind to each other to form a cyclic structure; $R^9$ represents a divalent organic group having 0 to 18 carbon atoms; and n is an average number of higher than 1).

Examples of the phenol compounds represented by the Formula (I-1 g) include, but are not limited to, para-cresol novolak resins and high-ortho phenolic novolak resins.

The phrase "substituted or unsubstituted organic group having 1 to 18 carbon atoms" used for groups $R^6$, $R^7$, $R^8$, or $R^{10}$ in the Formula (I-1a) to (I-1 g) means an organic group having 1 to 18 carbon atoms such as an unsubstituted or substituted aliphatic hydrocarbon group, an aromatic hydrocarbon group, an aliphatic or aromatic hydrocarbon oxy group, an aliphatic or aromatic hydrocarbon carbonyl group, an aliphatic or aromatic hydrocarbon oxycarbonyl group, or an aliphatic or aromatic hydrocarbon carbonyloxy group.

Examples of the substituted or unsubstituted aliphatic hydrocarbon groups include aliphatic hydrocarbon groups such as methyl, ethyl, propyl, isopropyl, n-butyl, sec-butyl, tert-butyl, pentyl, hexyl, octyl, decyl, dodecyl, allyl, and vinyl; and those further substituted with an alkyl group, an alkoxy group, an aryl group, a hydroxyl group, an amino group, a halogen, or the like.

The substituted or unsubstituted aliphatic hydrocarbon groups also include substituted or unsubstituted alicyclic hydrocarbon groups. Examples of the substituted or unsubstituted alicyclic hydrocarbon group include cyclopentyl, cyclohexyl, cycloheptyl, cyclopentenyl, and cyclohexenyl groups and the like, and those further substituted with an alkyl group, an alkoxy group, an aryl group, an aryloxy group, a hydroxyl group, an amino group, a halogen atom, or the like.

Examples of the substituted or unsubstituted aromatic hydrocarbon groups include aryl groups such as phenyl and toluoyl group; alkyl group-substituted aryl groups such as dimethylphenyl, ethylphenyl, butylphenyl, and tert-butylphenyl; alkoxy group-substituted aryl groups such as methoxyphenyl, ethoxyphenyl, butoxyphenyl, and tert-butoxyphenyl; and those further substituted with an alkyl group, an alkoxy group, an aryl group, an aryloxy group, an amino group, a halogen atom, or the like.

Examples of the aliphatic hydrocarbon oxy groups include group having a structure of an aliphatic hydrocarbon group above bound to an oxygen atom such as methoxy, ethoxy, propoxy, isopropoxy, n-butoxy, sec-butoxy, tert-butoxy, cyclopropyloxy, cyclohexyloxy, cyclopentyloxy, allyloxy, and vinyloxy; and those further substituted with an alkyl group, an alkoxy group, an aryl group, an aryloxy group, an amino group, a halogen atom or the like. Examples of the aromatic hydrocarbon oxy groups include groups having a structure of an aromatic hydrocarbon group above bound to an oxygen atom, such as phenoxy, methylphenoxy, ethylphenoxy, methoxyphenoxy, butoxyphenoxy, and phenoxyphenoxy; and those further substituted with an alkyl group, an alkoxy group, an aryl group, an aryloxy group, an amino group, a halogen atom or the like.

Examples of the carbonyl groups above include aliphatic hydrocarbon carbonyl groups such as formyl, acetyl, ethylcarbonyl, butyryl, cyclohexylcarbonyl, and allyl carbonyl; aromatic hydrocarbon carbonyl groups such as phenylcarbonyl and methylphenylcarbonyl; and those further substituted with an alkyl group, an alkoxy group, an aryl group, an aryloxy group, an amino group, a halogen atom or the like.

Examples of the oxycarbonyl groups include aliphatic hydrocarbon oxycarbonyl groups such as methoxycarbonyl, ethoxycarbonyl, butoxycarbonyl, allyloxycarbonyl, and cyclohexyloxycarbonyl; aromatic hydrocarbon oxycarbonyl groups such as phenoxycarbonyl and methylphenoxycarbonyl; and those further substituted with an alkyl group, an alkoxy group, an aryl group, an aryloxy group, an amino group, a halogen atom or the like.

Examples of the carbonyloxy groups include aliphatic hydrocarbon carbonyloxy groups such as methylcarbonyloxy, ethylcarbonyloxy, butylcarbonyloxy, allylcarbonyloxy, and cyclohexylcarbonyloxy; aromatic hydrocarbon carbonyloxy groups such as phenylcarbonyloxy and methylphenylcarbonyloxy; and those further substituted with an alkyl group, an alkoxy group, an aryl group, an aryloxy group, an amino group, a halogen atom or the like.

The phrase "forming a cyclic structure" used for groups $R^6$, $R^7$, $R^8$, and $R^{10}$ means that two or more of $R^6$, $R^7$, $R^8$, and $R^{10}$ may bind to each other to form a divalent to quadrivalent organic group as a whole. Examples of the cyclic structures include a benzene ring and polycyclic aromatic rings such as naphthalene, anthracene, and phenanthrene, and the ring may be further substituted with an alkyl, alkoxy, aryl, aryloxy, hydroxyl or amino group, a halogen atom, or the like.

The group $R^6$, $R^7$, $R^8$, or $R^{10}$ in Formula (I-1a) to (I-1 g) above is not particularly limited, but preferably a hydrogen atom, a hydroxyl group, or a monovalent organic group such as alkyl, aryl, alkoxy, or aryloxy. Among them, from the viewpoint of availability of raw material is a substituent group selected from a hydrogen atom, a hydroxyl group, unsubstituted or alkyl group and/or alkoxy group and/or hydroxyl group-substituted aromatic groups such as phenyl, p-toluoyl, m-toluoyl, o-toluoyl and p-methoxyphenyl, and linear or cyclic alkyl groups such as methyl, ethyl, propyl, isopropyl, butyl, sec-butyl, tert-butyl, octyl, and cyclohexyl; and still more preferable is a substituent group selected from a hydrogen atom, and hydroxyl, phenyl, methyl, ethyl, and tert-butyl groups. When two or more groups of $R^6$, $R^7$, $R^8$, and $R^{10}$ bind to each other to form a cyclic structure, the cyclic structure is preferably a naphthalene ring including the benzene ring formed.

$R^9$ in Formula (I-1c) and (I-1 g) above represents a divalent organic group having 0 to 18 carbon atoms. The organic group having 0 to 18 carbon atoms is not particularly limited, and examples thereof include oxygen and sulfur atoms, a sulfoxide group, a sulfonyl group, divalent hydrocarbon groups having 1 to 18 carbon atoms, and the like. The divalent hydrocarbon group having 1 to 18 carbon atoms is not particularly limited, and examples thereof include aliphatic hydrocarbon groups such as methylene, ethylene, propylene, cyclohexylene, and cyclopentylene and the derivatives thereof further substituted with an alkyl, alkoxy, aryl, aryloxy or amino group, a halogen, or the like; and aromatic hydrocarbon groups such as phenylene, naphthylene, and anthracenylene and the derivatives thereof further substituted with an alkyl, alkoxy, aryl, aryloxy or amino group, a halogen, or the like.

Among them, from the viewpoint of availability is an oxygen or sulfur atom, a sulfoxide, sulfonyl, alkylene, cyclohexylene, or cyclopentylene group, or the group substituted with an alkyl, alkoxy, aryl, or aryloxy group. More preferable is an oxygen or sulfur atom, or a sulfoxide, sulfonyl, methylene, methylmethylene, isopropylmethylene, phenylmethylene, cyclohexylmethylene, dimethylmethylene, methyldiisopropyl, methylphenylmethylene, cyclohexylene, cyclopentylene, or cyclopentylene group.

The novel curable resin in a embodiment of the present invention characteristically contains an aryloxysilyl (ArO—Si) bond formed in reaction of at least one compound selected from the group consisting of the silane compounds (a) represented by Formula (I-1) above and the partial condensates thereof with a phenol compound (b). In the embodiment, the curable resin preferably has an at least one structural unit selected from the group consisting of the structural units represented by following Formula (I-2a), (I-3a), (I-2b), and (I-3b). The curable resin having such a particular structural unit can be prepared by using a silane compound (a) and/or the partial condensate thereof and a cyclizable compound having two or more phenolic hydroxyl groups in a molecule as the phenol compound (b). The structural units represented by the following Formula (I-2a) and (I-2b) derive from the silane compound represented by Formula (I-1) above itself, and the structural units represented by the following Formula (I-3a) and (I-3b) derive from a partially condensed site of the silane compound.

[Formula 18]

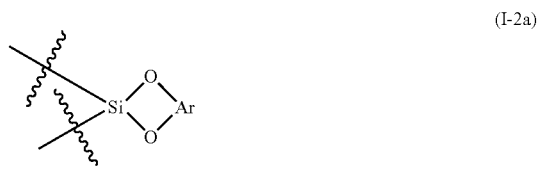

(I-2a)

(Wherein, Ar represents a divalent organic group having 2 to 30 carbon atoms and having aromatic cyclic compound-derived groups at both sides)

[Formula 19]

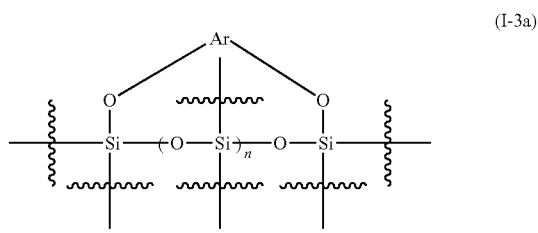

(I-3a)

(Wherein, Ar represents a divalent organic group having 2 to 30 carbon atoms and having aromatic cyclic compound-derived groups at both sides; and n denotes a number of 0 or more).

The "divalent organic group having 2 to 30 carbon atoms and having aromatic cyclic compound-derived groups at both sides" represented by Ar is not particularly limited, and example thereof include divalent organic groups having aryl groups at both sides such as phenylene, naphthylene, anthracenylene, biphenylene, binaphthylene, methylenebisphenylene, methylenebisnaphthylene, oxybisphenylene, sulfonylbisphenylene, and thiobisphenylene; divalent organic groups having heterocyclic groups at both sides such as furanylene, thiophenylene, imidazolylene, methylenebisfuranylene, methylenebisthiophenylene, and methylenebisimidazolylene; and divalent organic groups having an aryl group at one end and a heterocyclic ring group at the other end.

[Formula 20]

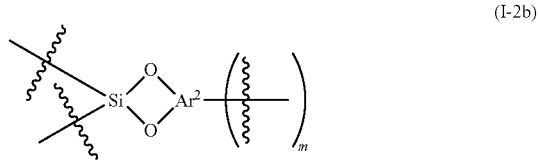

(I-2b)

(Wherein, $Ar^2$ represents a (m+2)-valent organic group having 2 to 30 carbon atoms and having at least two aromatic cyclic compound-derived binding sites; and m denotes an integer of one or more).

[Formula 21]

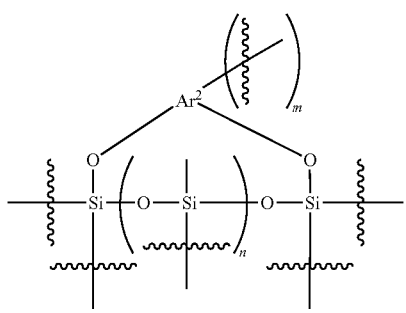

(I-3b)

(Wherein, $Ar^2$ represents a (m+2)-valent organic group having 2 to 30 carbon atoms and having at least two aromatic cyclic compound-derived binding sites; n denotes a number of 0 or more; and m denotes an integer of one or more).

The "(m+2)-valent organic group having 2 to 30 carbon atoms and having at least two aromatic cyclic compound-derived binding sites" represented by $Ar^2$ is not particularly limited, and examples thereof include groups having two aryl group-derived binding sites and m substituent group-derived binding sites, such as phenylene, naphthylene, anthracenylene, biphenylene, binaphthylene, methylenebisphenylene, methylenebisnaphthylene, oxybisphenylene, sulfonylbisphenylene and thiobisphenylene groups and others that have m binding sites for substituent groups. Also the above examples include groups having two heterocyclic ring-derived binding sites and m binding sites with substituent groups, such as furanylene, thiophenylene, imidazolylene, methylene bisfuranylene, methylene bisthiophenylene, and methylene bisimidazolylene that have m binding sites for substituent groups. Also the above examples include groups having one aryl group-derived binding site, one heterocyclic ring-derived binding site, and m substituent group-binding sites.

"n" in the Formula above denotes a number of 0 or more, but is preferably in the range of 0 to 10, more preferably 0 to 5, and still more preferably 0 to 3, for forming the cyclic structure more easily.

The curable resin having the structural unit described above may have a relatively smaller molecular weight, and thus often makes handleability during and after production easier. Because the content of the silane compound in the curable resin may be raised, the hardened product from a curable resin composition containing the curable resin often has improved heat resistance. From the viewpoints above, the curable resin according to the present invention preferably contains the aryloxysilyl bond forming the at least one structural unit selected from the group consisting of Formula (I-2a), (I-3a), (I-2b), and (I-3b) in an amount of 30% or more, preferably 50% or more, with respect to the total amount of the aryloxysilyl (ArO—Si) bonds in the curable resin.

The coordination number of the silicon atom in the curable resin having the structural unit described above is mainly four, but is not limited thereto and may be 5 or 6.

When a silane compound represented by Formula (I-1) wherein n=0 is used, the curable resin having the structural unit represented by Formula (I-2a) above preferably contains a compound having a structure represented by the following Formula (I-4a).

[Formula 22]

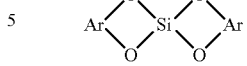

(I-4a)

(Wherein, Ar represents a divalent organic group having 2 to 30 carbon atoms and having aromatic cyclic compound-derived groups at both sides).

When a silane compound represented by Formula (I-1) wherein n=0 is used, the curable resin having the structural unit represented by Formula (I-2b) above preferably contains a compound having a structural unit represented by the following Formula (I-4b).

[Formula 23]

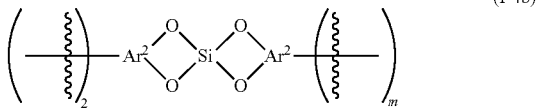

(I-4b)

(Wherein, $Ar^2$ represents a (m+2)-valent organic group having 2 to 30 carbon atoms and having at least two aromatic cyclic compound-derived binding sites; and each m is independently an integer of one or more).

When a silane compound represented by Formula (I-1) wherein n=0 is used, the curable resin according to the present invention preferably contains at least one of the curable resins having the structural units represented by the Formula (I-4a) and (I-4b) in an amount of preferably 50 wt % or more, more preferably 70 wt % or more, and still more preferably 80 wt % or more, with respect to the total weight of the resin. When the curable resin contains the structural units represented by Formula (I-4a) and/or Formula (I-4b) in an amount of 90 wt % or more, the curable resin according to the present invention may have a still lower molecular weight. As a result, the curable resin is better in handleability during and after production, and may contain a silane compound at an even higher content and thus become higher in heat resistance.

(Method of Producing Curable Resin)

The method of producing the novel curable resin in an embodiment of the present invention is characterized by including a step of reacting at least one compound (a) selected from the group consisting of the silane compounds represented by the following Formula (I-1) and the partial condensates thereof with a phenol compound (b).

[Formula 24]

(I-1)

(Wherein, n denotes a number of 0 to 2; groups $R^1$ each independently represent a group selected from the group consisting of a hydrogen atom and substituted or unsubstituted hydrocarbon groups having 1 to 18 carbon atoms, and may be identical or different from each other; groups $R^2$ each independently represent a group selected from the group consisting of a halogen atom, a hydroxyl group, substituted or unsubstituted oxy groups having 1 to 18 carbon atoms, substituted or unsubstituted amino groups having 1 to 18 carbon atoms, and carbonyloxy groups having 2 to 18 carbon atom, and may be identical or different from each other; and two or more of $R^1$ and $R^2$ may bind to each other to form a cyclic structure).

n, $R^1$, and $R^2$ in the Formula are described above in detail.

As for the reaction of the silane compound (a) and/or the partial condensates thereof with the phenol compound (b) in the production method according to the present invention, there is no restriction on the reaction means, if a desirable curable resin is produced. A solvent may be used, as needed, in the production method according to the present invention. The solvent is removed after reaction, for example, by filtration, distillation, or the like. The solvent for use in the present invention is not particularly limited, if it does not give an adverse effect on the reaction between the compounds (a) and (b), and examples thereof include known solvents such as aromatic hydrocarbon solvents such as toluene and xylene; aliphatic hydrocarbon solvents such as hexane, heptane, and cyclohexane; ketone solvents such as acetone, methylethylketone, and methylisobutylketone; ether solvents such as diethylether, diethylene glycol dimethylether, and tetrahydrofuran; amide solvents such as N,N-dimethylformamide and N,N-dimethylacetamide; ester solvents such as ethyl acetate and γ-butylolactone; and others.

The ratio of the silane compound (a) and/or the partial condensate thereof to the phenol compound (b) in the production method according to the present invention is not particularly limited, if the reaction proceeds, giving a desirable compound. For example, the equivalent ratio of the $R^2$ groups in (a) to the phenolic hydroxyl groups in (b) (i.e., [hydroxyl-group number of phenol compound (b)]/[$R^2$-group number of silane compound (a)]) is preferably in the range of 0.1 to 10, more preferably 0.5 to 5.0, and still more preferably 0.9 to 3.0. The equivalent ratio is most preferably close to 1. A reaction at an equivalent ratio of less than 0.1 may often leave unreacted $R^2$ groups in a greater amount. On the other hand, if an equivalent ratio of more than 10 may often lead to decrease of the usefulness of the reaction product as an epoxy curing agent and also to decrease in heat resistance of the hardened product. The "equivalent ratio" is not a feed ratio, but is the ratio of the phenolic hydroxyl group (b)-derived groups to the $R^2$ group (a)-derived groups contained in the product after production ([unreacted phenolic hydroxyl group number of phenol compound (b)+number of the bonds generated in reaction of the phenolic hydroxyl groups in phenol compound (b)/[$R^2$-group number of silane compound (a)+number of the bonds generated in reaction of the $R^2$ groups in silane compound (a)]). Accordingly, the groups removed, for example by evaporation, filtration, washing or the like, are not included. An equivalent ratio of "close to 1" means that the equivalent ratio may be slightly deviated from 1.0, for example, by weighing error or deviation in purity. Specifically, the equivalent ratio is preferably 0.9 to 1.1, more preferably 0.95 to 1.05.

The reaction ratio of the silane compound (a) and/or the partial condensate thereof to the phenol compound (b) in the production method according to the present invention is not particularly limited, but the number of the unreacted $R^2$ groups is preferably 10% or less, more preferably 5% or less, and still more preferably 1% or less with respect to the total number of the groups $R^2$ in the silane compound and/or the partial condensates thereof when the reaction is initiated. Presence of unreacted $R^2$ groups in an amount of more than 10% with respect to the total $R^2$-group number when the reaction is initiated may often lead to decrease in usefulness of the reaction product as an epoxy curing agent, generation of voids in hardened product, and decrease in long-term reliability.

A by-product of the reaction of (a) and (b), $R^2H$, is generated in combination with the desirable compound in the production method according to the present invention. Accordingly, the production method according to the present invention preferably include, as needed, a step of removing $R^2H$ from the reaction product by heating, for example a step of: removing by-product hydrogen halides, as needed, by distillation under heat and/or reduced pressure, washing, filtration, or the like when a silane compound and/or the partial condensates thereof (a) wherein $R^2$ is a halogen atom and a phenol compound (b) are allowed to react with each other;

removing by-product water, as needed, by distillation under heat and/or reduced pressure, washing, filtration, or the like when a silane compound and/or the partial condensate thereof (a) wherein $R^2$ is a hydroxyl group and a phenol compound (b) are allowed to react with each other;

removing by-product alcohol or arylol, as needed, by distillation under heat and/or reduced pressure, washing, filtration, or the like when a silane compound and/or the partial condensate thereof (a) wherein $R^2$ is an oxy group and a phenol compound (b) are allowed to react with each other;

removing by-product ammonia or amine, as needed, by distillation under heat and/or reduced pressure, washing, filtration, or the like when a silane compound and/or the partial condensate thereof (a) wherein $R^2$ is an amino group and a phenol compound (b) are allowed to react with each other; or removing by-product carboxylic acid, as needed, by distillation under heat and/or reduced pressure, washing, filtration, or the like when a silane compound and/or the partial condensate thereof (a) wherein $R^2$ is a carbonyloxy group and a phenol compound (b) are allowed to react with each other.

In the production method according to the present invention, a catalyst may be used, as needed, for acceleration of the reaction between the compounds (a) and (b) Examples of the catalysts, which can be used, include diazabicycloalkene cycloamidine compounds such as 1,5-diazabicyclo[4.3.0]nonene-5,1,8-diazabicyclo[5.4.0]undecene-7 and the derivatives thereof; intramolecularly polarized compounds such as the phenolic novolak salts and those having an added π bond-containing compound such as maleic anhydride, a quinone compound (such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, or phenyl-1,4-benzoquinone), diazophenylmethane, or the like; tertiary amines such as pyridine, triethylamine, triethylenediamine, benzyldimethylamine, triethanolamine, dimethylaminoethanol, and tris(dimethylaminomethyl)phenol and the derivatives thereof; imidazoles such as 2-methylimidazole, 2-phenylimidazole, 2-phenyl-4-methylimidazole, and 2-heptadecylimidazole; tetrasubstituted phosphonium tetrasubstituted borates such as tetraphenyl phosphonium tetraphenylborate; tetraphenylboron salts such as 2-ethyl-4-methylimidazole tetraphenylborate and N-methylmorpholine tetraphenylborate; organic phosphines such as triphenylphosphine, diphenyl(p-toluoyl)phosphine, tris(alkylphenyl)phosphines, tris(alkoxydiphenyl)phosphines, tris(alkyl-alkoxyphenyl) phosphines, tris(dialkylphenyl)phosphines, tris(trialkylphenyl)phosphines, tris(tetraalkylphenyl) phosphines, tris(dialkoxyphenyl)phosphines, tris(trialkoxyphenyl)phosphines, tris(tetraalkoxyphenyl) phosphines, trialkylphosphines, dialkylarylphosphines, and alkyldiarylphosphines; complexes of the organic phosphine with an organic boron; intramolecular polarized compounds obtained by adding a π bond-containing compound such as maleic anhydride, a quinone compound (such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, or phenyl-1,4-benzoquinone), or diazophenylmethane to such an organic phosphine; and intramolecular polarized compounds obtained by allowing such an organic phosphine to react with a halogenated phenol compound such as 4-bromophenol, 3-bromophenol, 2-bromophenol, 4-chlorophenol iodide, 3-chlorophenol iodide, 2-chlorophenol iodide, 4-chlorophenol, 3-chlorophenol, 2-chlorophenol, 4-bromo-2-methylphenol, 4-bromo-3-methylphenol, 4-bromo-2,6-dimethylphenol, 4-bromo-3,5-dimethylphenol, 4-bromo-2,6-di-tert-butylphenol, 4-chloro-1-naphthol, 1-bromo-2-naphthol, 6-bromo-2-naphthol, or 4-bromo-4'-hydroxybiphenyl and then dehaoganating the reaction product (see Japanese Patent Application Laid-Open No. 2004-156036), and the like.

The combination of the silane compound and/or the partial condensate thereof and the catalyst used in the production method according to the present invention is not particularly limited, but a polyvalent phenol compound and a silane compound represented by Formula (I-1) wherein $R^2$ is an oxy group are preferably allowed to react with each other by using a phosphonium compound represented by the following Formula (I-5) or the intermolecular salt thereof as a catalyst and the by-product alcohol removed by heating at 80° C. to 300° C., from the viewpoints of easiness of reaction and long-term stability of the hardened product obtained from the reaction product. $R^2$ is more preferably an alkoxy group having 1 to 3 carbon atoms, from the viewpoint of the removal efficiency of the by-product $R^2H$.

[Formula 25]

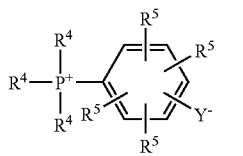

(I-5)

(Wherein, $R^4$ each independently represent a group selected from the group consisting of a hydrogen atom and substituted or unsubstituted hydrocarbon groups having 1 to 18 carbon atoms and may be identical or different from each other; and two or more of $R^4$ may bind to each other to form a cyclic structure;

groups $R^5$ each independently represent a group selected from the group consisting of a hydrogen atom, a hydroxyl group, and substituted or unsubstituted organic groups having 1 to 18 carbon atoms and may be identical or different from each other; and two or more $R^5$ may bind to each other to form a cyclic structure;

$Y^-$ represents an organic group resulting from the release of a proton from an organic group having 0 to 18 carbon atoms and having one or more releasable protons ($H^+$); and $Y^-$ may bind to one or more $R^5$ to form a cyclic structure).

The "substituted or unsubstituted hydrocarbon groups having 1 to 18 carbon atoms" represented by the $R^4$ in Formula (I-5) include aliphatic and aromatic hydrocarbon groups having 1 to 18 carbon atoms that may be unsubstituted or substituted.

More specific examples of the substituted or unsubstituted aliphatic hydrocarbon groups include aliphatic hydrocarbon groups such as methyl, ethyl, propyl, isopropyl, n-butyl, sec-butyl, tert-butyl, pentyl, hexyl, octyl, decyl, dodecyl, allyl, and vinyl group, and those further substituted with an alkyl, alkoxy, aryl, hydroxyl, or amino group, a halogen atom, or the like.

The substituted or unsubstituted aliphatic hydrocarbon groups include substituted or unsubstituted alicyclic hydrocarbon groups. Examples of the substituted or unsubstituted alicyclic hydrocarbon groups include cyclopentyl, cyclohexyl, cycloheptyl, cyclopentenyl, and cyclohexenyl groups, and those further substituted with an alkyl, alkoxy, aryl, aryloxy, hydroxyl or amino group, a halogen atom, or the like.

Examples of the substituted or unsubstituted aromatic hydrocarbon groups include aryl groups such as phenyl and toluoyl; alkyl group-substituted aryl groups such as dimethylphenyl, ethylphenyl, butylphenyl, and tert-butylphenyl; alkoxy group-substituted aryl groups such as methoxyphenyl, ethoxyphenyl, butoxyphenyl, and tert-butoxyphenyl; and the like, and additionally, those further substituted with an alkyl, alkoxy, aryl, aryloxy, or amino group, a halogen atom, or the like.

The phrase "two or more of $R^4$ may bind to each other to form a cyclic structure" used for groups $R^4$ in Formula (I-5) means that two or three groups $R^4$ bind to each other to form respectively a divalent or trivalent hydrocarbon group as a whole. Examples thereof include compounds forming a cyclic structure by binding to a Si atom including alkylene groups such as ethylene, propylene, butylene, pentylene, and hexylene; alkenyl groups such as ethylenyl, propylenyl, and butyleneyl; aralkylene groups such as methylenephenylene; arylene groups such as phenylene, naphthylene, and anthracenylene; and the like; and these compounds additionally further substituted with an alkyl, alkoxy, aryl, aryloxy, amino, or hydroxyl group, a halogen atom, or the like.

The group $R^4$ in Formula (I-5) is not particularly limited, but preferably a monovalent substituent group selected from the group consisting of alkyl and aryl groups. Among them, from the view point of availability of the raw material is a substituent group selected from: unsubstituted or alkyl group and/or alkoxy group and/or hydroxyl group-substituted aryl groups such as phenyl, p-toluoyl, m-toluoyl, o-toluoyl, p-methoxyphenyl, m-methoxyphenyl, o-methoxyphenyl, p-hydroxyphenyl, m-hydroxyphenyl, o-hydroxyphenyl, 2,5-dihydroxyphenyl, 4-(4-hydroxyphenyl)phenyl, 1-naphthyl, 2-naphthyl, 1-(2-hydroxynaphthyl), and 1-(4-hydroxynaphthyl); and linear or cyclic alkyl groups such as methyl, ethyl, propyl, isopropyl, butyl, sec-butyl, tert-butyl, octyl, and cyclohexyl. Still more preferable is a unsubstituted or alkyl group and/or alkoxy group and/or hydroxyl group-substituted aryl group such as phenyl, p-toluoyl, m-toluoyl, o-toluoyl, p-methoxyphenyl, m-methoxyphenyl, o-methoxyphenyl, p-hydroxyphenyl, m-hydroxyphenyl, o-hydroxyphenyl, 2,5-dihydroxyphenyl, 4-(4-hydroxyphenyl)phenyl, 1-naphthyl, 2-naphthyl, 1-(2-hydroxynaphthyl), or 1-(4-hydroxynaphthyl).

The "substituted or unsubstituted organic group having 1 to 18 carbon atoms" represented by $R^5$ of Formula (I-5) means an aliphatic hydrocarbon group, aromatic hydrocarbon group, an aliphatic or aromatic hydrocarbon oxy group, an aliphatic or aromatic hydrocarbon carbonyl group, an aliphatic or aromatic hydrocarbon oxycarbonyl group, or an aliphatic or aromatic hydrocarbon carbonyloxy group having 1 to 18 carbon atoms that may be unsubstituted or substituted.

More specifically, examples of the substituted or unsubstituted aliphatic and aromatic hydrocarbon groups are the same as those for the group $R^4$ described above.

Examples of the aliphatic hydrocarbon oxy groups include groups having a structure of an aliphatic hydrocarbon group above bound to an oxygen atoms such as methoxy, ethoxy, propoxy, isopropoxy, n-butoxy, sec-butoxy, tert-butoxy, cyclopropyloxy, cyclohexyloxy, cyclopentyloxy, allyloxy, and vinyloxy, and those further substituted with an alkyl group, an alkoxy group, an aryl group, an aryloxy group, an amino group, a halogen atom, or the like. Examples of the aromatic hydrocarbon oxy groups include groups having a structure of an aromatic hydrocarbon group above bound to an oxygen atom such as phenoxy, methylphenoxy, ethylphenoxy, methoxyphenoxy, butoxyphenoxy, and phenoxyphenoxy, and those further substituted with an alkyl group, an alkoxy group, an aryl group, an aryloxy group, an amino group, a halogen atom, or the like.

Examples of the carbonyl groups include aliphatic hydrocarbon carbonyl groups such as formyl, acetyl, ethylcarbonyl, butyryl, cyclohexylcarbonyl, and allyl carbonyl; aromatic hydrocarbon carbonyl groups such as phenylcarbonyl and methylphenylcarbonyl; and those further substituted with an alkyl group, an alkoxy group, an aryl group, an aryloxy group, an amino group, a halogen atom, or the like.

Examples of the oxycarbonyl groups include aliphatic hydrocarbon oxycarbonyl groups such as methoxycarbonyl, ethoxycarbonyl, butoxycarbonyl, allyloxycarbonyl, and cyclohexyloxycarbonyl; aromatic hydrocarbon oxycarbonyl groups such as phenoxycarbonyl and methylphenoxycarbonyl; and those further substituted with an alkyl group, an alkoxy group, an aryl group, an aryloxy group, an amino group, or a halogen atom.

Examples of the carbonyloxy groups include aliphatic hydrocarbon carbonyloxy groups such as methylcarbonyloxy, ethylcarbonyloxy, butylcarbonyloxy, allylcarbonyloxy, and cyclohexylcarbonyloxy; aromatic hydrocarbon carbonyloxy groups such as phenylcarbonyloxy and methylphenylcarbonyloxy; and those further substituted with an alkyl group, an alkoxy group, an aryl group, an aryloxy group, an amino group, a halogen atom, or the like.

The phrase "two or more of $R^5$ may bind to each other to form a cyclic structure" used for the group $R^5$ of Formula (I-5) means that two to four groups $R^5$ may bind to each other respectively forming a divalent to quadrivalent organic group as a whole. Examples thereof include cyclic structure-forming alkylene groups such as ethylene, propylene, butylene, pentylene, and hexylene; alkenyl groups such as ethylenyl, propylenyl, and butyleneyl; aralkylene groups such as methylenephenylene; and arylene groups such as phenylene, naphthylene, and anthracenylene, and additionally, those alkylene, alkenyl, aralkylene, and arylene groups bound to an oxy or dioxy group, and these compounds may be further substituted with an alkyl, alkoxy, aryl, aryloxy, amino, or hydroxyl group, or a halogen atom.

The group $R^5$ in Formula (I-5) is not particularly limited, but preferably a hydrogen atom or a hydroxyl, alkyl, aryl alkoxy, or aryloxy group. Among them, from the viewpoint of availability of raw material is a substituent group selected from a hydrogen atom, a hydroxyl group, unsubstituted or alkyl group and/or alkoxy group and/or hydroxyl group-substituted aryl groups such as phenyl, p-toluoyl, m-toluoyl, o-toluoyl, and p-methoxyphenyl, and linear or cyclic alkyl groups such as methyl, ethyl, propyl, isopropyl, butyl, sec-butyl, tert-butyl, octyl, and cyclohexyl. When two or more of $R^5$ bind to each other to form a cyclic structure, the group $R^5$ is not particularly limited, but an organic group forming a polycyclic aromatic group such as 1-(-2-hydroxynaphthyl) or 1-(-4-hydroxynaphthyl) in combination with the benzene ring bound to $R^5$ is preferable.

$Y^-$ in Formula (I-5) is an organic group generated from an organic group having 0 to 18 carbon atoms and having one or more releasable proton ($H^+$) by removal of one proton, and may bind to one or more of $R^2$, forming a cyclic structure. Examples of the groups $Y^-$ include monovalent organic groups having a group 16 atom bound to a hydrogen atom from which the proton is desorbed such as hydroxyl, mercapto, and hydroseleno; monovalent organic groups having 1 to 18 carbon atoms and having a carboxyl group from which the proton of carboxylic acid is desorbed such as carboxyl, carboxymethyl, carboxyethyl, carboxyphenyl, and carboxynaphthyl; and monovalent organic groups having 1 to 18 carbon atoms and having a phenolic hydroxyl group from which the phenolic proton is desorbed such as hydroxyphenyl, hydroxyphenylmethyl, hydroxynaphthyl, hydroxyfuryl, hydroxythienyl, and hydroxypyridyl.

When $Y^-$ in Formula (I-5) binds to one or more of $R^5$ forming a cyclic structure, examples of the group $Y^-$ include divalent organic groups having a hydroxypolycyclic aromatic group in combination with a bound benzene ring, such as 2-(-6-hydroxynaphthyl), from which the hydroxyl proton is desorbed.

Among the groups exemplified above as $Y^-$, an oxygen anion formed by desorption of a proton form a hydroxyl group or a monovalent organic group formed by desorption of a proton from a phenolic hydroxyl group such as hydroxyphenyl, hydroxyphenylmethyl, hydroxynaphthyl, hydroxyfuryl, hydroxythienyl, or hydroxypyridyl is preferably, but the preferable group is not particularly limited thereto.

Alternatively when $Y^-$ in Formula (I-5) binds to one or more of $R^5$ forming a cyclic structure, the group $Y^-$ is preferably a group forming a hydroxypolycyclic aromatic group in combination with a bound benzene ring from which the hydroxyl proton is desorbed such as 2-(-6-hydroxynaphthyl).

Examples of the phosphonium compound intermolecular salt represented by Formula (I-5) above include, but are not limited to, intermolecular salt compounds of a phosphonium compound represented by Formula (I-5), with a phenolic hydroxyl group-containing compound such as phenol, naphthol, or a compound exemplified above as the compound having two or more phenolic hydroxyl groups in a molecule, a silanol group-containing compound such as triphenyl silanol, diphenylsilanediol, or trimethyl silanol, an organic acid such as oxalic acid, acetic acid, or benzoic acid, an inorganic acid such as hydrochloric acid, hydrogen bromide, sulfuric acid, or nitric acid, or the like.

(Epoxy Resin Composition)

The curable resin in an embodiment of the present invention can be used in various applications as a curable resin that hardens in reaction alone or in combination with another resin. For example, it is used in applications including molding materials such as sealer, laminated plate materials, various adhesive agent materials, various electronic or electric component materials, and paint materials. The curable resin according to the present invention may be used in combination with another curable resin such as epoxy resin, phenol resin, isocyanate resin, urethane resin, unsaturated polyester resin, melamine resin, silicone resin, allyl resin, or alkyd resin. The curable resin according to the present invention is useful as an epoxy resin-curing agent, and thus, may be processed into a curable resin composition, in combination with an epoxy resin and, as needed, another component, accelerating hardening of the epoxy resin.

The epoxy resin composition in an embodiment of the present invention is characterized by containing an epoxy resin (A) and a curing agent (B), wherein the curing agent (B) contains the novel curable resin in the embodiment of the present invention described above. The epoxy resin composition according to the present invention may be blended with an accelerator (C) and an inorganic filler (D) in addition to the components (A) and (B). It may also contain, as needed, various additives such as coupling agent, ion exchanger, releasing agent, stress-relaxing agent, flame retardant, and colorant. Hereinafter, major components for the epoxy resin composition according to the present invention will be described.

Epoxy Resin (A)

The epoxy resin (A) for use in the present invention is not particularly limited, if it is an epoxy resin having two or more epoxy groups in a molecule. Examples thereof include novolak epoxy resins prepared by epoxidation of a novolak resin obtained by condensation or cocondensation of a phenol such as phenol, cresol, xylenol, resorcin, catechol, bisphenol A, or bisphenol F and/or a naphthol such as α-naphthol, β-naphthol, or dihydroxynaphthalene with an aldehyde group-containing compound such as formaldehyde, acetaldehyde, propionaldehyde, benzaldehyde, or salicyl aldehyde under the presence of an acidic catalyst, such as phenolic novolak epoxy resin and ortho-cresol novolak epoxy resin;

diglycidyl ethers of bisphenol A, bisphenol F, bisphenol S, alkyl-substituted or unsubstituted biphenol, stilbene-based phenol, or the like (bisphenol epoxy resin, biphenyl epoxy resin, and stilbene epoxy resin) and glycidyl ethers of an alcohol such as butanediol, polyethylene glycol, or polypropylene glycol;

glycidyl ester epoxy resins prepared by using a carboxylic acid such as phthalic acid, isophthalic acid, tetrahydrophthalic acid, or the like;

glycidyl or methylglycidyl epoxy resins having a nitrogen atom such as of aniline or isocyanuric acid, an active hydrogen bound thereto being substituted with a glycidyl group;

alicyclic epoxy resins obtained by intramolecular epoxidation of an olefin bond such as vinylcyclohexene diepoxide, 3,4-epoxycyclohexylmethyl-3,4-epoxycyclohexanecarboxylate, and 2-(3,4-epoxy)cyclohexyl-5,5-spiro(3,4-epoxy)cyclohexane-m-dioxane;

glycidyl ethers of para-xylylene and/or meta xylylene-modified phenol resins;

glycidyl ethers of terpene-modified phenol resins;

glycidyl ethers of dicyclopentadiene-modified phenol resins; glycidyl ethers of cyclopentadiene-modified phenol resins;

glycidyl ether of polycyclic aromatic ring-modified phenol resins;

glycidyl ethers of naphthalene ring-containing phenol resins;

halogenated phenolic novolak epoxy resins;

hydroquinone epoxy resins;

trimethylolpropane epoxy resins;

linear aliphatic epoxy resins obtained by oxidation of an olefin bond with a peracid such as peracetic acid;

diphenylmethane epoxy resins;

epoxide of aralkyl phenol resins such as phenol aralkyl resins and naphthol aralkyl resins;

sulfur atom-containing epoxy resins; and naphthalene epoxy resins, and these resins may be used alone or in combination of two or more.

Among the epoxy resins above, biphenyl epoxy resins, stilbene epoxy resins, diphenylmethane epoxy resins, sulfur atom-containing epoxy resins, novolak epoxy resins, dicyclopentadiene epoxy resins, salicyl aldehyde epoxy resins, naphthol/phenol copolymerized epoxy resins, phenol aralkyl resins, epoxides of aralkyl phenol resins such as naphthol aralkyl resins, and naphthalene phenol resins are preferable, from the points of reflow-cracking resistance and fluidity; and these resins may be used alone or in combination of two or more. However, the resins are preferably used in a total amount of 30 wt % or more, more preferably 50 wt % or more, with respect to the total amount of the epoxy resin for maximizing the favorable properties. Hereinafter, specific examples of preferable epoxy resins are shown.

The biphenyl epoxy resin is not particularly limited if it is a biphenyl skeleton-containing epoxy resin, but preferably an epoxy resin represented by the following Formula (II). Commercially available among the epoxy resins represented by the following Formula (II) are YX-4000H (product name, manufactured by Japan Epoxy Resin Co., Ltd.) wherein, when the sites of the biphenyl ring bound to an oxygen atom are designated as 4 and 4' positions, groups $R^8$ at 3, 3', 5, and 5' positions are methyl groups and groups other than those are hydrogen atoms; and YL-6121H (product name, manufactured by Japan Epoxy Resin Co., Ltd.), a mixture of epoxy resins: 4,4'-bis(2,3-epoxypropoxy)biphenyl, wherein all groups $R^8$ are hydrogen atoms and another epoxy resin wherein, when the sites of the biphenyl ring bound to an oxygen atom are designated as 4 and 4' positions, the groups $R^8$ at 3, 3', 5, and 5' positions are methyl groups and the other groups are hydrogen atoms.

[Formula 26]

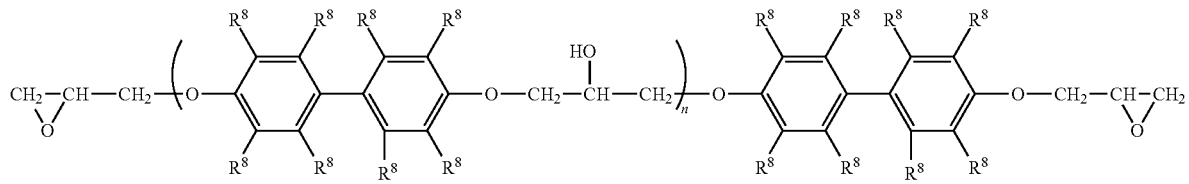

(II)

(In Formula (II), groups $R^8$ each represent a hydrogen atom, an alkyl group having 1 to 12 carbon atoms or an aryl group having 4 to 18 carbon atoms and may be identical or different from each other; and n is an average positive number of 0 to 10).

The stilbene epoxy resin is not particularly limited if it is a stilbene skeleton-containing epoxy resin, but preferably an epoxy resin represented by the following Formula (III).

Commercially available among the epoxy resins represented by the following Formula (III) is ESLV-210 (product name, manufactured by Sumitomo Chemical Co., Ltd.) a mixture of an epoxy resin wherein, when the positions of the rings bound to an oxygen atom are designated as 4 and 4' positions, the groups $R^9$ at 3, 3', 5, and 5' positions are methyl group, the other groups are hydrogen atoms and all groups $R^{10}$ are hydrogen atoms, and an epoxy resin wherein three of the groups $R^9$ at 3, 3', 5, and 5' positions are methyl groups and one of them is a tert-butyl group, the other groups are hydrogen atoms, and all groups $R^{10}$ are hydrogen atom.

[Formula 27]

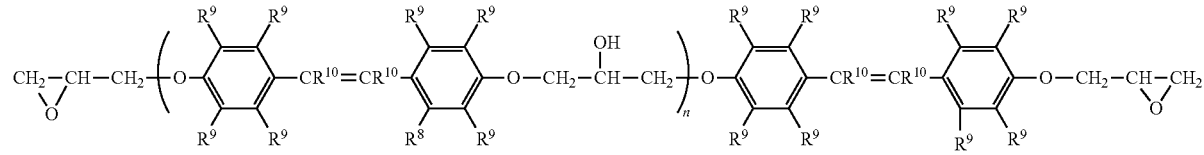

(III)

(In Formula (III), each of the groups $R^9$ and $R^{10}$ represents a hydrogen atom or a monovalent organic group having 1 to 18 carbon atoms; respective groups may be identical or different from each other; and n is an average positive number of 0 to 10).

The diphenylmethane epoxy resin is not particularly limited if it is a diphenylmethane skeleton-containing epoxy resin, but preferably an epoxy resin represented by the following Formula (IV). Commercially available among the epoxy resins represented by the following Formula (IV) epoxy resin is YSLV-80XY (product name, manufactured by Nippon Steel Chemical Co., Ltd.), wherein all groups $R^{11}$ are hydrogen atoms, and, when the positions of the rings bound to an oxygen atom are designated as 4 and 4' positions, the groups $R^{12}$ at 3, 3', 5, and 5' positions are methyl groups, and the other groups are hydrogen atom.

[Formula 28]

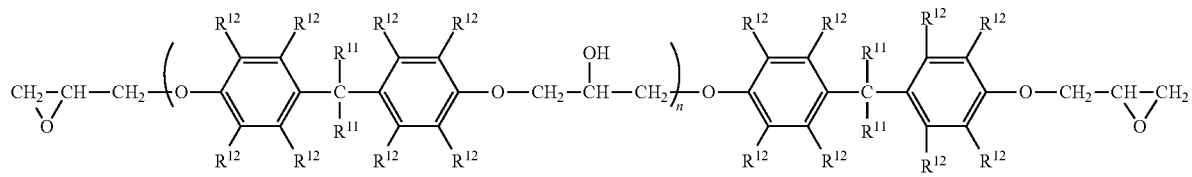

(IV)

(In Formula (IV), each of $R^{11}$ and $R^{12}$ represents a hydrogen atom or a monovalent organic group having 1 to 18 carbon atoms; respective groups may be identical or different from each other; and n is an average positive number of 0 to 10).

The sulfur atom-containing epoxy resin is not particularly limited if it is a sulfur atom-containing epoxy resin, and is, for example, an epoxy resin represented by the following Formula (V). Commercially available among the epoxy resins represented by the following Formula (V) is YSLV-120TE (product name, manufactured by Nippon Steel Chemical Co., Ltd.), wherein, when the position of the rings bound to an oxygen atom are designated as 4 and 4' positions, the groups $R^{13}$ at 3 and 3' positions are tert-butyl groups, the groups at 6 and 6' positions are methyl groups, and the other groups are hydrogen atoms.

[Formula 29]

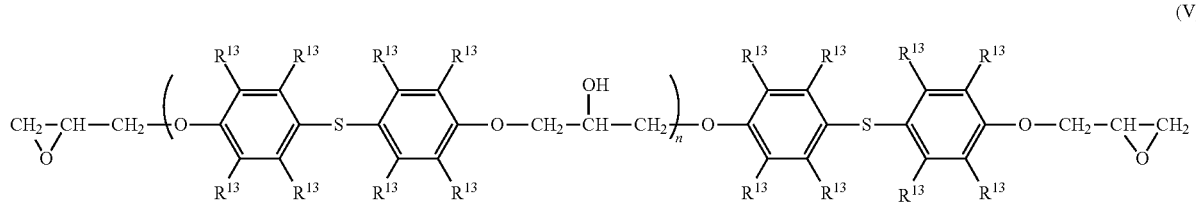

(V)

(In Formula (V), each $R^{13}$ represents a hydrogen atom or a monovalent organic group having 1 to 18 carbon atoms; respective groups may be identical or different from each other; and n is an average positive number of 0 to 10).

The novolak epoxy resin is not particularly limited if it is an epoxy resin prepared by epoxidization of a novolak phenol resin, and preferably an epoxy resin prepared by epoxidizing a novolak phenol resin such as phenolic novolak, cresol novolak, or naphthol novolak for example by conversion to an glycidyl ether, more preferably an epoxy resin represented by the following Formula (VI). Commercially available among the epoxy resins represented by the following Formula (VI) epoxy resin are ESCN-190 and ESCN-195 (product name, manufactured by Sumitomo Chemical Co., Ltd.) wherein all groups $R^{14}$ are hydrogen atoms, all groups $R^{15}$ are methyl groups, and i is 1.

[Formula 30]

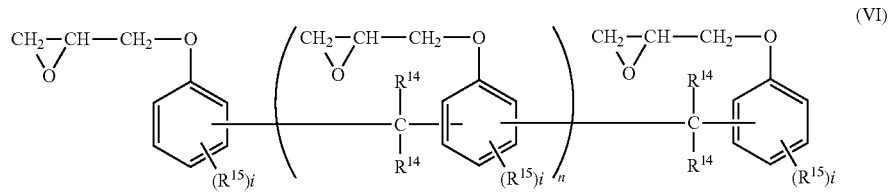

(In Formula (VI), each of $R^{14}$ and $R^{15}$ represents a hydrogen atom or a monovalent organic group having 1 to 18 carbon atoms; respective groups may be identical or different from each other; i denotes an integer of 0 to 3; and n is an average positive number of 0 to 10).

The dicyclopentadiene epoxy resin is not particularly limited if it is an epoxy resin prepared by epoxidizing a raw material dicyclopentadiene skeleton-containing compound, and is preferably an epoxy resin represented by the following Formula (VII). Commercially available among the epoxy resins represented by the following Formula (VII) is HP-7200 (product name, manufactured by Dainippon Ink and Chemicals Inc.) wherein i is 0.

[Formula 31]

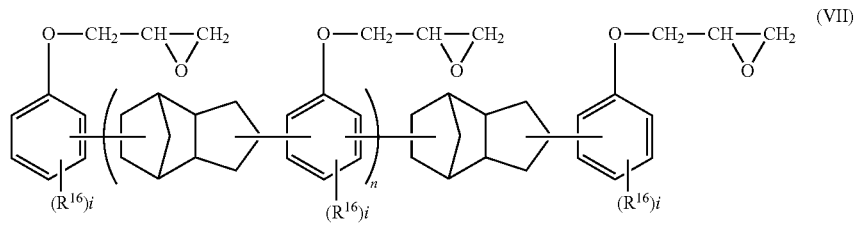

(In Formula (VII), each $R^{16}$ represents a hydrogen atom or a monovalent organic group having 1 to 18 carbon atoms; respective groups may be identical or different from each other; denotes an integer of 0 to 3; and n is an average positive number of 0 to 10).

The salicyl aldehyde epoxy resin is not particularly limited, if it is an epoxy resin prepared with respect to a raw material compound having a salicyl aldehyde skeleton, but is preferably a salicyl aldehyde epoxy resin sucu as an epoxy resin prepared by glycidyl etherification of a salicyl aldehyde phenol resin prepared from a salicyl aldehyde skeleton-containing compound and a phenolic hydroxyl group-containing compound, and more preferably an epoxy resin represented by the following Formula (VIII). Commercially available among the epoxy resins represented by the following Formula (VIII) are 1032H60 (product name, manufactured by Japan Epoxy Resin Co., Ltd.) and EPPN-502H (product name, manufactured by Nippon Kayaku Co., Ltd.), wherein i=0 and k=0.

[Formula 32]

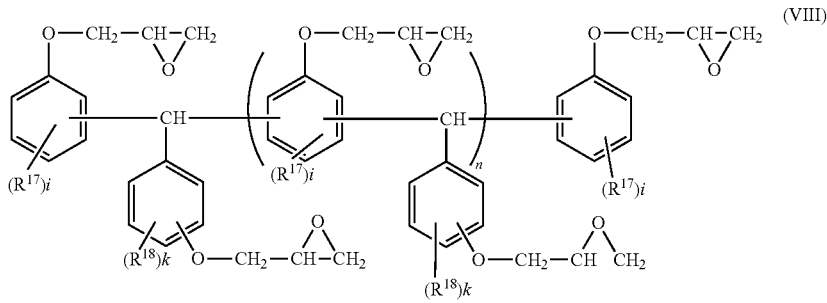

(VIII)

(In Formula (VIII), each of $R^{17}$ and $R^{18}$ represents a hydrogen atom or a monovalent organic group having 1 to 18 carbon atoms; respective groups may be identical or different from each other; i denotes an integer of 0 to 3; k denotes an integer of 0 to 4; and n is an average positive number of 0 to 10).

The naphthol/phenol copolymerized epoxy resin is not particularly limited if it is an epoxy resin prepared from raw materials of a naphthol skeleton-containing compound and a phenol skeleton-containing compound, and preferably an glycidyl ether of a novolak phenol resin using a naphthol skeleton-containing compound and a phenol skeleton-containing compound, more preferably an epoxy resin represented by the following Formula (IX). Commercially available among the epoxy resins represented by the following Formula (IX) are NC-7300 (product name, manufactured by Nippon Kayaku Co., Ltd.) wherein $R^{21}$ are methyl groups, i is 1, j is 0, and k is 0, and others.

[Formula 33]

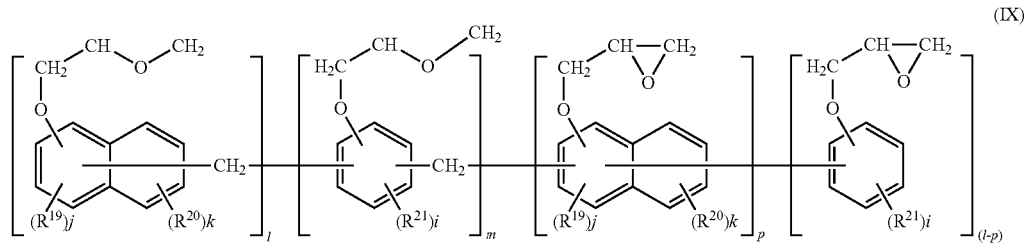

(IX)

(In Formula (IX), each of $R^{19}$ to $R^{21}$ represents a hydrogen atom or a monovalent organic group having 1 to 18 carbon atoms; respective groups may be identical or different from each other; i denotes an integer of 0 to 3; j denotes an integer of 0 to 2; k denotes an integer of 0 to 4;

p is an average positive number of 0 to 1; l or m is an average positive number of 0 to 11; and (l+m) is a positive number of 1 to 11).

The epoxy resins represented by Formula (IX) above include random copolymers containing a constituent unit and m other constituent units randomly, alternating copolymers containing them alternately, ordered copolymers, and block copolymers containing them blockwise, and these copolymers may be used alone or in combination of two or more.

The epoxide of an aralkyl phenol resin such as epoxide of phenol aralkyl resin or naphthol aralkyl resin is not particularly limited, if it is an epoxy resin prepared by using a phenol such as phenol or cresol and/or a naphthol such as naphthol or dimethylnaphthol in combination with a phenol resin prepared by dimethoxy para-xylene, bis(methoxymethyl)biphenyl, or the derivative thereof as raw materials. Favorably, for example, is the glycidyl ether of a phenol resin prepared from a phenol such as phenol or cresol and/or a naphthol such as naphthol or dimethylnaphthol in combination with dimethoxy para-xylene, bis(methoxymethyl)biphenyl, or the derivative thereof, and more preferable is an epoxy resin represented by the following Formula (X) or (XI). Commercially available among the epoxy resins represented by the following Formula (X) include NC-3000S (product name, manufactured by Nippon Kayaku Co., Ltd.), wherein i is 0 and groups $R^{38}$ are hydrogen atoms; and CER-3,000 (product name, manufactured by Nippon Kayaku Co., Ltd.), a mixture of an epoxy resin wherein i is 0 and groups $R^{38}$ are hydrogen atoms and an epoxy resin wherein all groups $R^8$ in Formula (II) are hydrogen atoms, at a weight ratio of 80:20. Also commercially available among the epoxy resins represented by the following Formula (XI) are ESN-175 (Nippon Steel Chemical Co., Ltd. product name) wherein i=0, j=0, and k=0, and others.

[Formula 34]

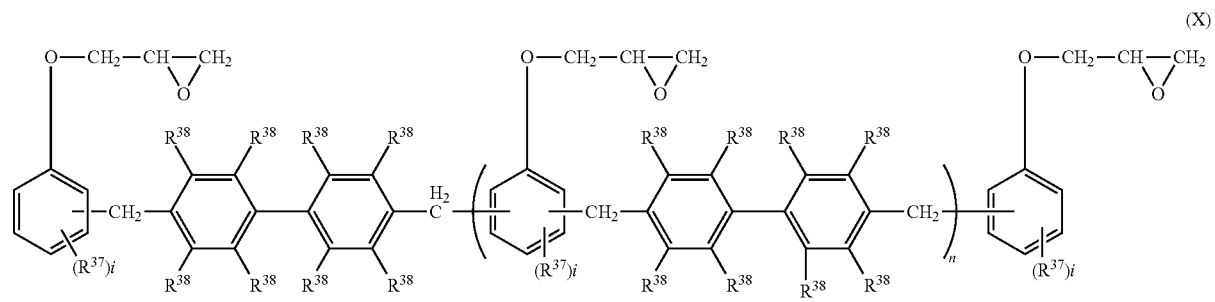

(X)

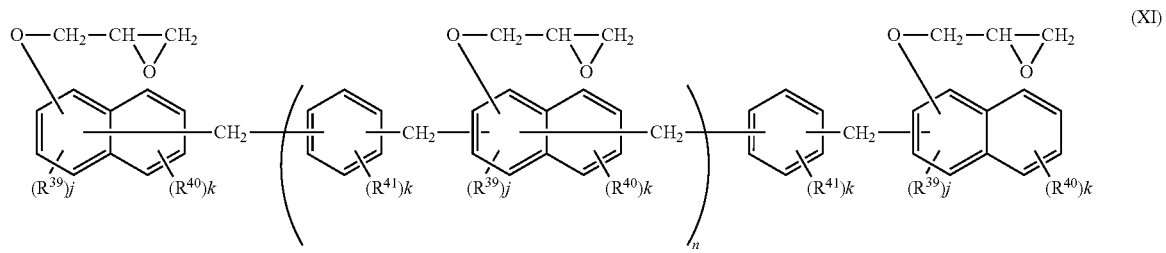

(XI)

(In Formula (X) and (XI), each of $R^{37}$ to $R^{41}$ represents a hydrogen atom or a monovalent organic group having 1 to 18 carbon atoms; respective groups may be identical or different from each other; i denotes an integer of 0 to 3; j denotes an integer of 0 to 2; and k denotes an integer of 0 to 4)

As for $R^8$ to $R^{21}$ and $R^{37}$ to $R^{41}$ in Formula (II) to (XI) above, the phrase "respective groups may be identical or different from each other" means, for example, that all of the 8 to 88 groups $R^8$ in Formula (II) may be identical or different from each other. It also means that all of other groups $R^9$ to $R^{21}$ and $R^{37}$ to $R^{41}$, in the number up to that shown in Figures, may be identical or different from each other. Alternatively, groups of $R^8$ to $R^{21}$ and $R^{37}$ to $R^{41}$ may also be identical or different from each other. For example, all groups of $R^9$ and $R^{10}$ may be identical or different from each other.

The naphthalene epoxy resin is not particularly limited, if it is an epoxy compound containing a naphthalene ring. For example, it is preferably the glycidyl etherified compound of a naphthol compound prepared from a naphthol derivative such as naphthol, dihydroxynaphthalene, or dimethylnaphthol, more preferably, an epoxy resin represented by the following Formula (XI-a).

Commercially available among the epoxy resins represented by the following Formula (XI-a) are EXA-4700 and EXA-4701 (product name, manufactured by Dainippon Ink and Chemicals Inc.) wherein n is 1, all of groups $R^{41}$ and $R^{42}$ are hydrogen atoms, and all groups $R^{43}$ are glycidyloxy groups; HP-4032 (product name, manufactured by Dainippon Ink and Chemicals Inc.) wherein n is 0, all groups $R^{41}$ and $R^{42}$ are hydrogen atoms, and groups $R^{43}$ are glycidyloxy groups; EXA-4750 (product name, manufactured by Dainippon Ink and Chemicals Inc.) wherein n is 1, all groups $R^{41}$ and $R^{42}$ are hydrogen atoms, one group $R^{43}$ is a hydrogen atom, and the other groups are glycidyloxy groups; and others.

[Formula 35]

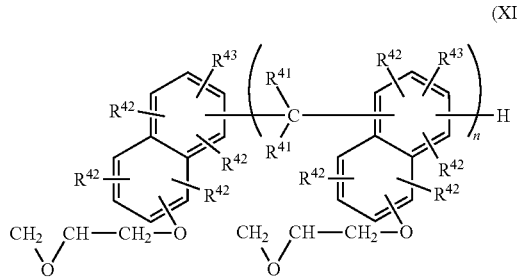

(XI-a)

(In Formula (XI-a), each of groups $R^{41}$ and $R^{42}$ represents a hydrogen atom or a monovalent organic group having 1 to 18 carbon atoms; $R^{43}$ represents a hydrogen atom or a glycidyloxy group; respective groups may be identical or different from each other; and n is an average positive number of 0 to 10).

The phrase "respective groups may be identical or different from each other" used for groups $R^8$ to $R^{21}$ and $R^{37}$ to $R^{43}$ in Formula (II) to (XI) and (XI-a) means that, for example, all of 8 to 88 groups $R^8$ in Formula (II) may be identical or different from each other. It also means that all of other groups $R^9$ to $R^{21}$ and $R^{37}$ to $R^{41}$, in the number up to that shown in Figures, may be identical or different from each other. The groups of $R^8$ to $R^{21}$ and $R^{37}$ to $R^{41}$ may also be identical or different from each other. For example, all groups of $R^9$ and $R^{10}$ may be identical or different from each other.

"n" in Formula (II) to (XI) and (XI-a) should be in the range of 0 to 10, and a component (B) having a n value of more than 10 has higher melt viscosity, leading to increase in the viscosity during melt-molding of the curable resin composition, and consequently, causing unfavorable filling and deformation of bonding wire (gold wire connecting the element to its lead) more frequently. n in one molecule is preferably set to be in the range of 0 to 4 on average.

Curing Agent (B)

The epoxy resin composition according to the present invention is characterized by using the novel curable resin according to the present invention described above as a curing agent (B). The blending ratio of the epoxy resin (A) and the curing agent (B) to the curable resin according to the present invention in the epoxy resin composition according to the present invention, is a ratio of the sum of the number of —ArO—Si bonds in the curable resin according to the present invention (B) and the total number of the unreacted phenolic hydroxyl groups in the curable resin according to the present invention to the total number of the epoxy groups in the epoxy resin (A) [(number of —ArO—Si bonds in the curable resin according to the present invention)+(number of the unreacted phenolic hydroxyl groups in the curable resin according to the present invention)]/[total number of the epoxy groups in the epoxy resin], which is preferably in the range of 0.5 to 2.0.

The blending ratio is preferably in the range of 0.7 to 1.5, more preferably 0.8 to 1.3. A blending ratio of less than 0.5 may often lead to insufficient hardening of the epoxy resin and decrease in heat resistance, moisture resistance and electrical properties of the hardened product. On the other hand, a blending ratio of more than 2.0 may often lead to excess of the curing agent component, resulting in decrease in hardening efficiency and also in electrical properties and moisture resistance of the package, because phenolic hydroxyl groups remain in the hardened resin in a greater amount.

The epoxy resin composition according to the present invention may contain a compound other than the curable resin according to the present invention described above as a curing agent (B). The compound for use in combination as the curing agent is not particularly limited, if it hardens an epoxy resin. Examples thereof include phenol compounds such as phenol resin; amine compounds such as diamines and polyamines; organic anhydrides such as phthalic anhydride, trimellitic anhydride, and pyromellitic anhydride; and carboxylic acid compounds such as dicarboxylic acids and polycarboxylic acids, and these resins may be used alone or in combination of two or more. In particular, use of a compound having two or more phenolic hydroxyl groups in a molecule is preferable.

When a phenol compound is used as a curing agent in combination with the curable resin according to the present invention in the epoxy resin composition according to the present invention, the blending amount of the curable resin according to the present invention is preferably 30 wt % or more, more preferably 50 wt % or more, with respect to the total amount of the components for the curing agent (B). When the content of the curable resin according to the present invention in the curing agent (B) is less than 30 wt %, the resulting epoxy resin composition may often show a decrease in water-absorbing property and other advantageous effects of the present invention.

When a compound having two or more phenolic hydroxyl groups in a molecule is used in combination as a curing agent in the epoxy resin composition according to the present invention, the blending ratio of the epoxy resin (A) to the curable resin and the phenol compound used in combination as the curing agent (B), i.e., the ratio of the sum (B) of the number of the —ArO—Si bonds in the curable resin according to the present invention, the number of the unreacted reaction phenolic hydroxyl groups in the curable resin according to the present invention, and the number of the phenolic hydroxyl group in the compound used in combination to the total number of the epoxy groups in the epoxy resin (A), i.e., [(number of —ArO—Si bonds in the curable resin according to the present invention)+(number of the unreacted phenolic hydroxyl groups in the curable resin according to the present invention)+(number of the phenolic hydroxyl groups in the phenol compound used in combination)]/[number of epoxy groups in the epoxy resin], is preferably in the range of 0.5 to 2.0. The blending ratio is more preferably in the range of 0.7 to 1.5, and still more preferably in the range of 0.8 to 1.3. A blending ratio of less than 0.5 may often lead to insufficient hardening of the epoxy resin and decrease in heat resistance, moisture resistance and electrical properties of the hardened product. On the other hand, a blending ratio of more than 2.0 may often lead to excess of the curing agent components, often resulting in decrease in hardening efficiency and also in electrical properties and moisture resistance of the package, because of a large amount of the phenolic hydroxyl groups remain in the hardened.

The phenol compound that can be used in combination with the curable resin according to the present invention as a curing agent in the range above is not particularly limited, and may be a compound having two or more phenolic hydroxyl group in a molecule commonly used as a curing agent. Examples thereof include compounds containing two phenolic hydroxyl groups in a molecule such as resorcin, catechol, bisphenol A, bisphenol F, and substituted or unsubstituted biphenols;

novolak phenol resins prepared by condensation or cocondensation of a phenol such as phenol, cresol, xylenol, resorcin, catechol, bisphenol A, bisphenol F, phenylphenol, or aminophenol and/or a naphthol such as α-naphthol, β-naphthol, or dihydroxynaphthalene with an aldehyde such as formaldehyde, acetaldehyde, propionaldehyde, benzaldehyde, or salicyl aldehyde under the presence of an acidic catalyst;

aralkyl phenol resins such as phenol aralkyl resins and naphthol aralkyl resins prepared in reaction of a phenol and/or a naphthol with dimethoxy-para-xylene or bis(methoxymethyl)biphenyl;

para-xylylene and/or meta xylylene-modified phenol resins;

melamine-modified phenol resins;

terpene-modified phenol resins;

dicyclopentadiene phenol resins and dicyclopentadiene naphthol resins prepared by copolymerization of a phenol and/or a naphthol with dicyclopentadiene;

cyclopentadiene-modified phenol resins;

polycyclic aromatic ring-modified phenol resins;

biphenyl phenol resins;

triphenylmethane phenol resins; and phenol resins obtained by copolymerization of two or more of the resins above, and these resins may be used alone or in combination of two or more.

Among the phenol compounds described above, aralkyl phenol resins, dicyclopentadiene phenol resins, salicyl aldehyde phenol resins, copolymeric benzaldehyde and aralkyl phenol resins, and novolak phenol resins are preferable from the viewpoint of reflow-cracking resistance. These aralkyl phenol resins, dicyclopentadiene phenol resins, salicyl aldehyde phenol resins, copolymeric benzaldehyde and aralkyl phenol resins, and novolak phenol resins may be used alone or in combination of two or more. However, for maximizing the advantageous effects of the curable resin according to the present invention, the phenol resins described above are preferably used in combination in a total amount of 70 wt % or less, more preferably 50 wt % or less, and still more preferably 30 wt % or less, with respect to the total amount of the curing agents.

The aralkyl phenol resin is not particularly limited, if it is a phenol resin prepared with a phenol and/or a naphthol and dimethoxy-para-xylene, bis(methoxymethyl) biphenyl, or the derivative thereof, but preferably a phenol resin represented by the following Formula (XII) to (XIV).

[Formula 36]

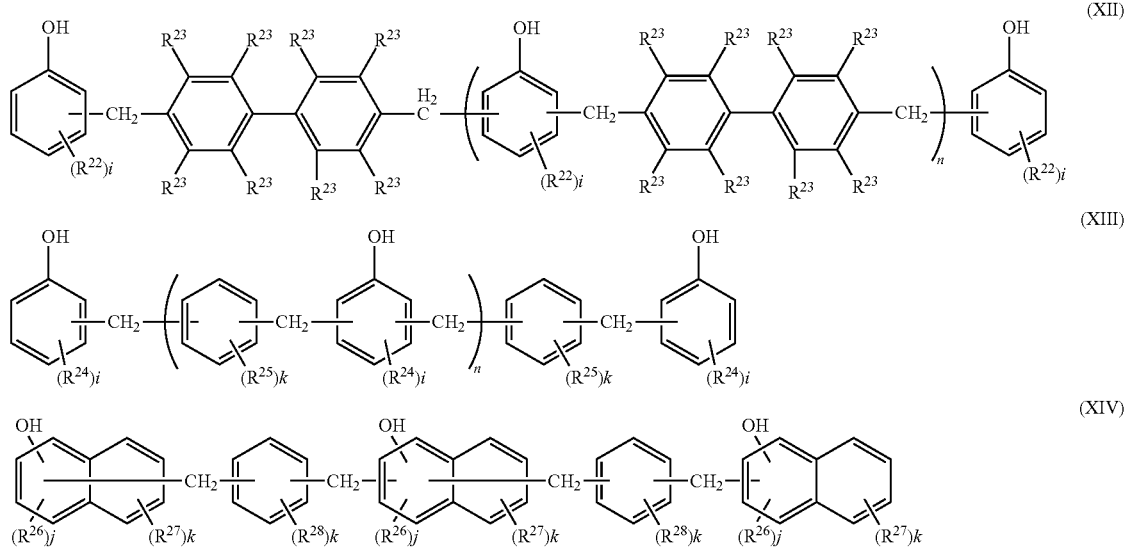

(In Formula (XII) to (XIV), each group $R^{22}$ to $R^{28}$ represents a hydrogen atom or a monovalent organic group having 1 to 18 carbon atoms; respective groups may be identical or different from each other; i denotes an integer of 0 to 3; k denotes an integer of 0 to 4; j denotes an integer of 0 to 2; and n is an average positive number of 0 to 10).

Commercially available among the phenol resins represented by Formula (XII) above are MEH-7851 (product name, Meiwa Plastic Industries, Ltd.) wherein i is 0 and all groups $R^{23}$ are hydrogen atoms and others.

Commercially available among the phenol resins represented by Formula (XIII) above are XL-225 and XLC (product name, manufactured by Mitsui Chemicals, Inc.) and MEH-7800 (product name, manufactured by Meiwa Plastic Industries, Ltd.) wherein i is 0 and k is 0, and others.

Also commercially available among the phenol resins represented by Formula (XIV) above are SN-170 (product name, manufactured by Nippon Steel Chemical Co., Ltd.) wherein j is 0, k of $R^{27}$ is 0, and k of $R^{28}$ is 0, and others.

The dicyclopentadiene phenol resin is not particularly limited if it is a phenol resin prepared by using a dicyclopentadiene skeleton-containing compound as the raw material, and preferably a phenol resin represented by the following Formula (XV). Commercially available among the phenol resins represented by the following Formula (XV) are DPP (product name, manufactured by Nippon Petrochemicals Company, Limited) wherein i is 0, and others.

[Formula 37]

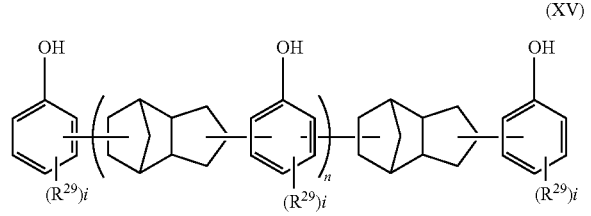

(XV)

(In Formula (XV), each group $R^{29}$ represents a hydrogen atom or a monovalent organic group having 1 to 18 carbon atoms; respective groups may be identical or different from each other; i denotes an integer of 0 to 3; and n is an average positive number of 0 to 10).

The salicyl aldehyde phenol resin is not particularly limited if it is a phenol resin prepared by using a salicyl aldehyde skeleton-containing compound as the raw material, and is preferably a phenol resin represented by the following Formula (XVI).

Commercially available among the phenol resins represented by the following Formula (XVI) are MEH-7500 (product name, manufactured by Meiwa Plastic Industries, Ltd.) wherein i is 0 and k is 0, and others.

[Formula 38]

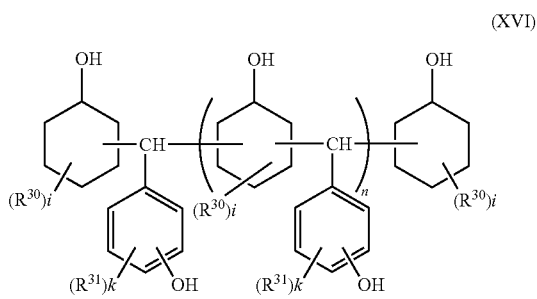

(XVI)

(In Formula (XVI), each group $R^{30}$ and $R^{31}$ represents a hydrogen atom or a monovalent organic group having 1 to 18 carbon atoms; respective groups may be identical or different from each other; i denotes an integer of 0 to 3; k denotes an integer of 0 to 4; and n is an average positive number of 0 to 10).

The copolymeric benzaldehyde and aralkyl phenol resin is not particularly limited if it is a copolymeric phenol resin/aralkyl phenol resin prepared by using a benzaldehyde skeleton-containing compound as the raw material, and is preferably a phenol resin represented by the following Formula (XVII).

Commercially available among the phenol resins represented by the following Formula (XVII) are HE-510 (product name, manufactured by Air Water Inc., Chemical Division) wherein i is 0, k is 0, and q is 0, and others.

[Formula 39]

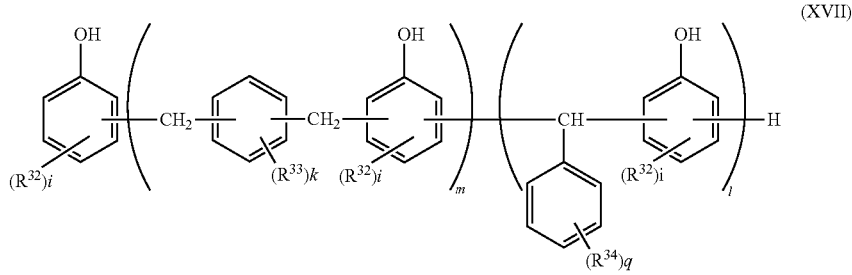

(XVII)

(In Formula (XVII), each group $R^{32}$ to $R^{34}$ represents a hydrogen atom or a monovalent organic group having 1 to 18 carbon atoms; respective groups may be identical or different from each other; i denotes an integer of 0 to 3; k denotes an integer of 0 to 4; q denotes an integer of 0 to 5; each of l and m is an average positive number of 0 to 11; and (l+m) is a positive number of 1 to 11).

The novolak phenol resin is not particularly limited if it is a phenol resin obtained by condensation or cocondensation of a phenol and/or a naphthol and an aldehydes under the presence of an acidic catalyst, and is preferably a phenol resin represented by the following Formula (XVIII).

Commercially available among the phenol resins represented by the following Formula (XVIII) are Tamanol 758 and 759 (product name, manufactured by Arakawa Chemical Industries, Ltd.) and HP-850N (product name, manufactured by Hitachi Chemical Co., Ltd.) wherein i is 0 and all groups $R^{35}$ are hydrogen atoms, and others.

[Formula 40]

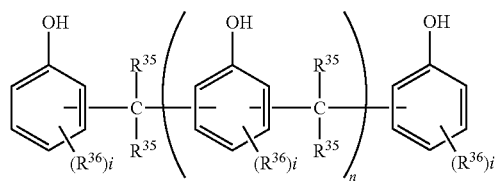

(XVIII)

(In Formula (XVIII), each group $R^{35}$ or $R^{36}$ represents a hydrogen atom or a monovalent organic group having 1 to 18 carbon atoms; respective groups may be identical or different from each other; i denotes an integer of 0 to 3; k denotes an integer of 0 to 4; and n is an average positive number of 0 to 10).

The phrase "respective groups may be identical or different from each other" used for groups $R^{22}$ to $R^{36}$ in Formula (XII) to (XVIII) above means that, for example, all of the i groups $R^{22}$ in Formula (XII) may be identical or different from each other. It also means that all of other groups $R^{23}$ to $R^{36}$, in the number up to that shown in Figures, may be identical or different from each other. The groups of $R^{22}$ to $R^{36}$ may also be identical or different from each other. For example, all groups of $R^{22}$ and $R^{23}$ may be identical or different from each other and also, all groups of $R^{30}$ and $R^{31}$ may be identical or different from each other.

"n" in Formula (XII) to (XVIII) should be in the range of 0 to 10, and a curing resin component (B) having a n value of more than 10 has higher melt viscosity, leading to increase in the viscosity during melt-molding of the curable resin composition, and consequently causing unfavorable filling and deformation of bonding wire (gold wire connecting the element to its lead) more frequently. n in one molecule is preferably set to be in the range of 0 to 4 on average.

Curing Accelerator (C)

The curable resin composition according to the present invention may contain, as needed, a curing accelerator. Examples of the curing accelerators for use include cycloamidine compounds including diazabicycloalkenes such as 1,5-diazabicyclo[4.3.0]nonene-5 and 1,8-diazabicyclo [5.4.0]undecene-7 and the derivatives thereof; the phenolic novolak salts thereof and the intramolecular polarized compounds prepared by adding a π bond-containing compound such as maleic anhydride, a quinone compound (such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, or phenyl-1,4-benzoquinone), or a diazophenylmethane, to the compound; tertiary amines such as triethylenediamine, benzyldimethylamine, triethanolamine, dimethylaminoethanol, and tris(dimethylaminomethyl)phenol and the derivatives thereof; imidazoles such as 2-methylimidazole, 2-phenylimidazole, 2-phenyl-4-methylimidazole, and 2-heptadecylimidazole; tetrasubstituted phosphonium tetrasubstituted borates such as tetraphenyl phosphonium tetraphenylborate; tetraphenyl boron salts such as 2-ethyl-4-methylimidazole tetraphenylborate and N-methylmorpholine tetraphenylborate; organic phosphines such as triphenylphosphine, diphenyl(p-toluoyl)phosphine, tris (alkylphenyl)phosphines, tris(alkoxyphenyl)phosphines, tris (alkyl-alkoxyphenyl)phosphines, tris(dialkylphenyl)phosphines, tris(trialkylphenyl)phosphines, tris(tetraalkylphenyl) phosphines, tris(dialkoxyphenyl)phosphines, tris (trialkoxyphenyl)phosphines, tris(tetraalkoxyphenyl) phosphines, trialkylphosphines, dialkyl arylphosphines, and alkyldiarylphosphines; complexes of the organic phosphine with an organic boron; intramolecular polarized compounds prepared by adding to the organic phosphines a π bond-containing compound such as maleic anhydride, a quinone compound (such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, or phenyl-1,4-benzoquinone), or diazophenylmethane to the organic phosphine; and intramolecular polarized compounds prepared by reacting the organic phosphines with a halogenated phenol compound such as 4-bromophenol, 3-bromophenol, 2-bromophenol, 4-chlorophenol, 3-chlorophenol, 2-chlorophenol, 4-chlorophenol, 3-chlorophenol, 2-chlorophenol, 4-bromo-2-methylphenol, 4-bromo-3-methylphenol, 4-bromo-2,6-dimethylphenol, 4-bromo-3,5-dimethylphenol, 4-bromo-2,6-di-tert-butylphenol, 4-chloro-1-naphthol, 1-bromo-2-naphthol, 6-bromo-2-naphthol, or 4-bromo-4'-hydroxybiphenyl and then dehaoganating the product (as described in Japanese Patent Application Laid-Open No. 2004-156036). Among them, preferable for use in combination from the viewpoint of fluidity are intramolecular polarized compounds prepared by adding a π bond-containing compound to an organic phosphine; and intramolecular polarized compounds prepared by dehaoganation of the product obtained in reaction of an organic phosphine with a halogenated phenol compound; and, preferable from the viewpoint of curing efficiency are the intramolecular polarized compounds prepared by dehaoganation of the product obtained in reaction of an organic phosphine with a halogenated phenol compound. In particular, the phosphine compounds represented by the following Formula (I-5) or the intermolecular salts thereof are used favorably. In the Formula, $R^4$, $R^5$, and $Y^-$ are the same as those described above.

[Formula 41]

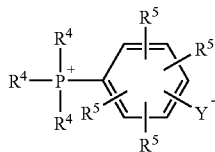
(I-5)

The blending amount of the accelerator (C) in the epoxy resin composition according to the present invention is not particularly limited, if curing of the resin is accelerated favorably. However, for improvement of the curing efficiency and fluidity of the resin composition when absorbing moisture, the accelerators (C) are desirably blended in a total amount of 0.1 to 10 parts by weight, more preferably 1 to 7.0 parts by weight, with respect to the total 100 parts by weight of the epoxy resin (A). A blending amount of less than 0.1 parts by weight prohibits curing of the resin composition in a short period of time, while a blending amount of more than 10 parts by weight may prohibit production of a preferable molded article because of excessively high curing velocity.

Inorganic Filler (D)

The curable resin composition according to the present invention may be blended with inorganic filler (D) as needed. In particular when the curable resin composition is used as a molding material for sealing, addition of the inorganic filler (D) is preferable. The inorganic fillers (D) for use in the present invention is not particularly limited, and may be any common molding material for sealing.

Examples thereof include fine powders such as of fused silica, crystalline silica, glass, alumina, calcium carbonate, zirconium silicate, calcium silicate, silicon nitride, aluminum nitride, boron nitride, beryllia, zirconia, zircon, forsterite, steatite, spinel, mullite, titania, talc, clay, and mica, and the sphericalized beads thereof. Examples of flame-retarding inorganic fillers include aluminum hydroxide, magnesium hydroxide, composite metal hydroxides such as mixed magnesium zinc hydroxide, zinc borate and the like. Among them, use of fused silica is preferable for reduction of linear expansion coefficient, and use of alumina from the viewpoint of high heat conductivity. These inorganic fillers may be used alone or in combination of two or more.

The blending amount of the inorganic filler (D) is not particularly limited, if the advantageous effects of the present invention is obtained, but preferably in the range of 55 to 90% by volume with respect to the curable resin composition. The inorganic filler is added for the purpose of improving the thermal expansion coefficient, heat conductivity, elastic modulus, and others of the hardened product, and the improvement in these properties may often be insufficient at a blending ratio of less than 55 vol %, while the viscosity of the curable resin composition may often be increased and the fluidity lowered, prohibiting molding, at a ratio of more than 90% by volume.

The average diameter of the inorganic filler (D) is preferably 1 to 50 μm, more preferably 10 to 30 μm. A curable resin composition containing an inorganic filler having an average diameter of less than 1 μm is higher in viscosity, that containing an inorganic filler having an average diameter of more than 50 μm often results in easier separation of the resin component from the inorganic filler, giving a hardened product unevenly molded, varying in properties, or less easily filled into narrow gap.

The particle shape of the inorganic filler (D) is more preferably spherical than square from the viewpoint of fluidity, and the particle size distribution of the inorganic filler (D) is preferably wider. For example, when an inorganic filler is blended at a ratio of 75 vol % or more, spherical particles having a wide particle size distribution of 0.1 to 80 μm are preferably used in an amount of 70 wt % or more of the filler. Such an inorganic filler likely has a closest packing structure, and thus, gives a curable resin composition superior in fluidity without increase in viscosity of the material, when added in a greater amount.

(Various Additives)

The curable resin according to the present invention composition may contain, as needed, various other additives such as coupling agent, ion exchanger, releasing agent, stress-relaxing agent, flame retardant, and colorant, in addition to the components described above such as epoxy resin (A), curing agent (B), accelerator (C), and inorganic filler (D). However, the additive for the curable resin composition according to the present invention is not limited to those described below, and any one of various additives known in the art may be added.

(Coupling Agent)

For enhancing the adhesion between the resin component and the inorganic filler, any one of known coupling agents including various silane-based compounds (such as epoxy silane, mercapto silane, amino silane, alkyl silane, ureido silane, and vinyl silane), titanium-based compounds, aluminum chelates, and aluminum/zirconium-based compounds may be added to the sealant curable resin composition according to the present invention as needed.

The blending amount of the coupling agent is preferably 0.05 to 5 wt %, more preferably 0.1 to 2.5 wt %, with respect to the inorganic filler (D). A blending amount of less than 0.05 wt % may often lead to deterioration in the adhesion to frame, while a blending amount of more than 5 wt % to often decrease in moldability of the package.

Examples of the coupling agents include silane-based coupling agents such as vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(β-hydroxyethyl))aminopropyltriethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, N-β-(N-vinylbenzylaminoethyl)-γ-aminopropyltrimethoxysilane, γ-chloropropyltrimethoxysilane, hexamethyldisilane, vinyltrimethoxysilane, and γ-mercaptopropylmethyldimethoxysilane; and titanate coupling agents such as isopropyltriisostearoyl titanate, isopropyl tris(dioctyl pyrophosphate) titanate, isopropyl tri(N-aminoethyl-aminoethyl)titanate, tetraoctyl bis(ditridecylphosphite) titanate, tetra(2,2-diallyloxymethyl-1-butyl) bis(ditridecyl)phosphite titanate, bis(dioctylpyrophosphate) oxyacetate titanate, bis(dioctylpyrophosphato)ethylene titanate, isopropyl trioctanoyl titanate, isopropyl dimethacryl isostearoyl titanate, isopropyl tridodecylbenzenesulfonyl titanate, isopropyl isostearoyl diacryl titanate, isopropyl tri(dioctylphosphate) titanate, isopropyl tricumylphenyl titanate, and tetraisopropyl bis(dioctylphosphite) titanate, and these compounds may be used alone or in combination of two or more. Among them, secondary amino group-containing coupling agents are preferable, from the viewpoints of fluidity and wire flow.

(Ion Exchanger)

The curable resin composition according to the present invention may be blended with an anion exchanger as needed. In particular for use of the curable resin composition as a molding material for sealing, use of an anion exchanger is preferable, from the viewpoint of improvement in moisture resistance and high-temperature storage characteristics of the electronic device to be sealed. The anion exchanger for use in the present invention is not particularly limited, and any one of conventionally known exchangers may be used, and examples thereof include hydrotalcites and hydrated oxides of a metal selected from magnesium, aluminum, titanium, zirconium, and bismuth, and these compounds may be used alone or in combination of two or more. Among them, the hydrotalcites represented by the following Formula (XIX) are preferable.

(Formula 42)

$$Mg_{1-x}Al_x(OH)_2(CO_3)_{x/2} \cdot mH_2O \qquad (XIX)$$

($0 < x \leq 0.5$, m is a positive number).

The blending amount of the anion exchanger is not particularly limited, if it is sufficient for capturing anions such as halide ions, but preferably in the range of 0.1 to 30 wt %, more preferably 1 to 5 wt %, with respect to the epoxy resin (A).

(Releasing Agent)

A releasing agent may be added to the curable resin composition according to the present invention, for easier separation of the product during molding. The releasing agent for use in the present invention is not particularly limited, and any one of known releasing agents may be used. Examples thereof include higher fatty acids such as carnauba wax, montanic acid and stearic acid, higher fatty acid metal salts, ester-based waxes such as montanic acid esters, polyethylene-based oxide, and polyolefin waxes such as non-polyethylene oxide waxes, and these agents may be used alone or in combination of two or more. Among them, oxidized or non-oxidized polyolefin-based wax is preferable, and the blending amount is preferably 0.01 to 10 wt %, more preferably 0.1 to 5 wt %, with respect to the epoxy resin (A). A blending amount of polyolefin-wax of less than 0.01 wt % may often give a lower release characteristics, while a blending amount of more than 10 wt % may lead to deterioration in adhesion. Examples of the commercially available products of the polyolefin waxes include H4, PE, PED series low-molecular weight polyethylene products having a number-average molecular weight of about 500 to 10,000 manufactured by Hoechst. When another releasing agent is used in combination with a polyolefin-based wax, the blending ratio thereof is preferably 0.1 to 10 wt %, more preferably 0.5 to 3 wt %, with respect to the epoxy resin (A).

(Stress-Relaxing Agent)

A stress-relaxing agent such as silicone oil or silicone rubber powder may be added, as needed, to the curable resin composition according to the present invention. Addition of the stress-relaxing agent leads to reduction of bending deformation and cracking of the package. The stress-relaxing agent for used is not particularly limited, if it is a commonly used known flexibilizer (stress-relaxing agent). Examples of the common flexibilizers include thermoplastic elastomers such as of silicone, styrene, olefin, urethane, polyester, polyether, polyamine, and polybutadiene; particles of rubbers such as NR (natural rubber), NBR (acrylonitrile-butadiene rubber), acrylic rubber, urethane rubber, and silicone powder; and particles of core-shell-structured rubbers such as methyl methacrylate-styrene-butadiene copolymers (MBS), methyl methacrylate-silicone copolymers, and methyl methacrylate-butyl acrylate copolymers, and these compounds may be used alone or in combination of two or more. Among them, silicone-based flexibilizers are preferably, and examples of the silicone-based flexibilizers include those having an epoxy group, those having an amino group, and the polyether modified compounds thereof.

(Flame Retardant)

A flame retardant may be added, as needed, to the curable resin composition according to the present invention for improvement in flame resistance. The flame retardant for use in the present invention is not particularly limited, and examples thereof include known organic or inorganic compounds containing a halogen, antimony, nitrogen or phosphorus atom, and metal hydroxides, and these flame retardants may be use alone or in combination of two or more. The blending amount of the flame retardant is not particularly limited, if the flame-retarding effect is obtained, but preferably 1 to 30 wt %, more preferably 2 to 15 wt %, with respect to the epoxy resin (A).

(Colorant)

A known colorant such as carbon black, organic dye, organic pigment, titanium oxide, red lead, or bengala may also be added.

The curable resin composition according to the present invention described above can be prepared by any method as long as dispersion and mixing various components can be uniformly. Generally, such a resin composition is prepared by mixing predetermined blending amounts of components thoroughly, for example, in a mixer, melt-extruding the mixture, for example, in a mixing roll or extruder, and then cooling and pulverizing the mixture. More specifically, such a resin composition is prepared, for example, by agitating and mixing particular amounts of the components described above uniformly, kneading the mixture, for example, in a kneader, roll, or extruder previously heated to 70 to 140° C., and then, cooling and pulverized the mixture. The resin composition is much easier in handleability, if it is tabletized into tablets suitable in size and weight for the molding condition for package.

The electronic device in another embodiment of the present invention is characterized by containing elements sealed with the curable resin composition described above. Examples of the electronic parts and devices include electronic parts and devices having an active element such as semiconductor chip, transistor, diode, or thyristor or a passive element such as capacitor, resistor, or coil mounted on a supporting material such as lead frame, wired tape carrier, wiring board, glass, or silicon wafer, that is sealed with the curable resin composition according to the present invention. Specific examples thereof include common resin-sealed IC's such as DIP (Dual Inline Package), PLCC (Plastic Leaded Chip Carrier), QFP (Quad Flat Package), SOP (Small Outline Package), SOJ (Small Outline J-lead package), TSOP (Thin Small Outline Package), and TQFP (Thin Quad Flat Package) that are produced by fixing a semiconductor element on a lead frame, connecting the terminal portion of the element such as bonding pad to the lead frame by wire bonding or bump, sealing the element with the curable resin composition according to the present invention, for example, by transfer molding; TCP's (Tape Carrier Packages) wherein the semiconductor chip connected to a tape carrier by a bump is sealed with the curable resin composition according to the present invention; semiconductor chips connected to a wiring on wiring board or glass for example by wire bonding, flip chip bonding, or soldering;

COB (Chip On Board) modules wherein an active element such as transistor, diode, or thyristor and/or a passive element such as capacitor, resistor, or coil are sealed with the curable resin composition according to the present invention; and BGA's (Ball Grid Arrays) and CSP's (Chip Size Packages) that are produced by mounting an element on the surface of hybrid IC, multichip module, or an organic base plate having terminals for connection to wiring board on the rear face, connecting the element to the organic base plate by bump or wire bonding, and sealing the element with the curable resin composition according to the present invention. In particular, the curable resin composition according to the present invention, which is resistant to decrease in elastic modulus at high temperature, can be used favorably in applications demanding heat resistance and high temperature operation stability. Specific examples thereof include power-module packages, car-use packages, high-temperature-operating semiconductor packages such as SiC, and the like. It is also used effectively in hollow package apparatuses containing an optical semiconductor element such as charge coupled device (CCD) image sensor, MOS image sensor, CMOS image sensor, CPD, EPROM, LED, or OEL. The curable resin composition according to the present invention is also used effectively for a printed circuit plate.

Low-pressure transfer molding is most favorably used in sealing an electronic device with the curable resin composition according to the present invention, but the other method such as injection or compression molding may also be used.

EXAMPLES

Hereinafter, the present invention will be described specifically with reference to Examples, but it should be understood that the scope of the present invention is not limited by the Examples below and various modifications are possible within the scope of the present invention.

Synthesis Examples for Novel Resins

Synthesis Example 1

200 g (1.07 mol) of 2,2'-biphenol (reagent, manufactured by Tokyo Chemical Industry Co., Ltd.) and 215 ml of toluene were placed in a 500-ml separable flask, and the mixture was heated at approximately 100° C., to dissolve the solid component, thereby obtaining a solution. 112 g (0.54 mol) of tetraethoxysilane (LS-2430, manufactured by Shin-Etsu Chemical Co., Ltd.) was added dropwise to the solution kept at approximately 100° C. over approximately 60 minutes, and the mixture was allowed to react approximately for 6 hours. Then, ethanol as the by-product was removed from the reaction system, by azeotropic distillation with toluene used as the solvent.

The reaction solution was left at room temperature overnight, and the precipitated solid matter was filtered and dried, to give 188 g of a solid product.

Figure 2:
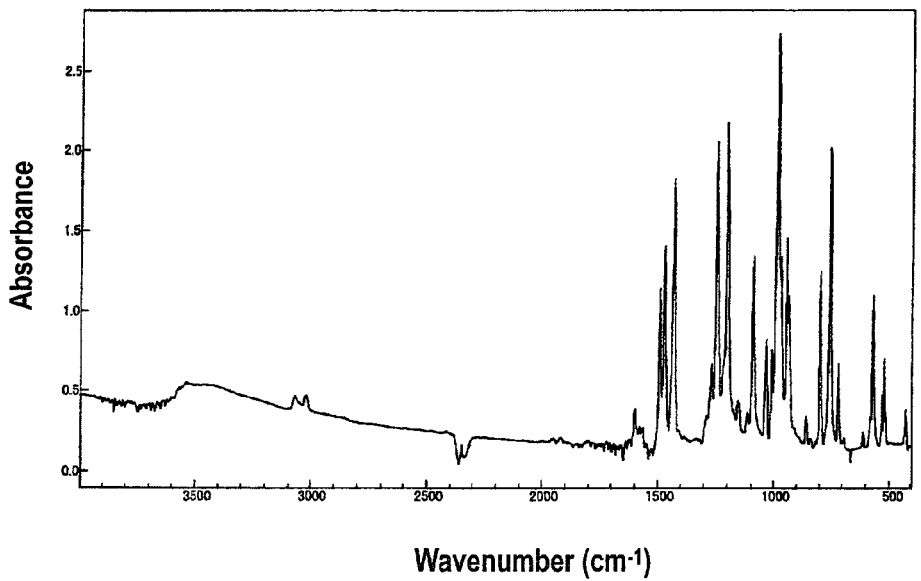
FIG. 2 is an IR spectrum of a curable resin according to the present invention (Synthesis example 1).

The product obtained was analyzed by $^1$H-NMR and IR measurements. The product was hardly soluble, but it may be dissolved in deuterated acetone while decomposing in a trace amount of water contained therein. Results of the $^1$H-NMR measurement of the solution showed neither ethanol nor ethoxy group. Results of IR measurement are shown in FIGS. 1 and 2. FIG. 1 is an IR spectrum of the raw material 2,2'-biphenol, while FIG. 2 is an IR spectrum of the product obtained in the present Example. Results of IR measurement of the product (FIG. 2) showed appearance of a new peak characteristic to Si—OAr at 920 to 970 cm$^{-1}$ and disappearance of the O—H peak of the phenolic hydroxyl group derived from the raw material (see FIG. 1). The results above suggested an assumption that the product had the unit structure shown by the following Formula (XX) and contain a curable resin having the structure represented by the following Formula (XXI).

[Formula 43]

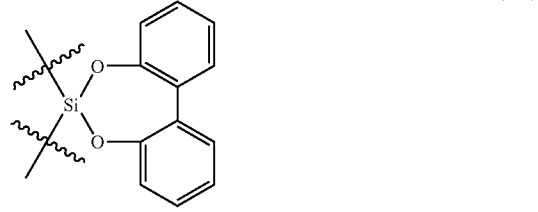

(XX)

[Formula 44]

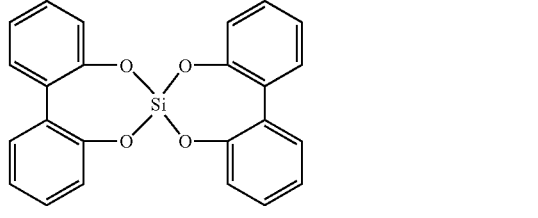

(XXI)

Synthesis Example 2

100 g (0.39 mol) of 2,2'-methylenebis(4-methylphenol) (reagent, manufactured by Tokyo Chemical Industry Co., Ltd.) and 79 ml of toluene were placed in a 300-ml separable flask, and the mixture was heated at 100° C., to dissolve the solid component, thereby obtaining a solution. 41 g (0.20 mol) of tetraethoxysilane (LS-2430, manufactured by Shin-Etsu Chemical Co., Ltd.) was added dropwise to the solution kept at 100° C. over approximately 30 minutes. 0.50 g (0.0014 mol) of an addition reaction product between triphenylphosphine and 1,4-benzoquinone was added to the solution, and the mixture was allowed to react at approximately 120 to 130° C. for 24 hours. Then, ethanol as the by-product was removed from the reaction system, by azeotropic distillation with toluene as the solvent. The reaction solution was left at room temperature overnight, and 100 ml of toluene was added thereto, and the solid matter was filtered, washed with toluene, and then dried, to give 49.4 g of a solid product.

Figure 3:
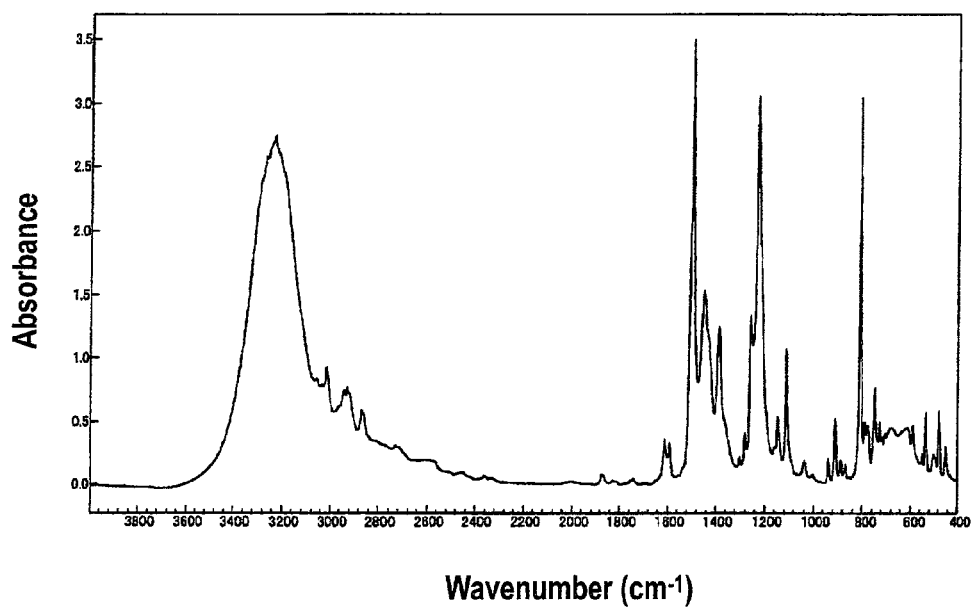
FIG. 3 is an IR spectrum of 2,2'-methylene bis(4-methylphenol) used in a Synthesis example of the curable resin according to the present invention.
Figure 4:
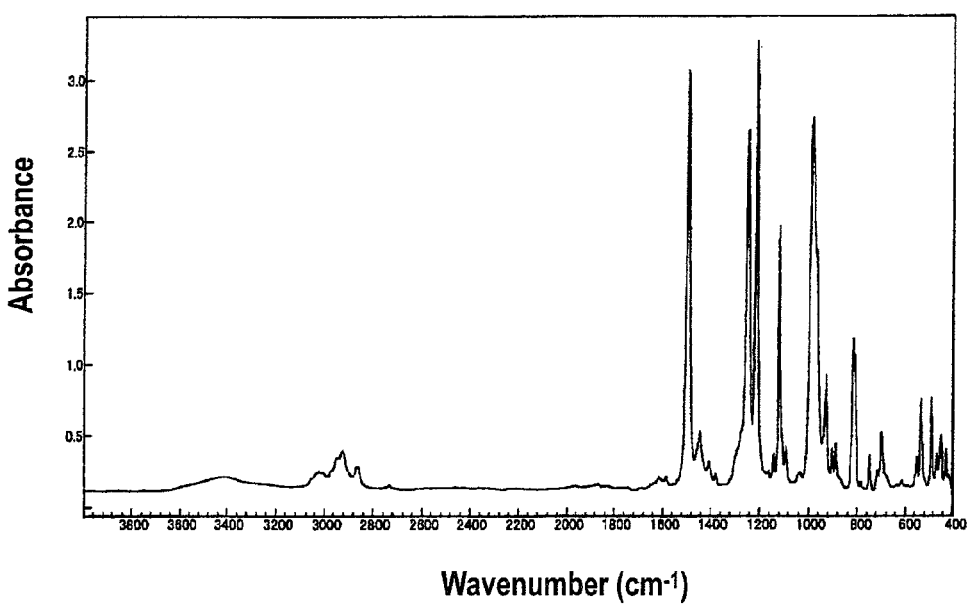
FIG. 4 is an IR spectrum of a curable resin according to the present invention (Synthesis example 2).

The product obtained was analyzed by $^1$H-NMR and IR measurements. The product was hardly soluble, but it may be dissolved in deuterated acetone while decomposing in a trace amount of water contained therein. Results of the $^1$H-NMR measurement of the solution showed neither ethanol nor ethoxy group. Results of IR measurement are shown in FIGS. 3 and 4. FIG. 3 is an IR spectrum of the raw material 2,2'-methylene bis(4-methylphenol), while FIG. 4 is an IR spectrum of the product obtained in the present Example. Results of IR measurement of the product (FIG. 4) showed appearance of a new peak characteristic to Si—OAr at 920 to 970 cm$^{-1}$ and disappearance of the O—H peak of the phenolic hydroxyl group derived from the raw material (see FIG. 3). The results above suggested an assumption that the product had the unit structure shown by the following Formula (XXII) and contained a curable resin having the structure represented by the following Formula (XXIII).

[Formula 45]

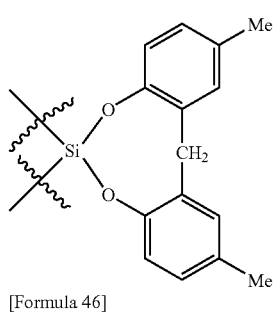

[Formula 46]

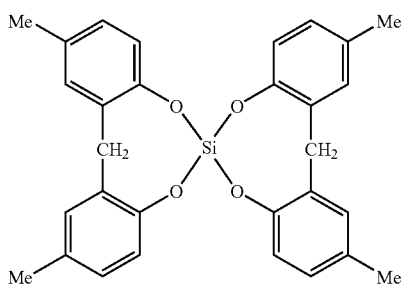

Synthesis Example 3

119 g (0.64 mol) of 2,2'-biphenol (reagent, manufactured by Tokyo Chemical Industry Co., Ltd.) and 319 ml of toluene were placed in a 500-ml separable flask, and the mixture was heated at approximately 100° C., to dissolve the solid component, thereby obtaining a solution. 30 g of a partial condensate of tetramethoxysilane (M silicate 51, manufactured by Tama Chemicals Co., Ltd.) was added dropwise to the solution kept at approximately 100° C. over approximately 30 minute, and the mixture was allowed to react for approximately 7 hours. Then, the by-product methanol was removed from the reaction system, by azeotropic distillation with toluene as the solvent. The reaction solution was left at room temperature overnight, and the precipitated solid matter was filtered and dried, to give 69 g of a solid product.

Figure 5:
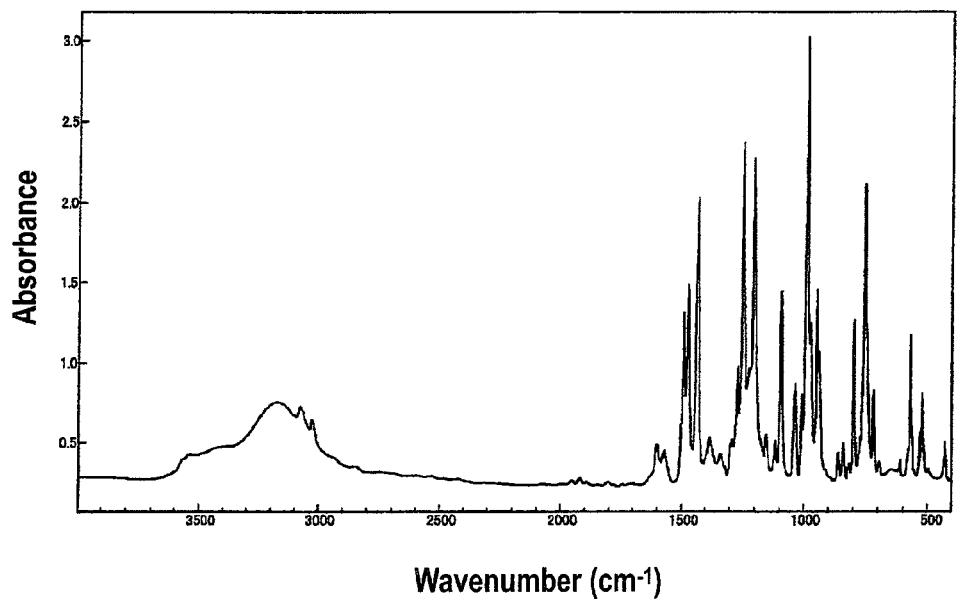
FIG. 5 is an IR spectrum of a curable resin according to the present invention (Synthesis example 3).

The product obtained was analyzed by $^1$H-NMR and IR measurements. The product was hardly soluble, but it may be dissolved in deuterated acetone while decomposing in a trace amount of water contained therein. Results of the $^1$H-NMR measurement of the solution showed neither methanol nor methoxy group. Results of IR measurement are shown in FIG. 5. Results in FIG. 5 showed appearance of a new peak characteristic to Si—OAr at 920 to 970 cm$^{-1}$ and decrease of the O—H peak of the phenolic hydroxyl group derived from the raw material (see FIG. 1). The results above suggested an assumption that the product contained a curable resin having the structural units represented by the following Formula (XX) and/or the following Formula (XXIV).

[Formula 47]

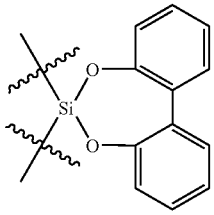

[Formula 48]

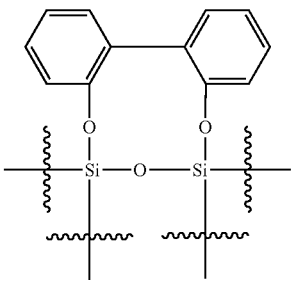

Synthesis Example 4

150 g (0.81 mol) of purified 2,2'-biphenol and 230 ml of toluene were placed in a 300-ml separable flask, and the mixture was heated at approximately 100° C., to dissolve the solid component, thereby obtaining a solution. 54 g of a partial condensate of tetramethoxysilane (M silicate 51, manufactured by Tama Chemicals Co., Ltd.) was added dropwise to the solution kept at 100° C. over approximately 30 minutes. 0.75 g (0.0020 mol) of an addition reaction product between triphenylphosphine and 1,4-benzoquinone was added to the solution, and the mixture was allowed to react at 110° C. for 6 hours. Then, the by-product methanol was removed from the reaction system, by azeotropic distillation with toluene as the solvent. The reaction solution was left at room temperature overnight, and the precipitated solid matter was filtered and dried, to give 90 g of a solid product.

Figure 6:
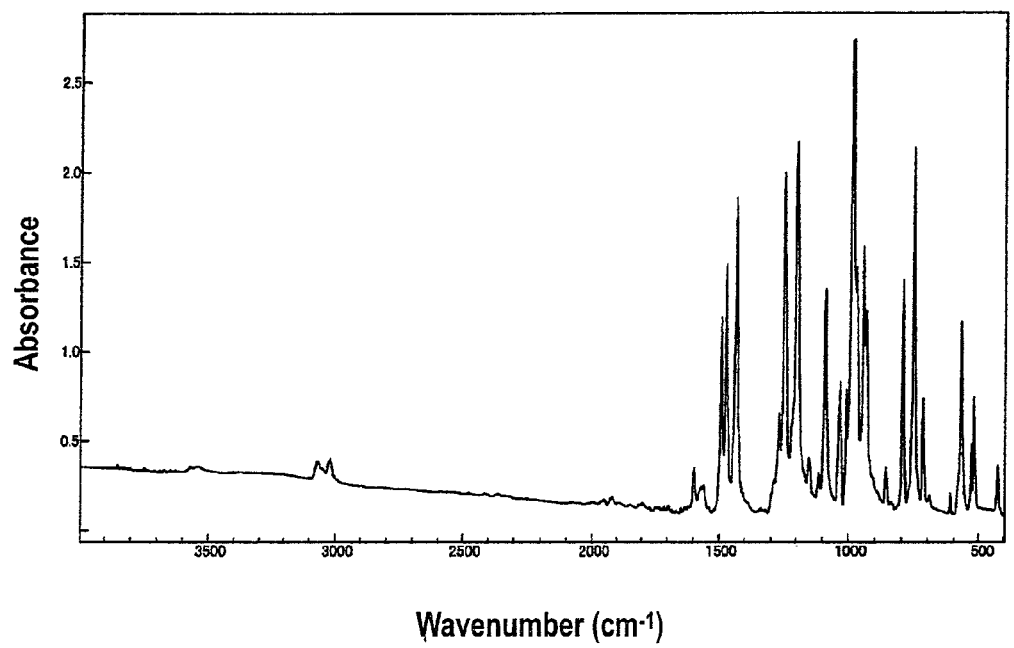
FIG. 6 is an IR spectrum of a curable resin according to the present invention (Synthesis example 4).

The product obtained was analyzed by $^1$H-NMR and IR measurements. The product was hardly soluble, but it may be dissolved in deuterated acetone while decomposing in a trace amount of water contained therein. Results of the $^1$H-NMR measurement of the solution showed neither methanol nor methoxy group. Results of IR measurement of the product are summarized in FIG. 6. Results in FIG. 6 showed appearance of a new peak characteristic to Si—OAr at 920 to 970 cm$^{-1}$ and disappearance of the O—H peak of the phenolic hydroxyl group derived from the raw material (see FIG. 1). The results above suggested an assumption that the product contained a curable resin having the structural units represented by the following Formula (XX) and/or the following Formula (XXIV).

Synthesis Example 5

150 g (0.81 mol) of purified 2,2'-biphenol and 268 ml of toluene were placed in a 300-ml separable flask, and the mixture was heated at 100° C., to dissolve the solid component, thereby obtaining a solution. 63 g of a partial condensate of tetramethoxysilane (M silicate 51, manufactured by Tama Chemicals Co., Ltd.) was added dropwise to the solution kept at 100° C. over approximately 30 minutes. 0.75 g (0.0020 mol) of an addition reaction product between triphenylphosphine and 1,4-benzoquinone was added to the solution, and the mixture was allowed to react at approximately 110° C. for 10 hours. Then, the by-product methanol was removed from the reaction system, by azeotropic distillation with toluene as the solvent. The reaction solution was left at room temperature overnight, and precipitated solid matter was filtered and dried, to give 110 g of a solid product.

Figure 7:
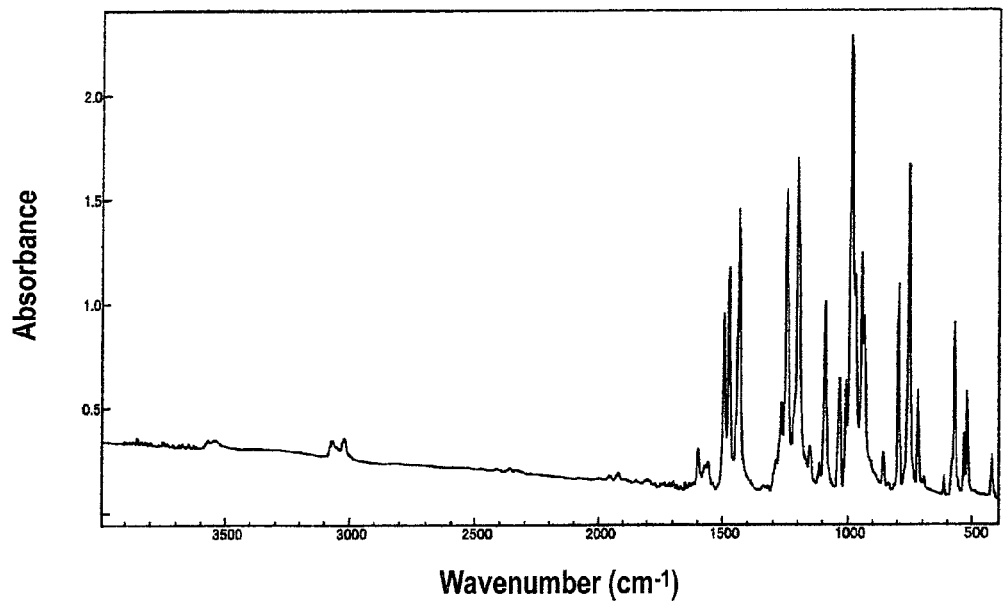
FIG. 7 is an IR spectrum of a curable resin according to the present invention (Synthesis example 5).

The product obtained was analyzed by $^1$H-NMR and IR measurements. The product was hardly soluble, but it may be dissolved in deuterated acetone while decomposing in a trace amount of water contained therein. Results of the $^1$H-NMR measurement of the solution showed neither methanol nor methoxy group. Results of IR measurement are shown in FIG. 7. Results in FIG. 7 showed appearance of a new peak characteristic to Si—OAr at 920 to 970 cm$^{-1}$ and disappearance of the O—H peak of the phenolic hydroxyl group derived from the raw material (see FIG. 1). The results above suggested an assumption that the product contained a curable resin having the structural units represented by the following Formula (XX) and/or the following Formula (XXIV).

Synthesis Example 6

150 g (0.81 mol) of purified 2,2'-biphenol and 322 ml of toluene were placed in a 300-ml separable flask, and the mixture was heated at 100° C., to dissolve the solid component, thereby obtaining a solution. 76 g of a partial condensate of tetramethoxysilane (M silicate 51, manufactured by Tama Chemicals Co., Ltd.) was added dropwise to the solution kept at 100° C. over approximately 30 minutes. 0.75 g (0.0020 mol) of an addition reaction product between triphenylphosphine and 1,4-benzoquinone was added to the solution, and the mixture was allowed to react at 110° C. for 10 hours. Then, the by-product methanol was removed from the reaction system, by azeotropic distillation with toluene as the solvent. The reaction solution was left at room temperature overnight, and precipitated solid matter was filtered and dried, to give 118 g of a solid product.

Figure 8:
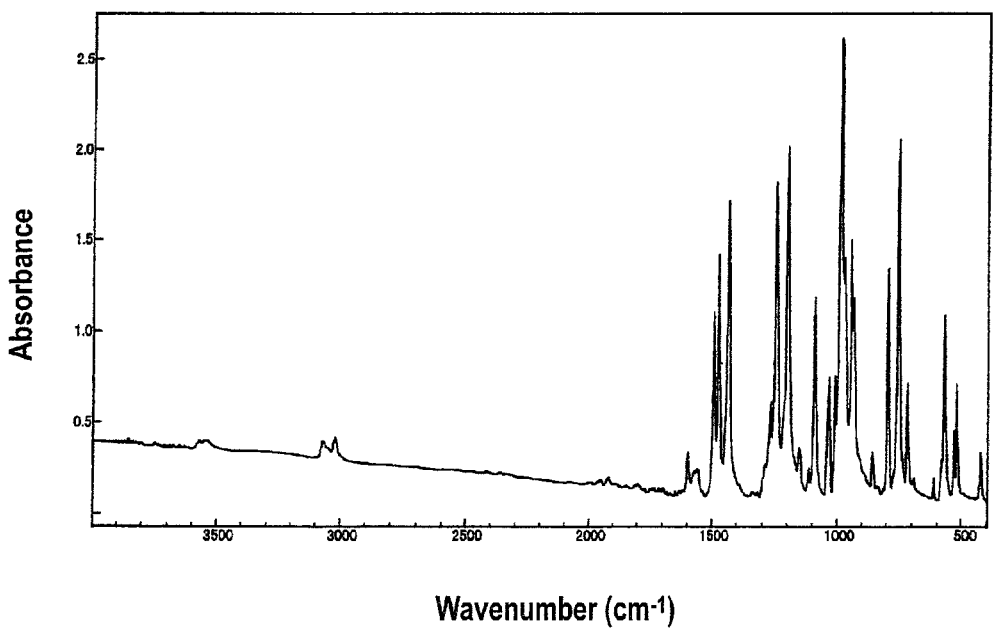
FIG. 8 is an IR spectrum of a curable resin according to the present invention (Synthesis example 6).

The product obtained was analyzed by $^1$H-NMR and IR measurements. The product was hardly soluble, but it may be dissolved in deuterated acetone while decomposing in a trace amount of water contained therein. Results of the $^1$H-NMR measurement of the solution showed neither methanol nor methoxy group. Results of IR measurement are shown in FIG. 8. Results in FIG. 8 showed appearance of a new peak characteristic to Si—OAr at 920 to 970 cm$^{-1}$ and disappearance of the O—H peak of the phenolic hydroxyl group derived from the raw material (see FIG. 1). The results above suggested an assumption that the product contained a curable resin having the structural units represented by the following Formula (XX) and/or the following Formula (XXIV).

Synthesis Example 7

180 g (0.79 mol) of 2,2'-methylene bis(4-methylphenol) (reagent, manufactured by Tokyo Chemical Industry Co., Ltd.) and 194 ml of toluene were placed in a 500-ml separable flask, and the mixture was heated at 100° C., to dissolve the solid component, thereby obtaining a solution. 46 g of a partial condensate of tetramethoxysilane (M silicate 51, manufactured by Tama Chemicals Co., Ltd.) was added dropwise to the solution kept at 100° C. over approximately 30 minutes. 0.90 g (0.0024 mol) of an addition reaction product between triphenylphosphine and 1,4-benzoquinone was added additionally to the solution, and the mixture was allowed to react at 120 to 130° C. for 20 hours. Then, the by-product methanol was removed from the reaction system, by azeotropic distillation with toluene as the solvent. After reaction, toluene was removed from the reaction solution under reduced pressure at approximately 80° C. by using an aspirator, and then, the residue was transferred into a Teflon (registered tradename)-coated metal container and cooled to room temperature, to give 168 g of a solid product.

Figure 9:
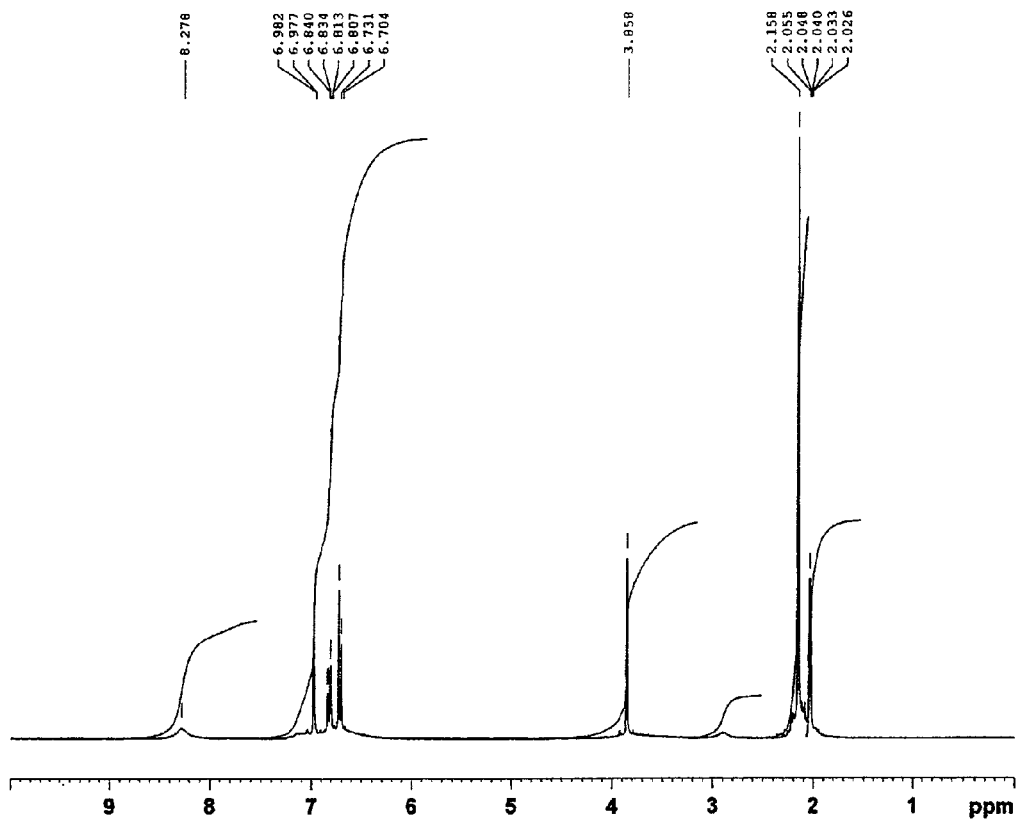
FIG. 9 is $^1$H-NMR spectrum of a curable resin according to the present invention (Synthesis example 7).
Figure 10:
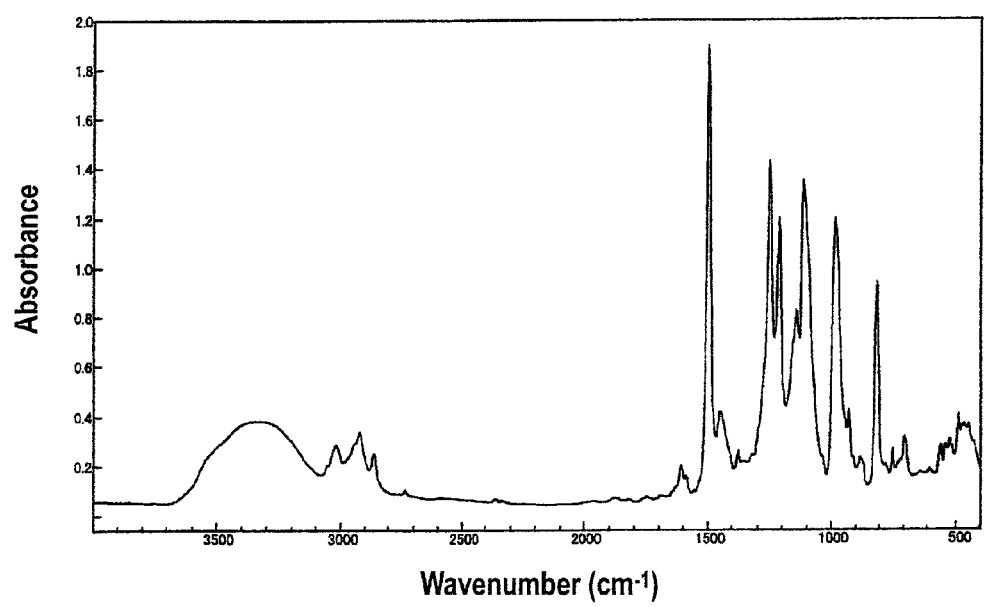
FIG. 10 is an IR spectrum of a curable resin according to the present invention (Synthesis example 7).

The product obtained was analyzed by $^1$H-NMR and IR measurements. $^1$H-NMR measurement of the product (FIG. 9) showed neither methoxy group- nor by-product methanol-derived signal. Results of IR measurement are shown in FIG. 10. Results in FIG. 10 showed appearance of a new peak characteristic to Si—OAr at 920 to 970 cm$^{-1}$ and decrease of the O—H peak of the phenolic hydroxyl group derived from the raw material (see FIG. 3).

The results above suggested an assumption that the product contained a curable resin having the structural units represented by the following Formula (XXII) and/or the following Formula (XXV).

[Formula 49]

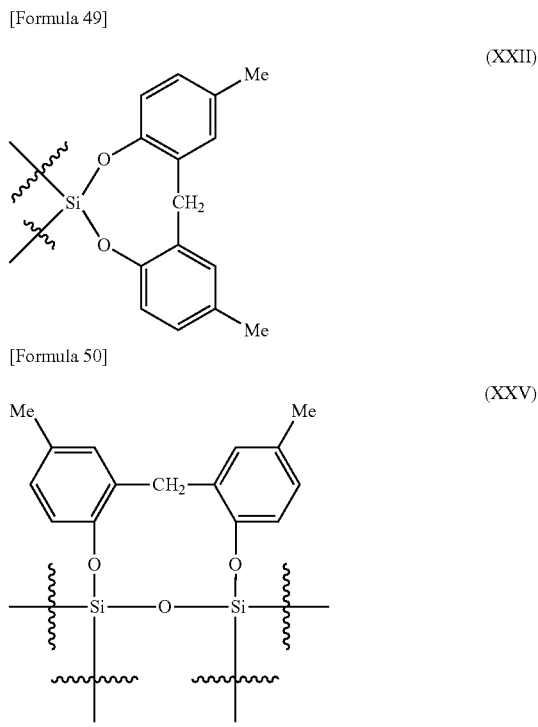

[Formula 50]

Synthesis Example 8

156 g (0.84 mol) of 2,2'-biphenol (reagent, manufactured by Tokyo Chemical Industry Co., Ltd.) and 159 ml of toluene were placed in a 300-ml separable flask, and the mixture was heated at 100° C., to dissolve the solid component, thereby obtaining a solution. 95 g of 1,3-dimethyltetramethoxydisiloxane (reagent, available from AZmax Co.) was added dropwise to the solution kept at approximately 100° C. over approximately 90 minute, and the mixture was allowed to react at approximately 110° C. for 5 hours. Then, the by-product methanol was removed from the reaction system, by azeotropic distillation with toluene as the solvent. After reaction, toluene was removed from the reaction solution under reduced pressure at approximately 80° C. by using an aspirator, and then, the residue was transferred into a Teflon (registered tradename)-coated metal container and cooled to room temperature, to give 182 g of a solid product.

Figure 11:
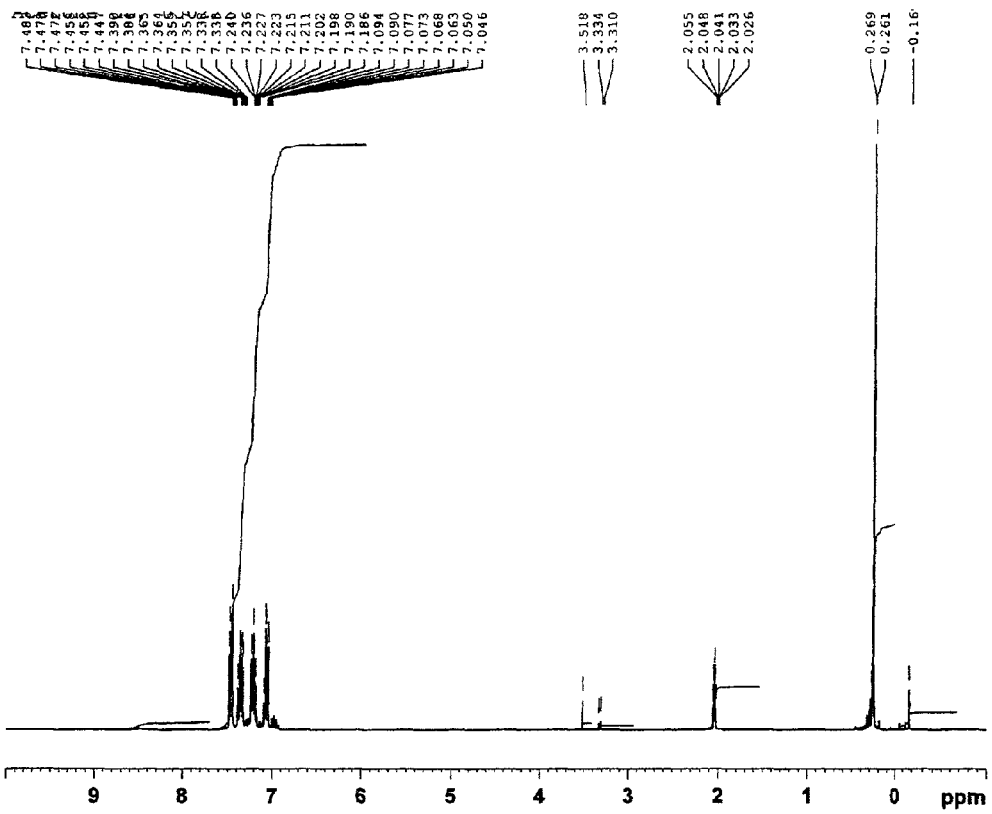
FIG. 11 is $^1$H-NMR spectrum of a curable resin according to the present invention (Synthesis example 8).
Figure 12:
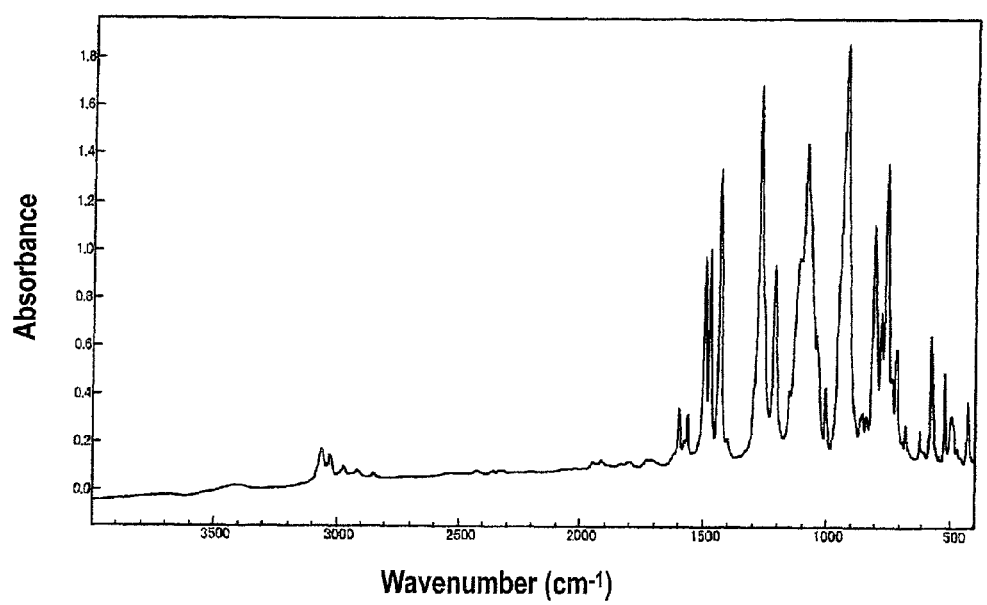
FIG. 12 is an IR spectrum of a curable resin according to the present invention (Synthesis example 8).

The product obtained was analyzed by $^1$H-NMR and IR measurements. Result of $^1$H-NMR measurement of the product (FIG. 11) showed presence of a signal derived from the methoxy group of the raw material 1,3-dimethyltetramethoxydisiloxane at an intensity of 0.9% with respect to that before reaction. Results of IR measurement are shown in FIG. 12. Result in FIG. 12 showed appearance of a new peak characteristic to Si—OAr at 920 to 970 cm$^{-1}$ and disappearance of the O—H peak of the phenolic hydroxyl group derived from the raw material (see FIG. 1). The results above suggested an assumption that the product contained a curable resin having the structural unit represented by Formula (XX).

Synthesis Example 9

155 g (0.83 mol) of 2,2'-biphenol (reagent, manufactured by Tokyo Chemical Industry Co., Ltd.) and 222 ml of toluene were placed in a 300-ml separable flask, and the mixture was heated at 100° C., to obtain a uniform solution. 110 g (0.55 mol) of phenyltrimethoxysilane (AY43-040, manufactured by Dow Corning Toray) was added dropwise to the solution kept at 100° C. over approximately 60 minutes, and the mixture was allowed to react at approximately 120 to 130° C. for 42 hours. Then, the by-product methanol was removed from the reaction system, by azeotropic distillation with toluene as the solvent. After reaction, toluene was removed from the reaction solution under reduced pressure at approximately 80° C. by using an aspirator, and then, the residue was transferred into a Teflon (registered tradename)-coated metal container and cooled to room temperature, to give 197 g of a solid product.

Figure 13:
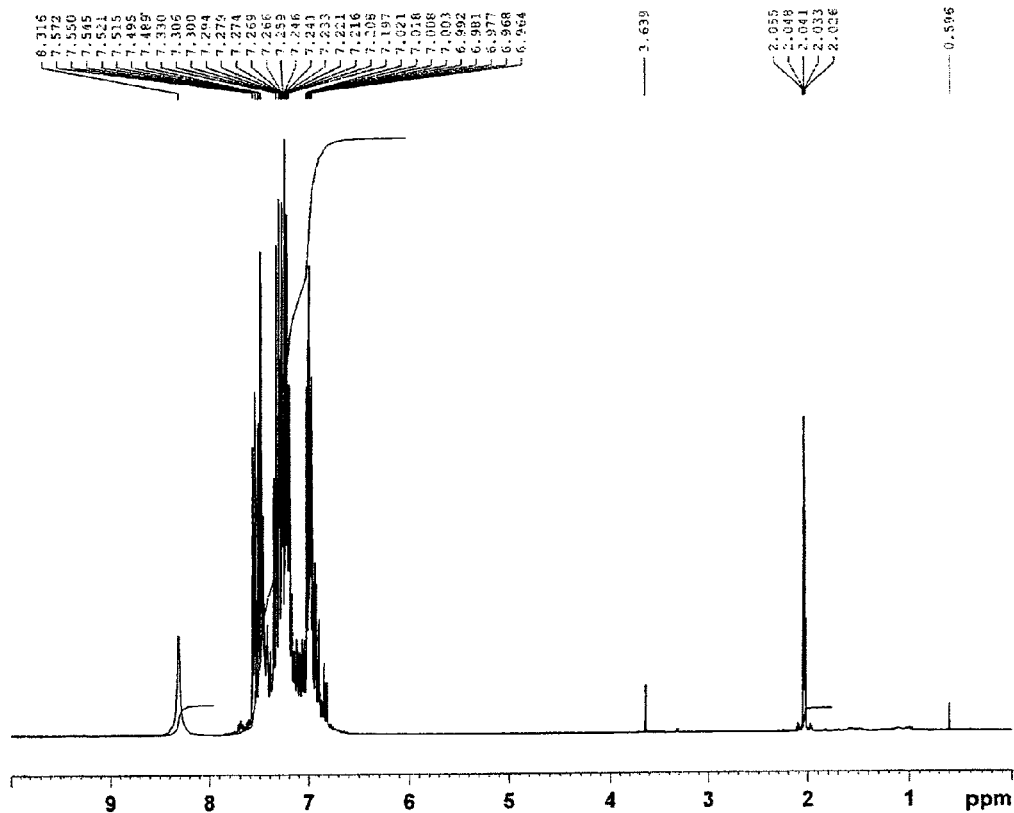
FIG. 13 is $^1$H-NMR spectrum of a curable resin according to the present invention (Synthesis example 9).
Figure 14:
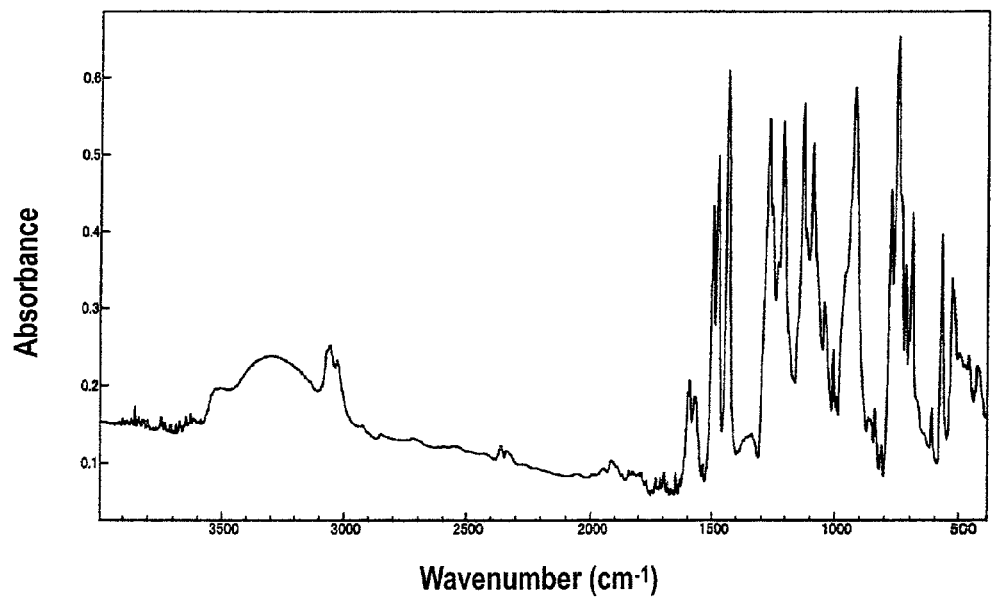
FIG. 14 is an IR spectrum of a curable resin according to the present invention (Synthesis example 9).

The product obtained was analyzed by $^1$H-NMR and IR measurements. Result of $^1$H-NMR measurement of the product (FIG. 13) showed presence of a signal derived from the methoxy group of the raw material phenyltrimethoxysilane at an intensity of 0.6% with respect to that before reaction. Results of IR measurement are shown in FIG. 14. Results in FIG. 14 showed appearance of a new peak characteristic to Si—OAr at 920 to 970 cm$^{-1}$ and decrease of the O—H peak of the phenolic hydroxyl group derived from the raw material (see FIG. 1). The results above suggested an assumption that the product contained a curable resin having the structural unit represented by the following Formula (XX).

Synthesis Example 10

195 g (1.05 mol) of 2,2'-biphenol (reagent, manufactured by Tokyo Chemical Industry Co., Ltd.) and 161 ml of toluene were placed in a 500-ml separable flask, and the mixture was heated at 100° C., to obtain a uniform solution. 95 g (0.40 mol) of 3-glycidoxypropyltrimethoxysilane (AY43-026, manufactured by Dow Corning Toray) was added dropwise to the solution kept at 100° C. over approximately 50 minutes, and the mixture was allowed to react at approximately 110 to 120° C. for 4 hours. Then, the by-product methanol was removed from the reaction system, by azeotropic distillation with toluene as the solvent. After reaction, toluene was removed from the reaction solution under reduced pressure at approximately 80° C. by using an aspirator, and then, the residue was transferred into a Teflon (registered tradename)-coated metal container and cooled to room temperature, to give 195 g of a solid product.

Figure 15:
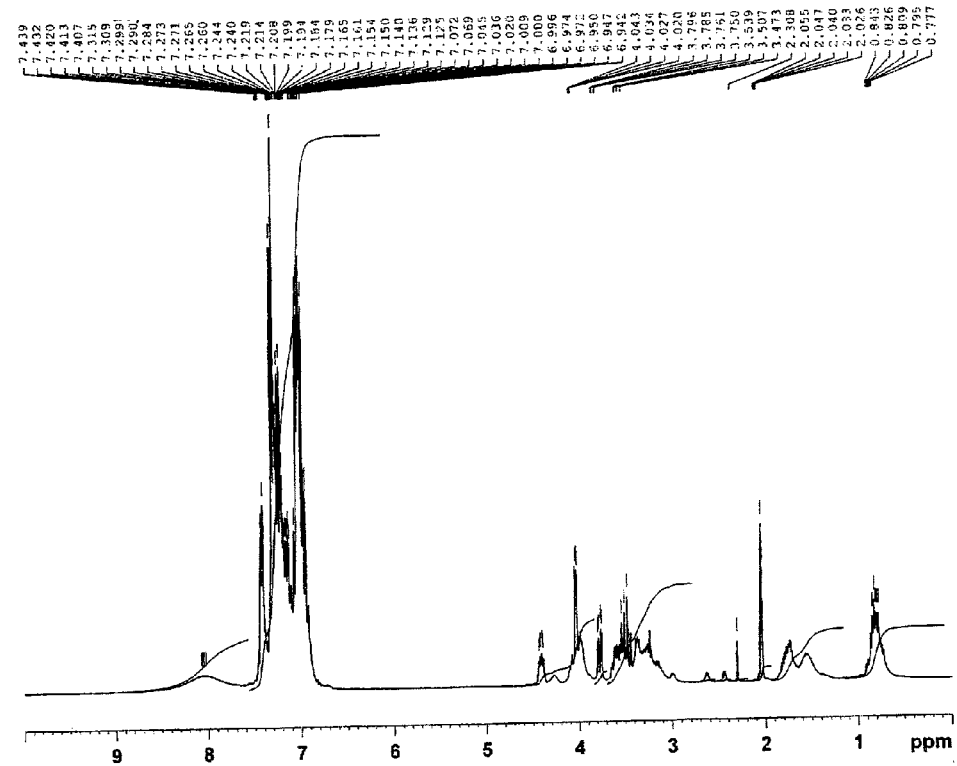
FIG. 15 is $^1$H-NMR spectrum of a curable resin according to the present invention (Synthesis example 10).
Figure 16:
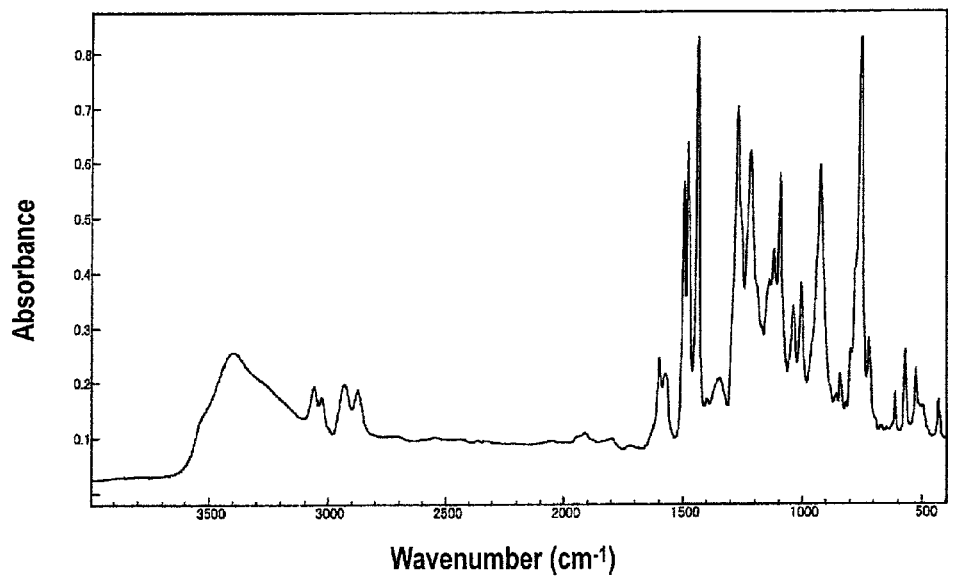
FIG. 16 is an IR spectrum of a curable resin according to the present invention (Synthesis example 10).

The product obtained was analyzed by $^1$H-NMR and IR measurements. Results of $^1$H-NMR measurement of the product (FIG. 15) showed no signal derived from the methoxy group of the raw material 3-glycidoxypropyltrimethoxysilane. Results of IR measurement are shown in FIG. 16. Results in FIG. 16 showed appearance of a new peak characteristic to Si—OAr at 920 to 970 cm$^{-1}$ and decrease of the O—H peak of the phenolic hydroxyl group derived from the raw material (see FIG. 1). The results above suggested an assumption that the product contained a curable resin having the structural unit represented by the following Formula (XX).

Synthesis Example 11

100 g (0.54 mol) of 2,2-biphenol (reagent, manufactured by Tokyo Chemical Industry Co., Ltd.) and 215 ml of toluene were placed in a 500-ml separable flask, and the mixture was heated to 100° C., to obtain a uniform solution. 131 g (0.54 mol) of diphenyldimethoxysilane (AZ-6183, manufactured by Dow Corning Toray) was added dropwise to the solution kept at 100° C. over approximately 75 minute, and the mixture was allowed to react at approximately 100 to 110° C. for 12 hours. Then, the by-product methanol was removed from the reaction system, by azeotropic distillation with toluene as the solvent. The reaction solution was left at room temperature overnight, and the precipitated solid matter was filtered and dried, to give 164 g of a solid product.

Figure 17:
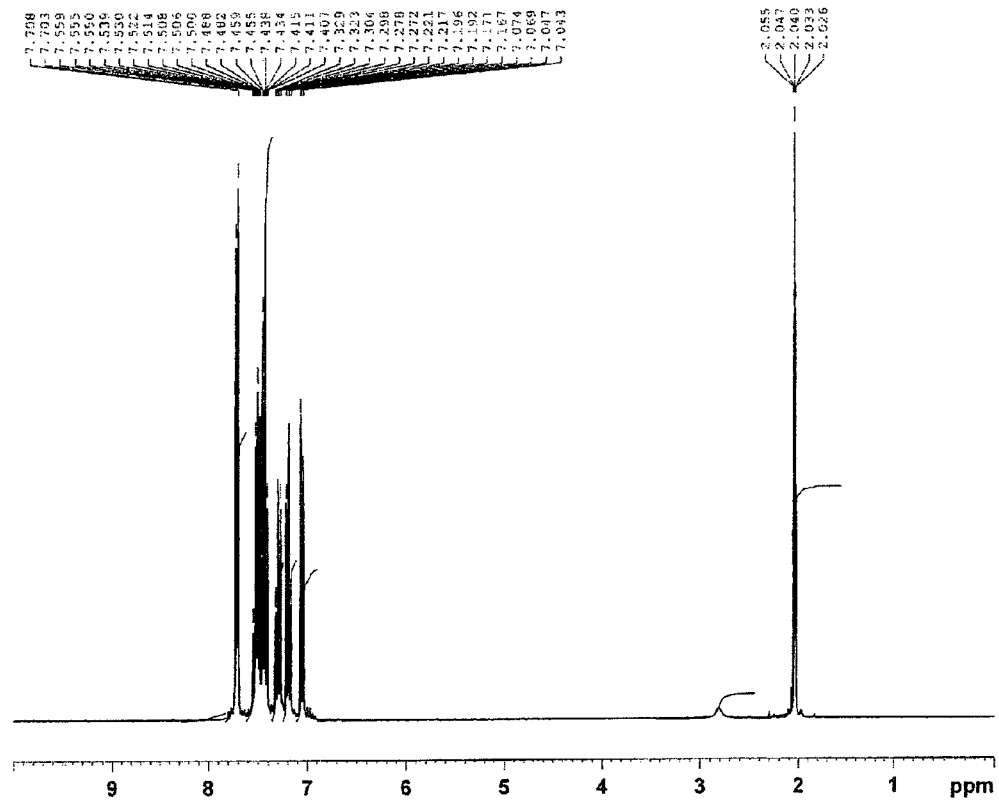
FIG. 17 is $^1$H-NMR spectrum of a curable resin according to the present invention (Synthesis example 11).
Figure 18:
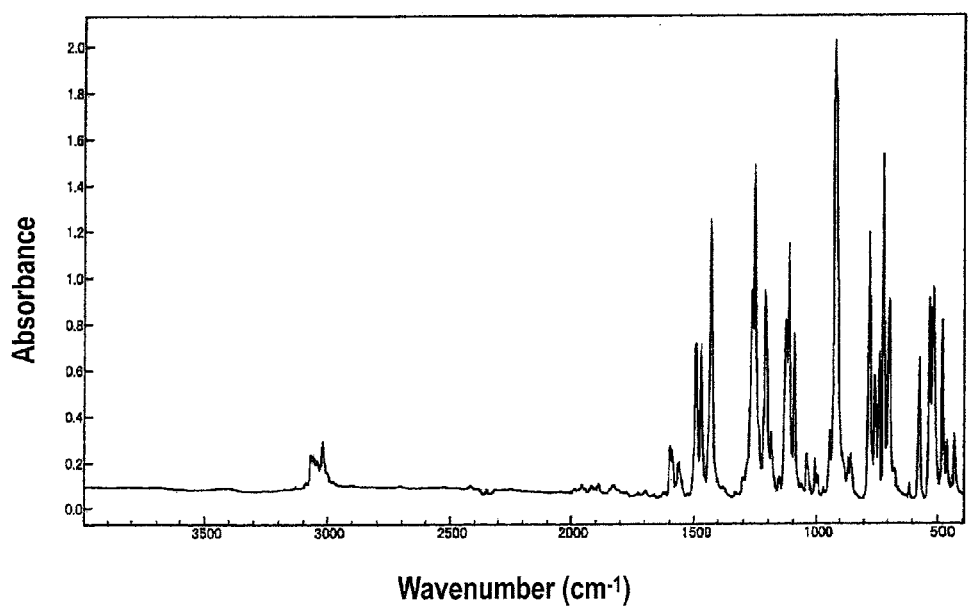
FIG. 18 is an IR spectrum of a curable resin according to the present invention (Synthesis example 11).

The product obtained was analyzed by $^1$H-NMR and IR measurements. Results of $^1$H-NMR measurement of the product (FIG. 17) showed neither signal derived from the methoxy group of the raw material diphenyldimethoxysilane nor signal derived from the by-product methanol. Results of IR measurement are shown in FIG. 18. Results in FIG. 18 showed appearance of a new peak characteristic to Si—OAr at 920 to 970 cm$^{-1}$ and disappearance of the O—H peak of the phenolic hydroxyl group derived from the raw material (see FIG. 1). The results above showed that the product had the unit structure represented by Formula (XX) and contained a curable resin having the structure represented by the following Formula (XXVI).

[Formula 51]

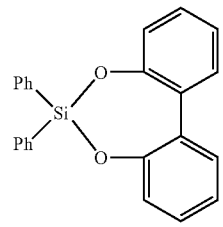

(XXVI)

Synthesis Example 12

Figure 19:
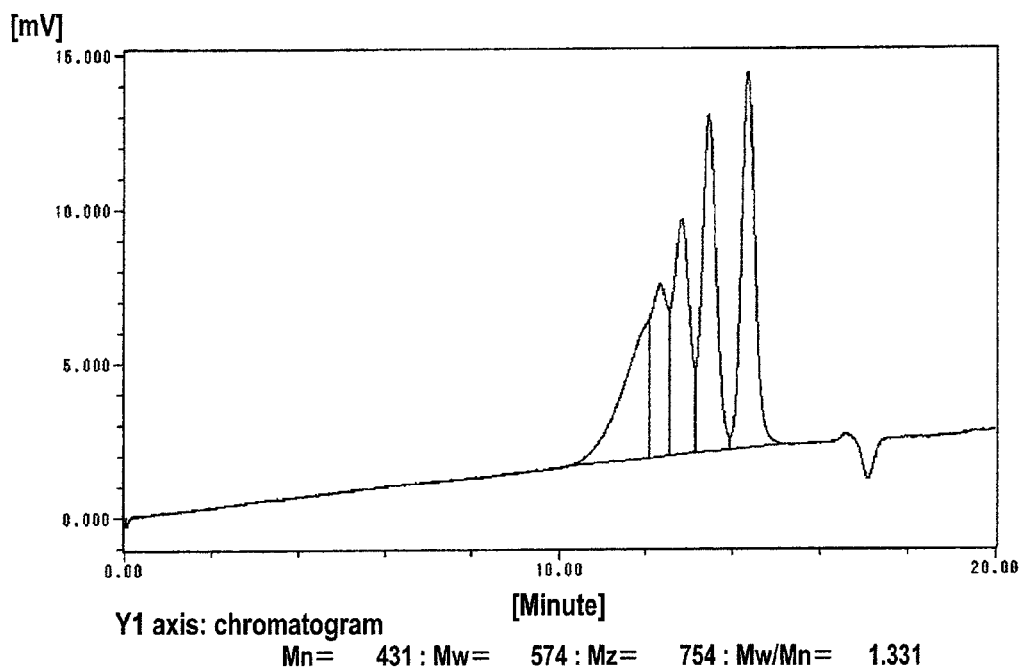
FIG. 19 is a GPC chart of a para-cresol novolak having a hydroxyl equivalent of 116 and a softening point of 88° C. (pCr novolac, sample manufactured by Meiwa Plastic Industries, Ltd.).

107 g of a para-cresol novolak having a hydroxyl equivalent of 116 and a softening point of 88° C. (pCr novolac, sample from Meiwa Plastic Industries, Ltd., molecular weight distribution shown by the GPC chart in FIG. 19) and 140 ml of toluene were placed in a 300-ml separable flask, and the mixture was heated at 100° C., to dissolve the solid component, thereby obtaining a solution. 1.50 g (0.0040 mol) of an addition reaction product between triphenylphosphine and 1,4-benzoquinone was added dropwise to the solution kept at approximately 100° C.; 46.6 g (0.224 mol) of tetraethoxysilane (manufactured by Shin-Etsu Chemical Co., Ltd.

LS-2430) was added dropwise additionally over approximately 20 minutes; and the mixture was allowed to react at 130° C. for 37 hours. Then, the by-product ethanol was removed from the reaction system, by azeotropic distillation with toluene as the solvent. After reaction, toluene was removed from the reaction solution under reduced pressure at approximately 80° C. by using an aspirator, and then the residue was dried at 80° C. under vacuum, to give 109 g of a solid product.

Figure 20:
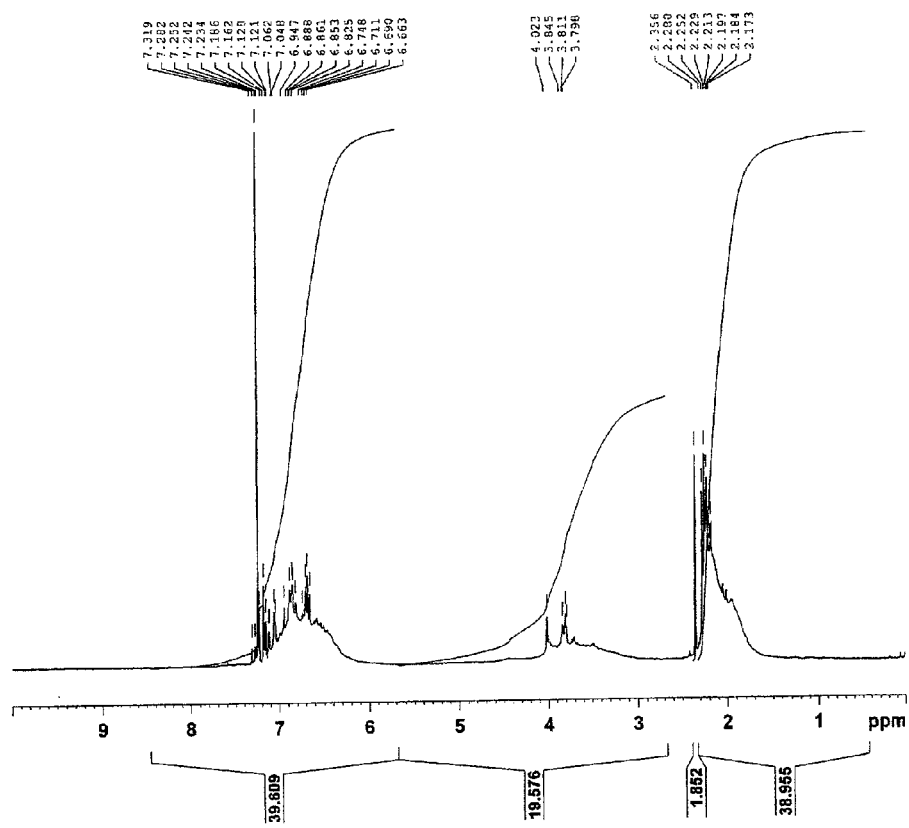
FIG. 20 is $^1$H-NMR spectrum of a curable resin according to the present invention (Synthesis example 12).
Figure 21:
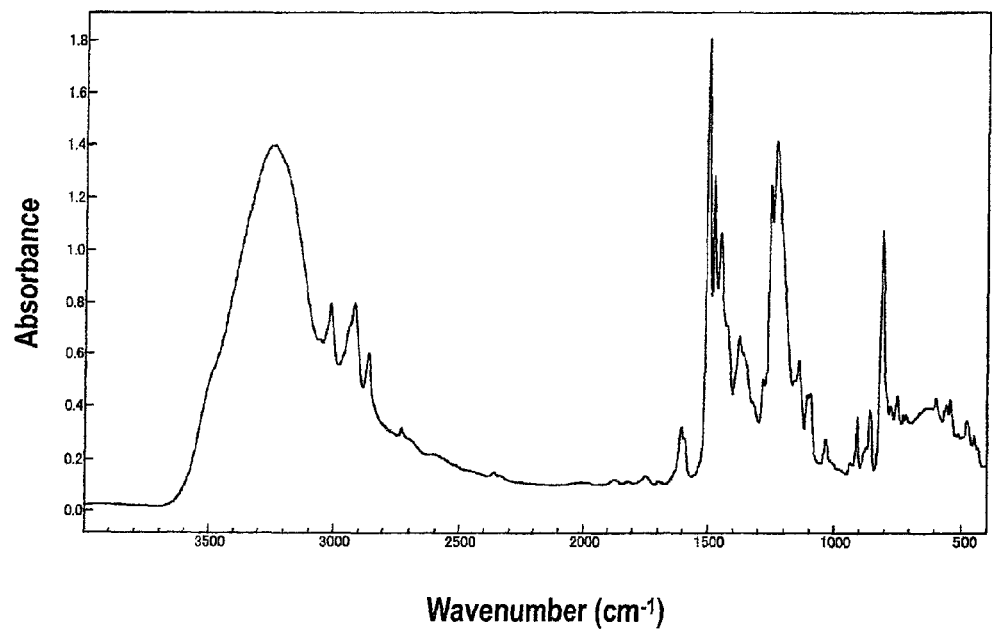
FIG. 21 is an IR spectrum of a para-cresol novolak having a hydroxyl equivalent of 116 and a softening point of 88° C. (pCr novolac, sample manufactured by Meiwa Plastic Industries, Ltd.).
Figure 22:
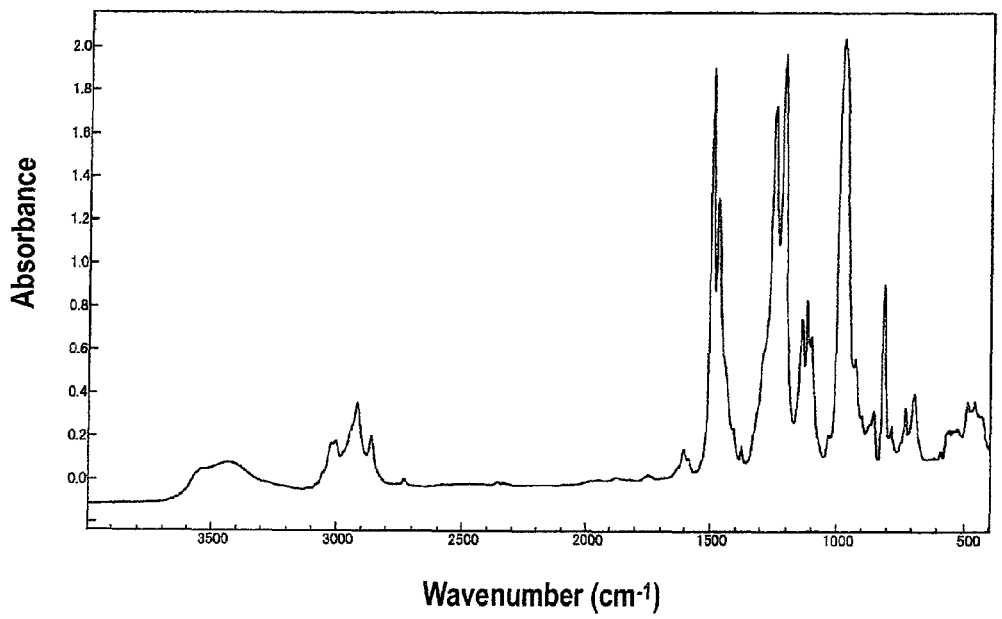
FIG. 22 is an IR spectrum of a curable resin according to the present invention (Synthesis example 12).

The product obtained was analyzed by $^1$H-NMR and IR measurements. Results of $^1$H-NMR measurement of the product (FIG. 20) showed neither signal derived from the ethoxy group of the raw material tetraethoxysilane nor signal derived from ethanol as the by-product. Results of IR measurement are shown in FIGS. 21 and 22. FIG. 21 is an IR spectrum of the raw material 2,2'-biphenol, while FIG. 22 is an IR spectrum of the product obtained in the present Example. Results of IR measurement of the product (FIG. 22) showed appearance of a peak characteristic to Si—OAr at 920 to 970 cm$^{-1}$ and decrease of the peak of O—H of the phenolic hydroxyl group derived from the raw material. The results above suggested an assumption that the product contained a curable resin having the structural units represented by the following Formula (XXVII) and/or (XXVIII).

[Formula 52]

(XXVII)

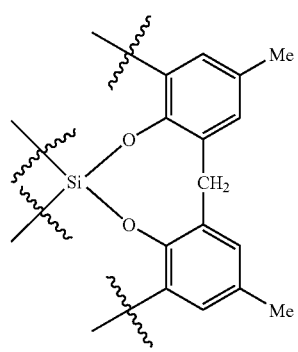

[Formula 53]

(XXVIII)

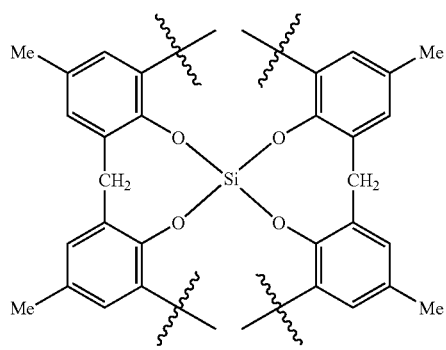

Synthesis Example 13

100 g of a para-cresol novolak having a hydroxyl equivalent of 116 and a softening point of 88° C. (pCr novolac, sample from Meiwa Plastic Industries, Ltd., molecular weight distribution shown by the GPC chart in FIG. 19) and 140 ml of toluene were placed in a 300-ml separable flask, and the mixture was heated at 100° C., to dissolve the solid component, thereby obtaining a solution. 1.50 g (0.0040 mol) of an addition reaction product between triphenylphosphine and 1,4-benzoquinone was added to the solution kept at approximately 100° C.; 37.4 g (0.180 mol) of tetraethoxysilane (manufactured by Shin-Etsu Chemical Co., Ltd. LS-2430) was added dropwise additionally over approximately 20 minute; and the mixture was allowed to react at 130° C. for 16 hours. Then, ethanol as the by-product was removed from the reaction system, by azeotropic distillation with toluene as the solvent. After reaction, toluene was removed from the reaction solution under reduced pressure at approximately 80° C. by using an aspirator, and then the residue was dried at 80° C. under vacuum, to give 99 g of a solid product.

Figure 23:
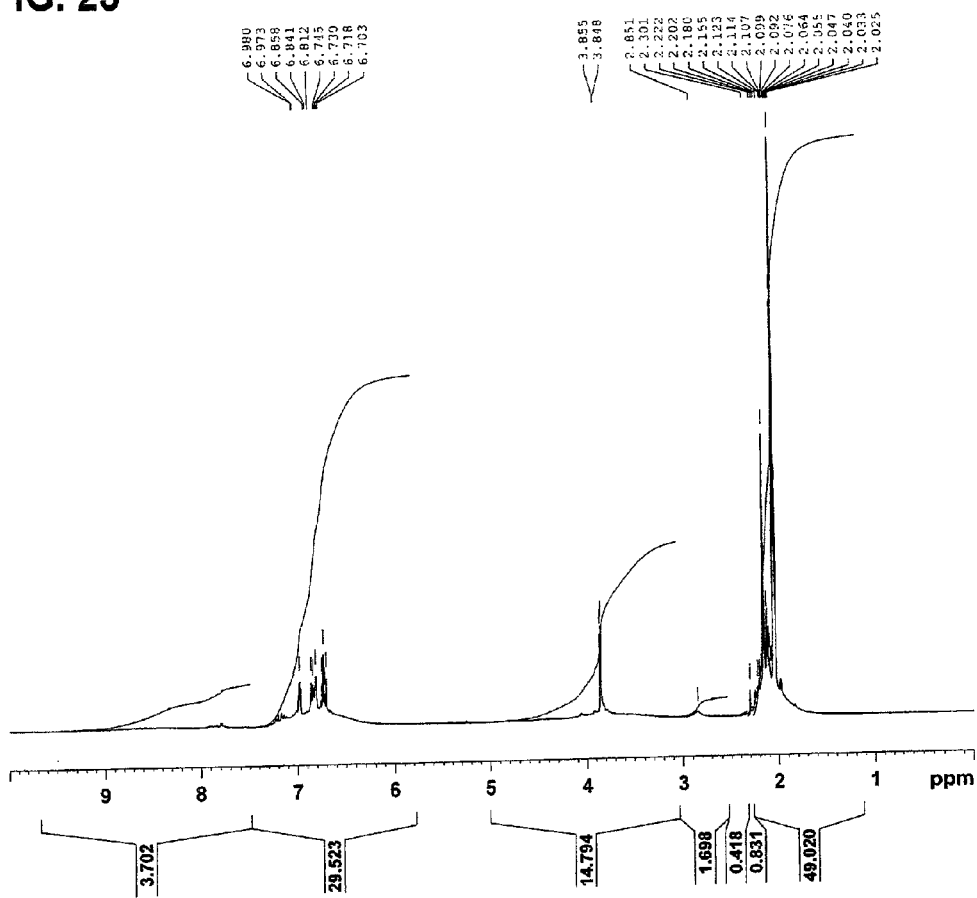
FIG. 23 is $^1$H-NMR spectrum of a curable resin according to the present invention (Synthesis example 13).
Figure 24:
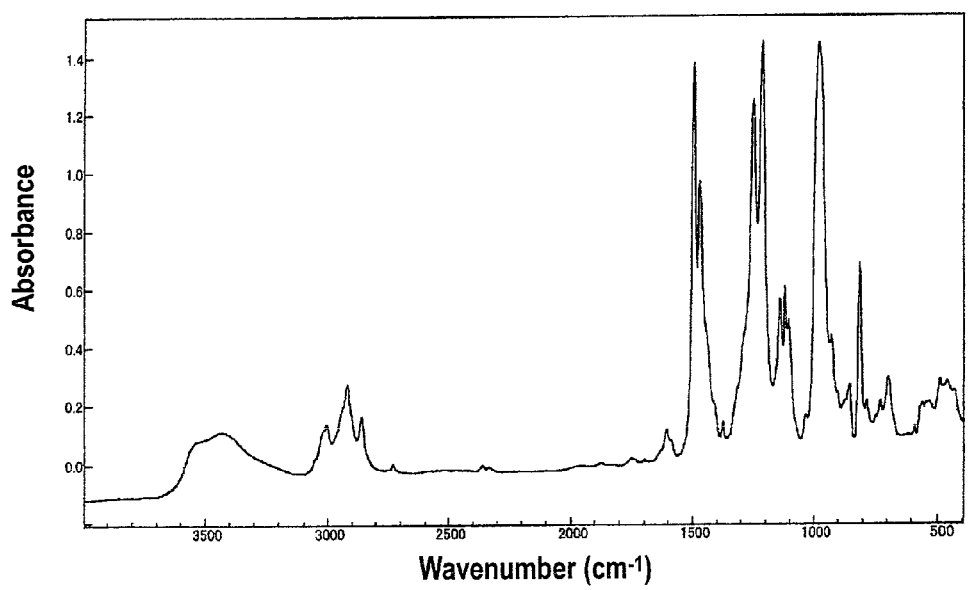
FIG. 24 is an IR spectrum of a curable resin according to the present invention (Synthesis example 13).

The product obtained was analyzed by $^1$H-NMR and IR measurements. Results of $^1$H-NMR measurement of the product (FIG. 23) showed neither signal of the ethoxy group in the raw material tetraethoxysilane nor signal of ethanol as the by-product. FIG. 24 is an IR spectrum of the product obtained in the present Example. Results in FIG. 24 showed appearance of a new peak characteristic to Si—OAr at 920 to 970 cm$^{-1}$ and decrease of the O—H peak of the phenolic hydroxyl group derived from the raw material. The results above suggested an assumption that the product contained a curable resin having the structural units represented by the following Formula (XXVII) and/or (XXVIII).

Synthesis Example 14

100 g of a para-cresol novolak having a hydroxyl equivalent of 116 and a softening point of 88° C. (pCr novolac, sample from Meiwa Plastic Industries, Ltd., molecular weight distribution shown by the GPC chart in FIG. 19) and 192 ml of toluene were placed in a 300-ml separable flask, and the mixture was heated at 100° C., to dissolve the solid component, thereby obtaining a solution. 1.50 g (0.0040 mol) of an addition reaction product between triphenylphosphine and 1,4-benzoquinone was added to the solution kept at approximately 100° C.; 29.9 g (0.144 mol) of tetraethoxysilane (LS-2430, manufactured by Shin-Etsu Chemical Co., Ltd.) was added dropwise thereto over approximately 10 minutes; and the mixture was allowed to react at 130° C. for 14 hours. Then, ethanol as the by-product was removed from the reaction system, by azeotropic distillation with toluene as the solvent. After reaction, toluene was removed from the reaction solution under reduced pressure at approximately 80° C. by using an aspirator, and then, the residue was dried at 80° C. under vacuum, to give 98 g of a solid product.

Figure 25:
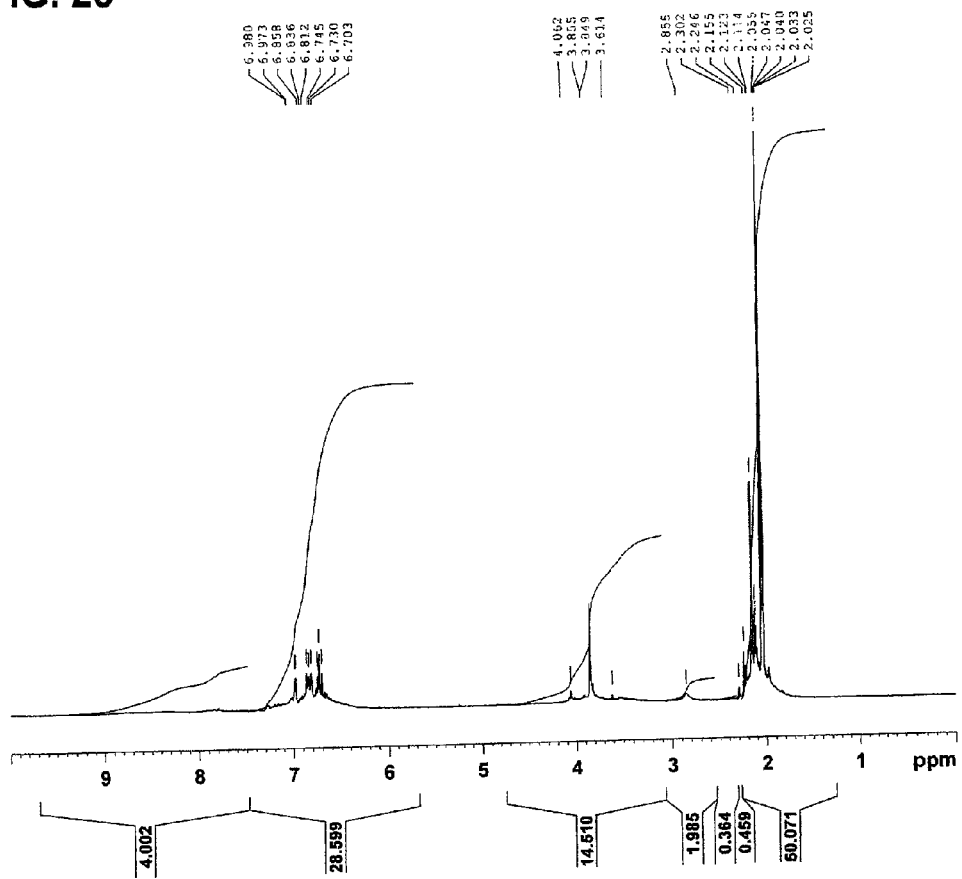
FIG. 25 is $^1$H-NMR spectrum of a curable resin according to the present invention (Synthesis example 14).
Figure 26:
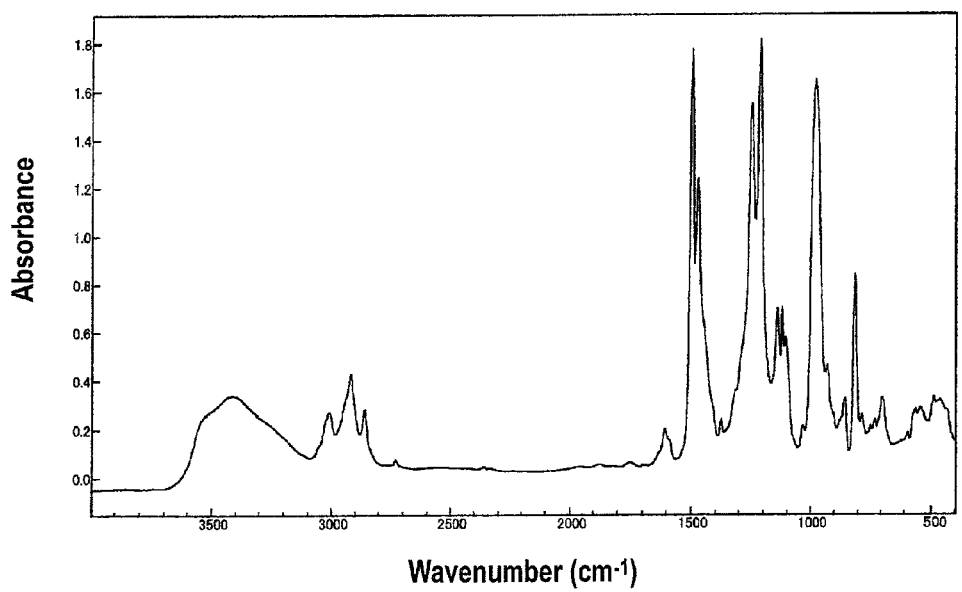
FIG. 26 is an IR spectrum of a curable resin according to the present invention (Synthesis example 14).

The product obtained was analyzed by $^1$H-NMR and IR measurements. Results of $^1$H-NMR measurement of the product (FIG. 25) showed no peak derived from the ethoxy group in the raw material tetraethoxysilane or from ethanol as the by-product. FIG. 26 is an IR spectrum of the product obtained in the present Example. The results in FIG. 26 showed appearance of a new peak characteristic to Si—OAr at 920 to 970 cm$^{-1}$ and decrease of the O—H peak of the phenolic hydroxyl group derived from the raw material. The results above suggested an assumption that the product contained a curable resin having the structural units represented by the above Formula (XXVII) and/or (XXVIII).

Synthesis Example 15

100 g (0.537 mol) of purified 2,2'-biphenol and 152 ml of toluene were placed in a 300-ml separable flask, and the mixture was heated at 100° C., to dissolve the solid component, thereby obtaining a solution. 0.50 g (0.0013 mol) of an addition reaction product between triphenylphosphine and 1,4-benzoquinone was added to the solution kept at approximately 100° C.; 55.0 g of a partial condensate of methyltrimethoxysilane (product name: MTMS-A, manufactured by Tama Chemicals Co., Ltd.) was added thereto additionally over approximately 20 minute; and the mixture was allowed to react at 120° C. for 12 hours. Then, the by-product methanol was removed from the reaction system, by azeotropic distillation with toluene as the solvent. After reaction, toluene was removed from the reaction solution under reduced pressure at approximately 80° C. by using an aspirator; and then, the residue was transferred into a Teflon (registered tradename)-coated metal container and cooled to room temperature, to give 112 g of a solid product.

Figure 27:
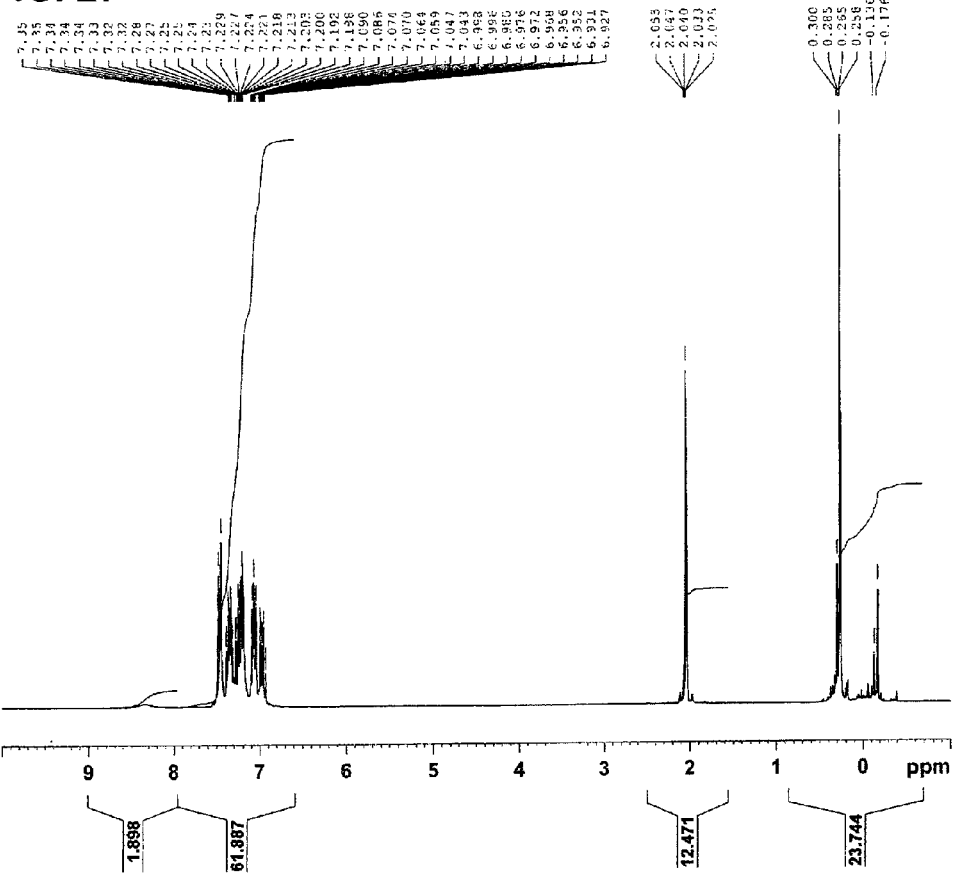
FIG. 27 is ¹H-NMR spectrum of a curable resin according to the present invention (Synthesis example 15).
Figure 28:
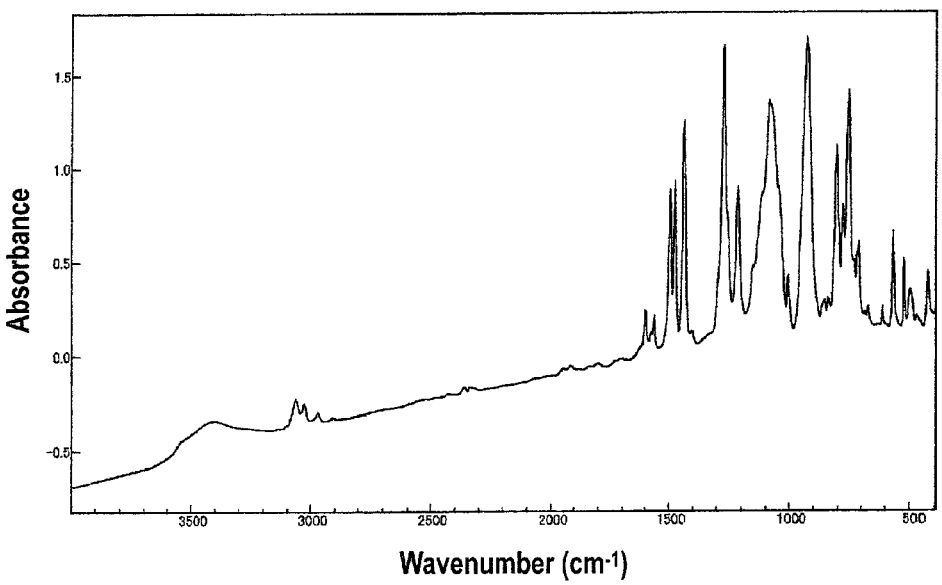
FIG. 28 is an IR spectrum of a curable resin according to the present invention (Synthesis example 15).

The product obtained was analyzed by $^1$H-NMR and IR measurements. Results of $^1$H-NMR measurement of the product (FIG. 27) showed neither signal derived from the methoxy group in the raw material partial condensate of methyltrimethoxysilane nor signal derived from the by-product methanol. FIG. 28 is an IR spectrum of the product obtained in the present Example. Results in FIG. 28 showed appearance of a new peak characteristic to Si—OAr at 920 to 970 cm$^{-1}$ and decrease of the O—H peak of the phenolic hydroxyl group derived from the raw material. The results above showed that the product contained a curable resin having the structural unit represented by Formula (XX) and/or (XXIV).

Synthesis Example 16

50 g of a para-cresol novolak having a hydroxyl equivalent of 116 and a softening point of 88° C. (pCr novolac, sample from Meiwa Plastic Industries, Ltd., molecular weight distribution shown in the GPC chart of FIG. 19) and 152 ml of toluene were placed in a 300-ml separable flask, and the mixture was heated at 100° C., to dissolve the solid component, thereby obtaining a solution. 0.75 g (0.0020 mol) of an addition reaction product between triphenylphosphine and 1,4-benzoquinone was added to the solution kept at approximately 100° C.; 27.5 g of a partial condensate of methyltrimethoxysilane (product name: MTMS-A, manufactured by Tama Chemicals Co., Ltd.) was added dropwise over approximately 10 minute, and the mixture was allowed to react at 130° C. for 22 hours. Then, the by-product methanol was removed from the reaction system, by azeotropic distillation with toluene as the solvent. After reaction, toluene was removed from the reaction solution under reduced pressure at approximately 80° C. by using an aspirator, and then, the residue was dried at 80° C. under vacuum, to give 59 g of a solid product.

Figure 29:
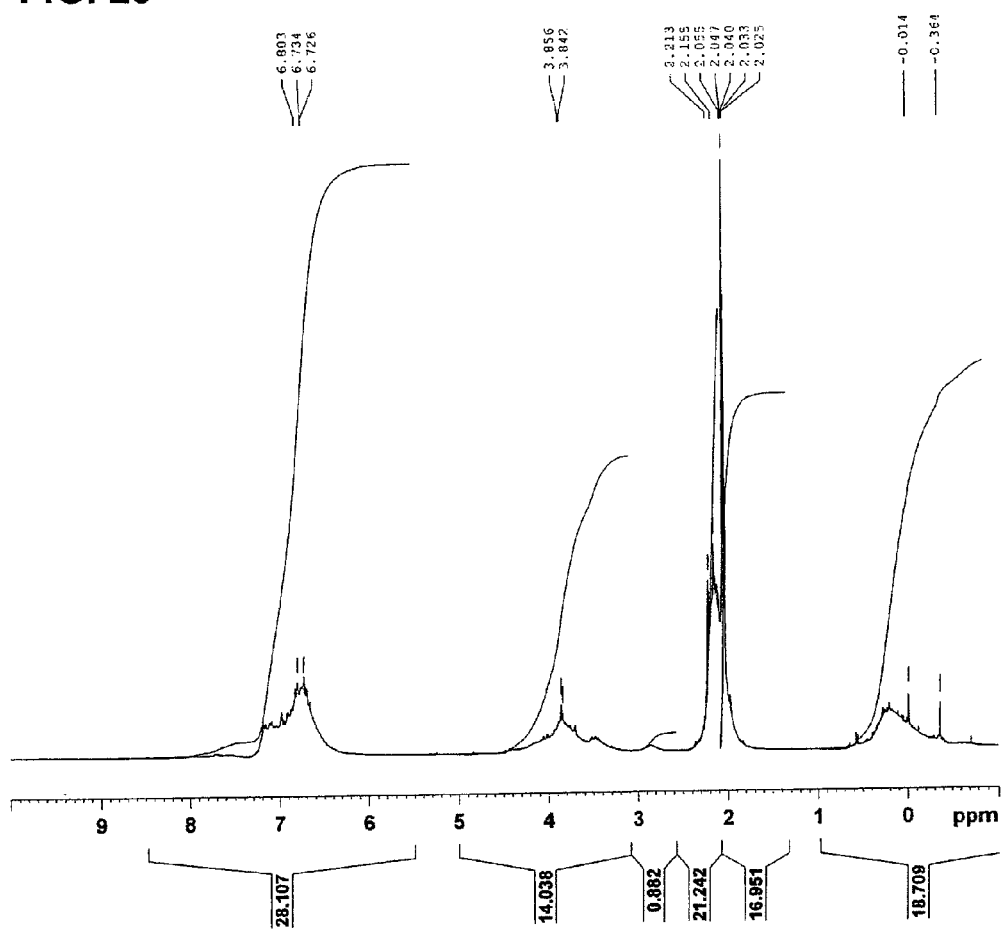
FIG. 29 is ¹H-NMR spectrum of a curable resin according to the present invention (Synthesis example 16).
Figure 30:
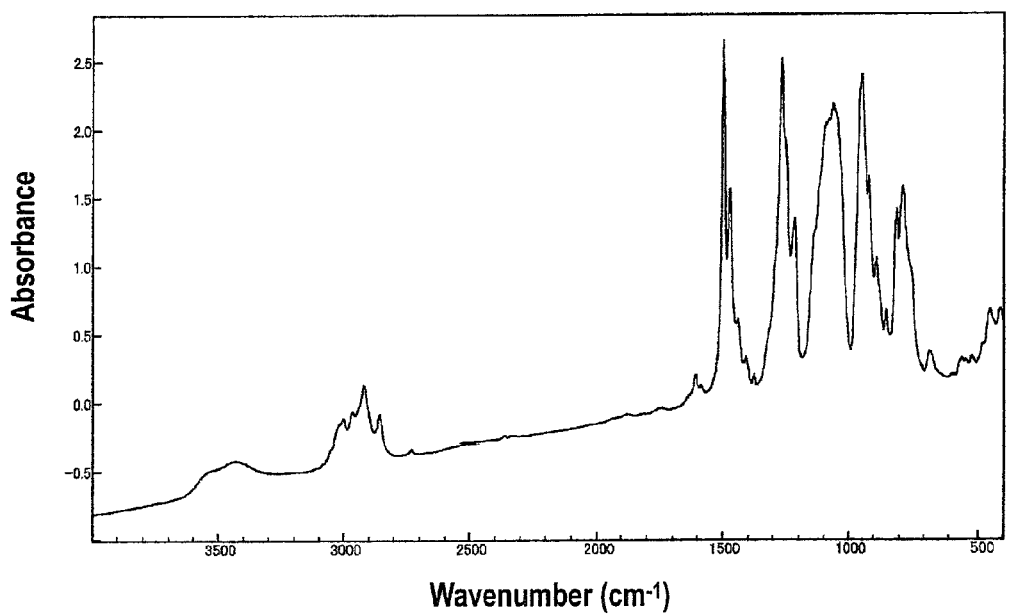
FIG. 30 is an IR spectrum of a curable resin according to the present invention (Synthesis example 16).

The product obtained was analyzed by $^1$H-NMR and IR measurements. Results of $^1$H-NMR measurement of the product (FIG. 29) showed neither signal derived from the methoxy group in the raw material partial condensate of methyltrimethoxysilane nor signal derived from the by-product methanol. FIG. 30 is an IR spectrum of the product obtained in the present Example. Results in FIG. 30 showed appearance of a new peak characteristic to Si—OAr at 920 to 970 cm$^{-1}$ and decrease of the O—H peak of the phenolic hydroxyl group derived from the raw material. The results above suggested an assumption that the product contained a curable resin having the structural unit represented by Formula (XXVII) and/or (XXIX).

[Formula 54]

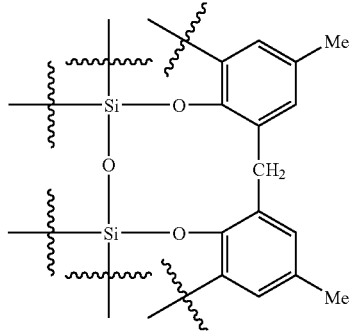

(XXIX)

Synthesis Example 17

100 g of a para-cresol novolak having a hydroxyl equivalent of 116 and a softening point of 88° C. (pCr novolac, sample from Meiwa Plastic Industries, Ltd., molecular weight distribution shown by GPC chart in FIG. 19) and 167 ml of toluene were placed in a 300-ml separable flask, and the mixture was heated at 100° C., to dissolve the solid component, thereby obtaining a solution. 1.50 g (0.0040 mol) of an addition reaction product between triphenylphosphine and 1,4-benzoquinone was added to the solution kept at approximately 100° C.; 39.4 g of a partial condensate of tetramethoxysilane (product name: M Silicate 51, manufactured by Tama Chemicals Co., Ltd.) was added dropwise thereto over approximately 20 minutes; and the mixture was allowed to react at 110° C. for 17 hours. Then, the by-product methanol was removed from the reaction system, by azeotropic distillation with toluene as the solvent. After reaction, toluene was removed from the reaction solution under reduced pressure at approximately 80° C. by using an aspirator, and then, the residue was dried at 80° C. under vacuum, to give 108 g of a solid product.

Figure 31:
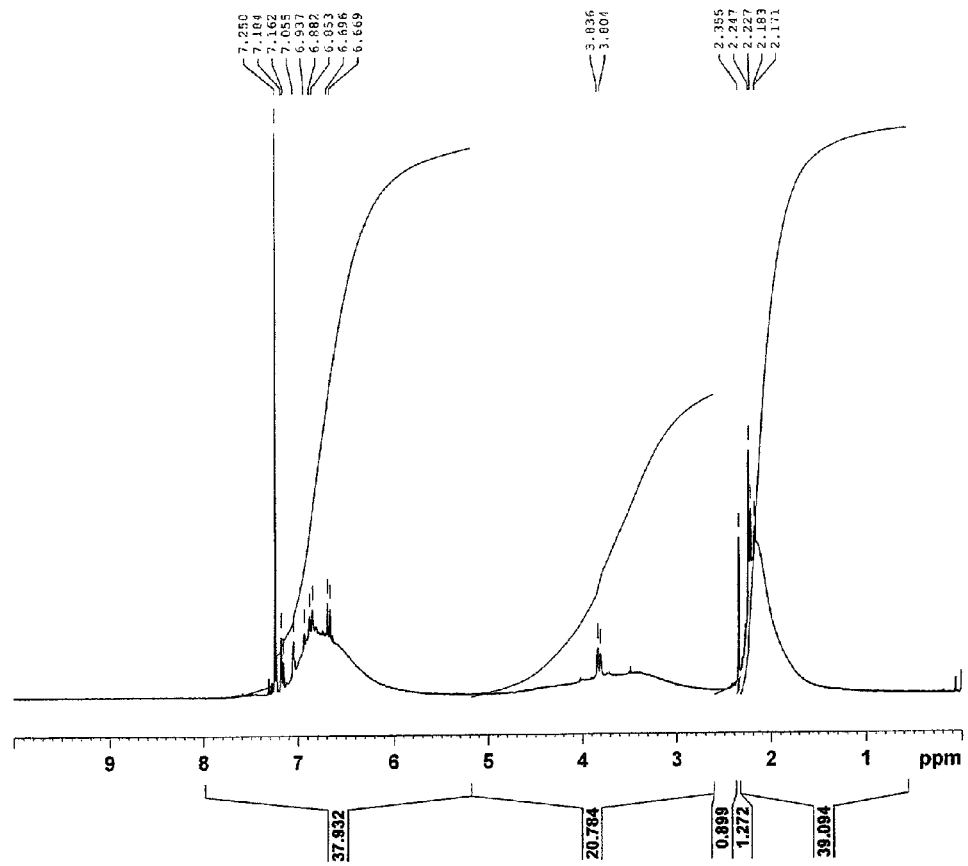
FIG. 31 is ¹H-NMR spectrum of a curable resin according to the present invention (Synthesis example 17).
Figure 32:
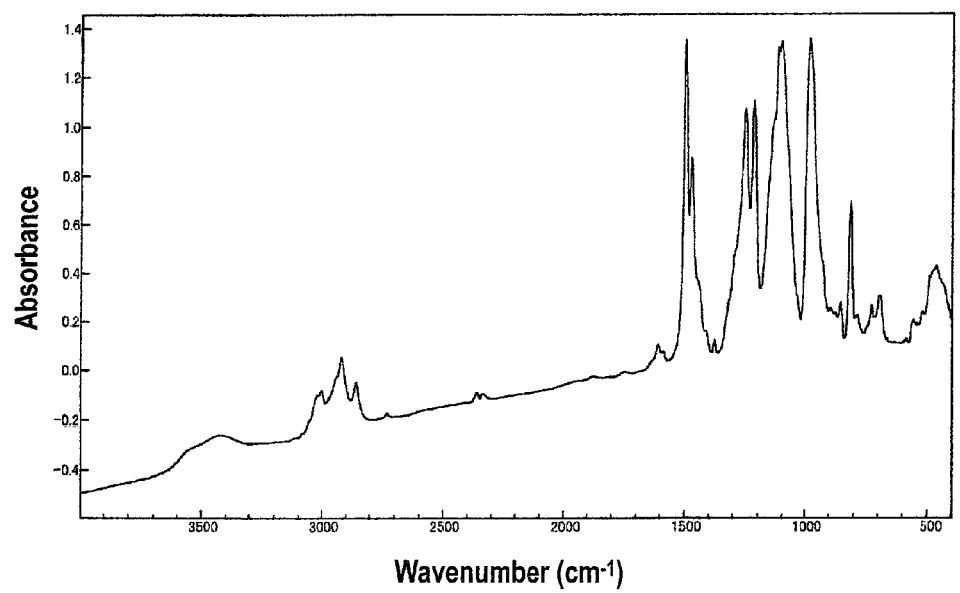
FIG. 32 is an IR spectrum of a curable resin according to the present invention (Synthesis example 17).

The product obtained was analyzed by $^1$H-NMR and IR measurements. Results of $^1$H-NMR measurement of the product (FIG. 31) showed neither signal derived from the methoxy group in the raw material partial condensate of tetramethoxysilane nor signal derived from the by-product methanol. FIG. 32 is an IR spectrum of the product obtained in the present Example. The results in FIG. 32 showed appearance of a new peak characteristic to Si—OAr at 920 to 970 cm$^{-1}$ and decrease of the O—H peak of the phenolic hydroxyl group derived from the raw material. The results above showed that the product contained a curable resin having the structural unit represented by Formula (XXVII) and/or (XXIX).

Synthesis Example 18

200 g of a novolak phenol resin having a hydroxyl equivalent of 106 and a softening point of 82° C. (product name: HP-850N, manufactured by Hitachi Chemical Co., Ltd.) was placed in a 300-ml separable flask and melted under heat at approximately 100° C. 1.00 g (0.0026 mol) of an addition reaction product between triphenylphosphine and 1,4-benzoquinone was added to the melted resin kept at approximately 100° C.; 98.3 g (0.472 mol) of tetraethoxysilane (manufactured by Shin-Etsu Chemical Co., Ltd. LS-2430) was added thereto additionally over approximately 20 minutes; and the mixture was allowed to react at 100° C., while ethanol as the by-product was removed from the reaction system under reduced pressure by using an aspirator. The mixture was gelated after reaction for approximately 3 hours, and the reaction could not be continued any more.

Synthesis Example 19

In Synthesis example 19, the reaction was performed under the presence of a smaller amount of tetraethoxysilane, for prevention of gelation. More specifically, the reaction was performed in the following manner: 200 g of a novolak phenol resin having a hydroxyl equivalent of 106 and a softening point of 82° C. (product name: HP-850N, Hitachi Chemical Co., Ltd.) was placed in a 300-ml separable flask and melted under heat at approximately 100° C. 1.00 g (0.0026 mol) of an addition reaction product between triphenylphosphine and 1,4-benzoquinone was added to the melted resin kept at approximately 100° C.; 32.8 g (0.157 mol) of tetraethoxysilane (LS-2430, manufactured by Shin-Etsu Chemical Co., Ltd.) was added thereto dropwise over approximately 10 minute; and the reaction was continued at 100° C., while ethanol as the by-product was removed from the reaction system under reduced pressure by using an aspirator. The mixture was gelated after reaction for approximately 10 hours, and the reaction was not continued any more.

Synthesis Example 20

In Synthesis example 20, the reaction was performed at a smaller rate of the unreacted $R^2$ group for prevention of gelation. More specifically, the reaction was performed in the following manner: 200 g of a novolak phenol resin having a hydroxyl equivalent of 106 and a softening point of 82° C. (product name: HP-850N, Hitachi Chemical Co., Ltd.) was placed in a 300-ml separable flask and melted under heat at approximately 100° C. 1.00 g (0.0026 mol) of an addition reaction product between triphenylphosphine and 1,4-benzoquinone was added to the melted resin kept at approximately 100° C.; 32.8 g (0.157 mol) of tetraethoxysilane (LS-2430, manufactured by Shin-Etsu Chemical Co., Ltd.) was added thereto dropwise over approximately 10 minutes; the reaction was continued at 100° C. for 30 minutes, while ethanol as the by-product was removed from the reaction system under reduced pressure by using an aspirator. Then, the residue was transferred into a Teflon (registered tradename)-coated metal container and cooled to room temperature, to give 189 g of a solid product.

Figure 33:
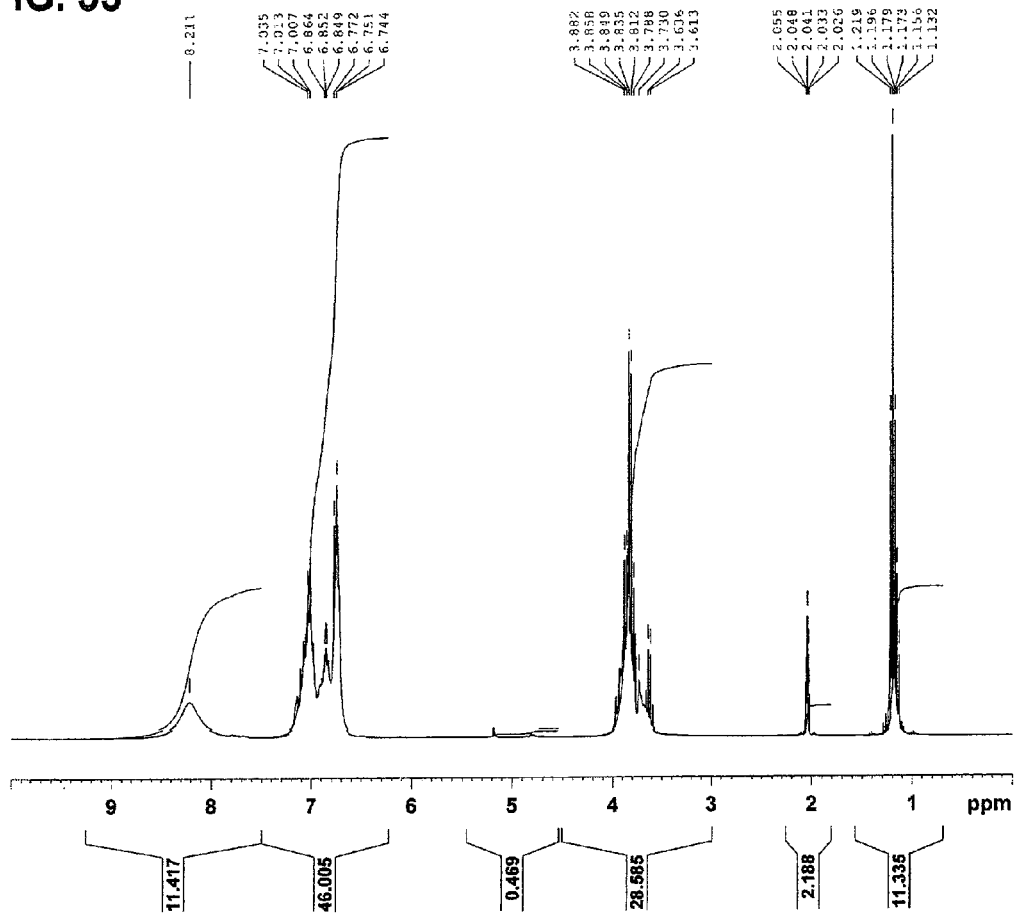
FIG. 33 is ¹H-NMR spectrum of a curable resin according to the present invention (Synthesis example 20).
Figure 34:
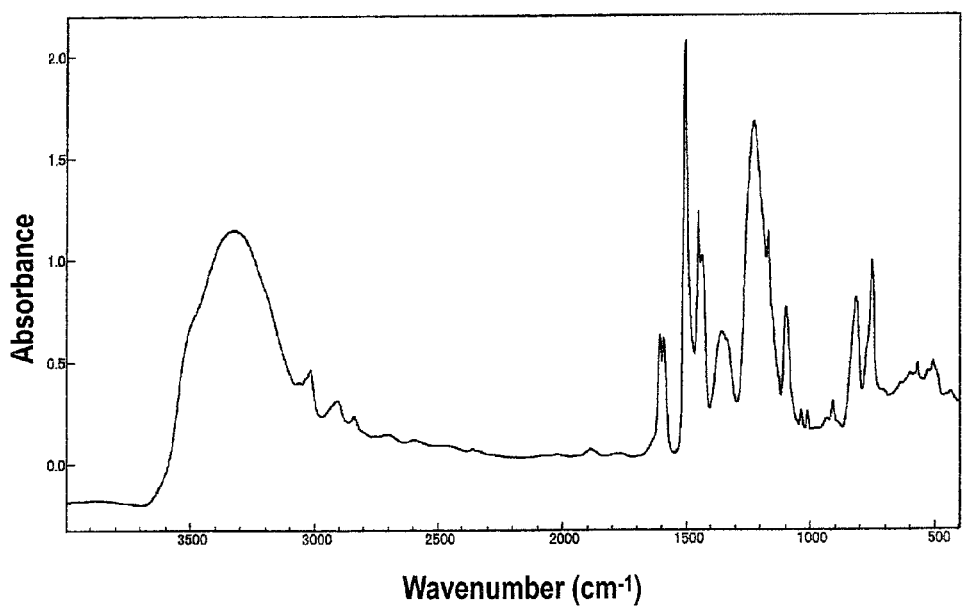
FIG. 34 is an IR spectrum of a novolak phenol resin.
Figure 35:
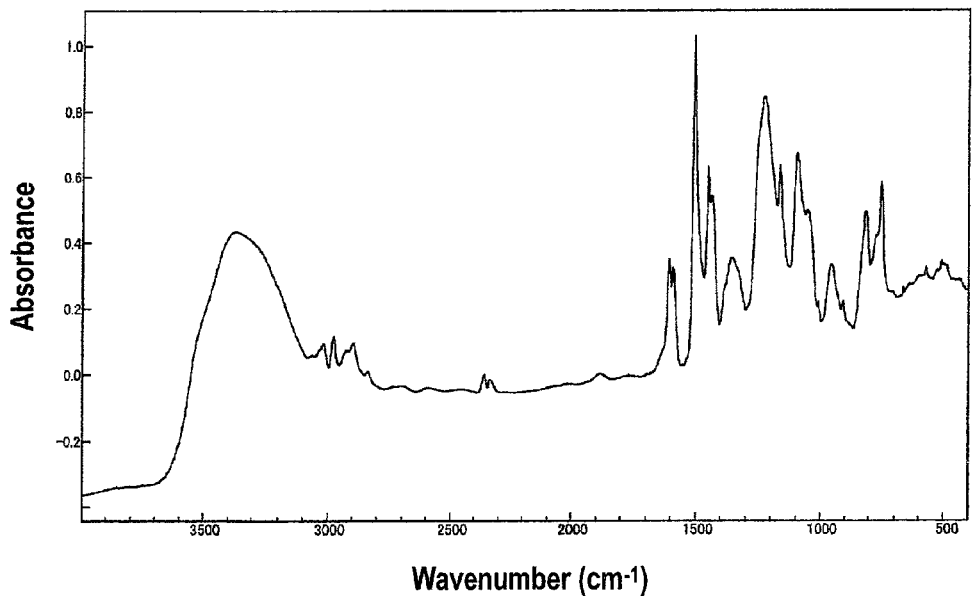
FIG. 35 is an IR spectrum of a curable resin according to the present invention (Synthesis example 20).

The product obtained was analyzed by $^1$H-NMR and IR measurements. Results of $^1$H-NMR measurement of the product (FIG. 33) showed that the number of the unreacted $R^2$ groups was 84% with respect to the number of the $R^2$ groups in tetraethoxysilane and the content of volatile component remaining in the curable resin was 11% with respect to the total weight of the curable resin. Results of IR measurement are shown in FIGS. 34 and 35. FIG. 34 is an IR spectrum of the raw material novolak phenol resin, while FIG. 35 is an IR spectrum of the product obtained in the present Example. Results of IR measurement of the product (FIG. 35) showed appearance of a peak characteristic to Si—OR (aliphatic) derived from the raw material tetraethoxysilane at 1,110 to 1,000 cm$^{-1}$ and also a peak characteristic to Si—OAr at 920 to 970 cm$^{-1}$. The results above suggested an assumption that the product contained aryloxysilyl and ethoxysilyl groups.

Synthesis Example 21

In Synthesis example 21, the reaction was performed under the presence of the unreacted $R^2$ group at a higher rate for prevention of gelation. More specifically, the reaction was performed in the following manner: 200 g of a novolak phenol resin having a hydroxyl equivalent of 106 and a softening point of 82° C. (product name: HP-850N, Hitachi Chemical Co., Ltd.) was placed in a 300-ml separable flask and melted under heat at approximately 100° C. 1.00 g (0.0026 mol) of an addition reaction product between triphenylphosphine and 1,4-benzoquinone was added to the melted resin kept at approximately 100° C.; 32.8 g (0.157 mol) of tetraethoxysilane (LS-2430, manufactured by Shin-Etsu Chemical Co., Ltd.) was added thereto dropwise over approximately 10 minute; and the reaction was continued at 100° C. for 5 hours, while ethanol as the by-product was removed from the reaction system under reduced pressure by using an aspirator. Then, the residue was transferred into a Teflon (registered tradename)-coated metal container and cooled to room temperature, to give 161 g of a solid product.

Figure 36:
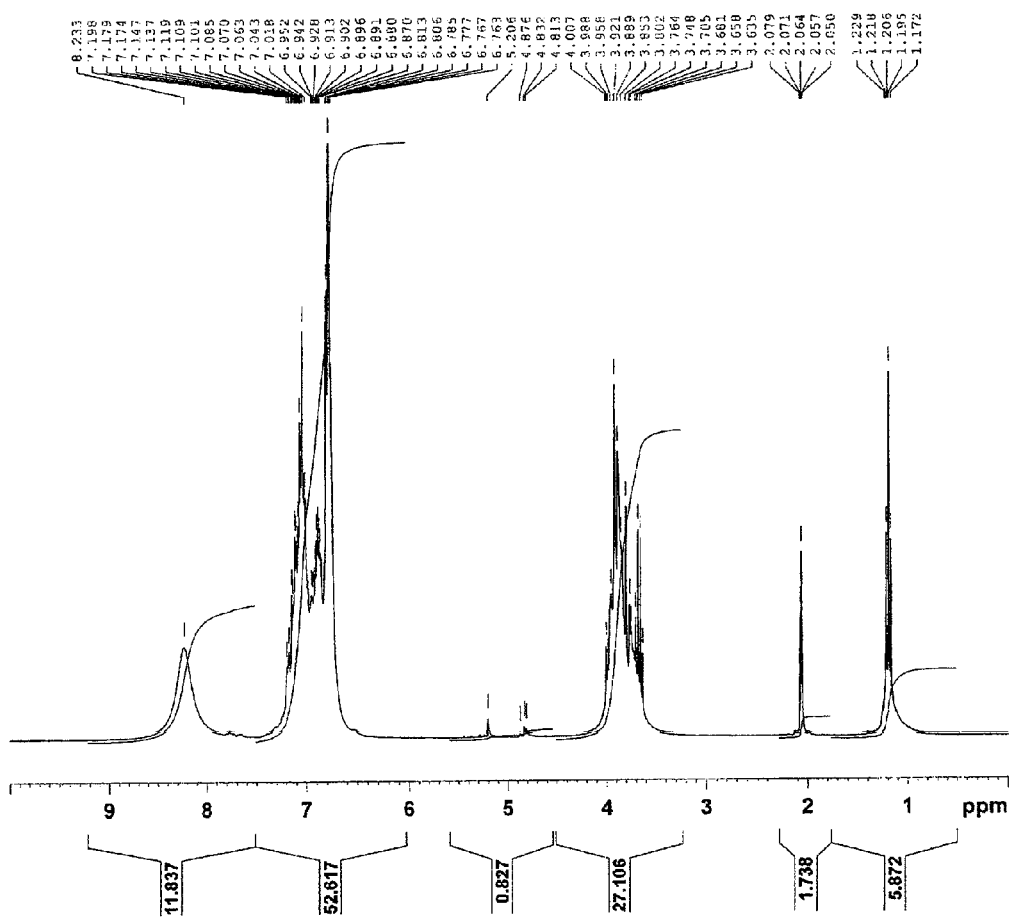
FIG. 36 is ¹H-NMR spectrum of a curable resin according to the present invention (Synthesis example 21).
Figure 37:
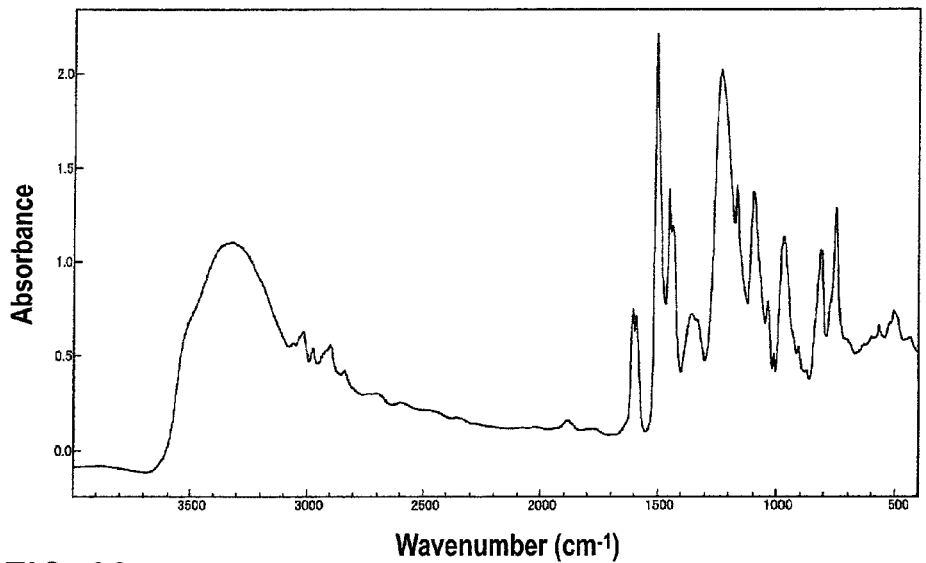
FIG. 37 is an IR spectrum of a curable resin according to the present invention (Synthesis example 21).

The product obtained was analyzed by $^1$H-NMR and IR measurements. Results of $^1$H-NMR measurement of the product (FIG. 36) showed that the number of the unreacted $R^2$ groups was 39% with respect to the number of $R^2$ groups in tetraethoxysilane and the content of volatile component remaining in the curable resin was 5.2% with respect to the total weight of the curable resin. Results of IR measurement of the product (FIG. 37) showed presence of a peak characteristic to Si—OR (aliphatic) derived from the raw material tetraethoxysilane at 1,110 to 1,000 cm$^{-1}$ and also a peak characteristic to Si—OAr at 920 to 970 cm$^{-1}$. The results above suggested an assumption that the product contained aryloxysilyl and ethoxysilyl groups.

Synthesis Example 22

In Synthesis example 22, for prevention of gelation, the reaction was performed under the presence of tetraethoxysilane at a smaller rate. More specifically, the reaction was performed in the following manner: 400 g of a novolak phenol resin having a hydroxyl equivalent of 106 and a softening point of 82° C. (product name: HP-850N, manufactured by Hitachi Chemical Co., Ltd.) was placed in a 500-ml separable flask and melted under heat at approximately 100° C. 1.00 g (0.0026 mol) of an addition reaction product between triphenylphosphine and 1,4-benzoquinone were added to the melted resin kept at approximately 100° C.; 32.8 g (0.157 mol) of tetraethoxysilane (LS-2430, manufactured by Shin-Etsu Chemical Co., Ltd.) was added thereto dropwise over approximately 10 minutes; and the reaction was continued at 120° C. for 18 hours, while ethanol as the by-product was removed from the reaction system under reduced pressure by using an aspirator. Then, the reaction product was transferred into a Teflon (registered tradename)-coated metal container and cooled to room temperature, to give 356 g of a solid product.

Figure 38:
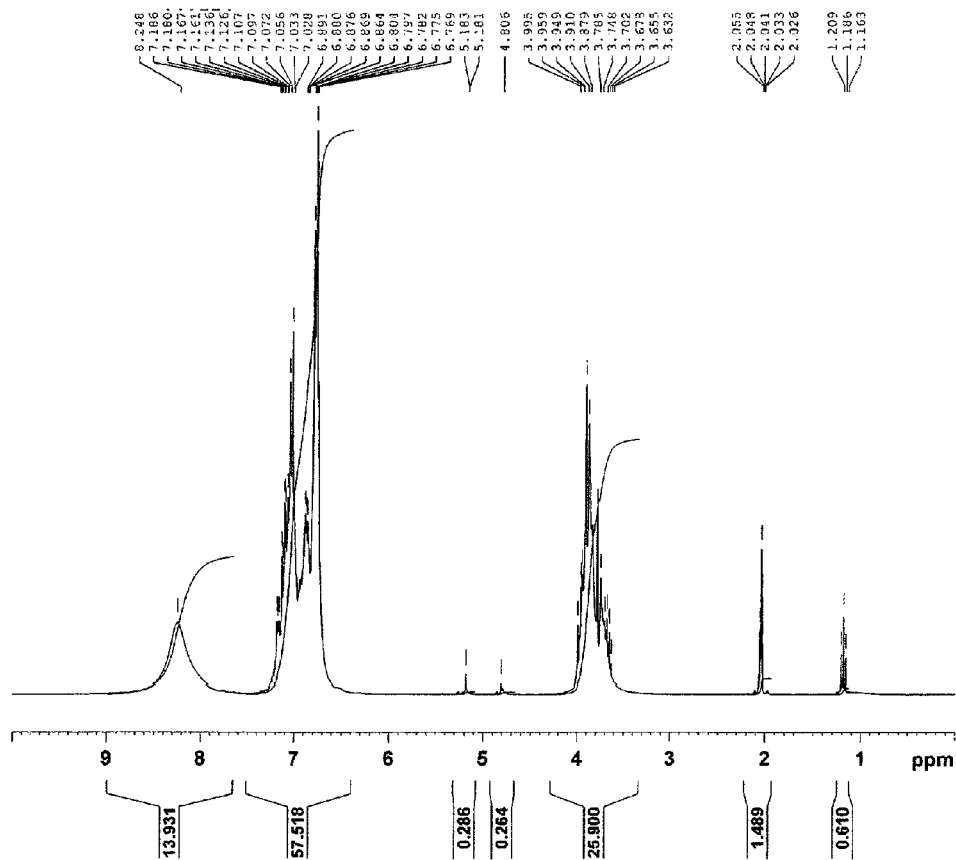
FIG. 38 is ¹H-NMR spectrum of a curable resin according to the present invention (Synthesis example 22).
Figure 39:
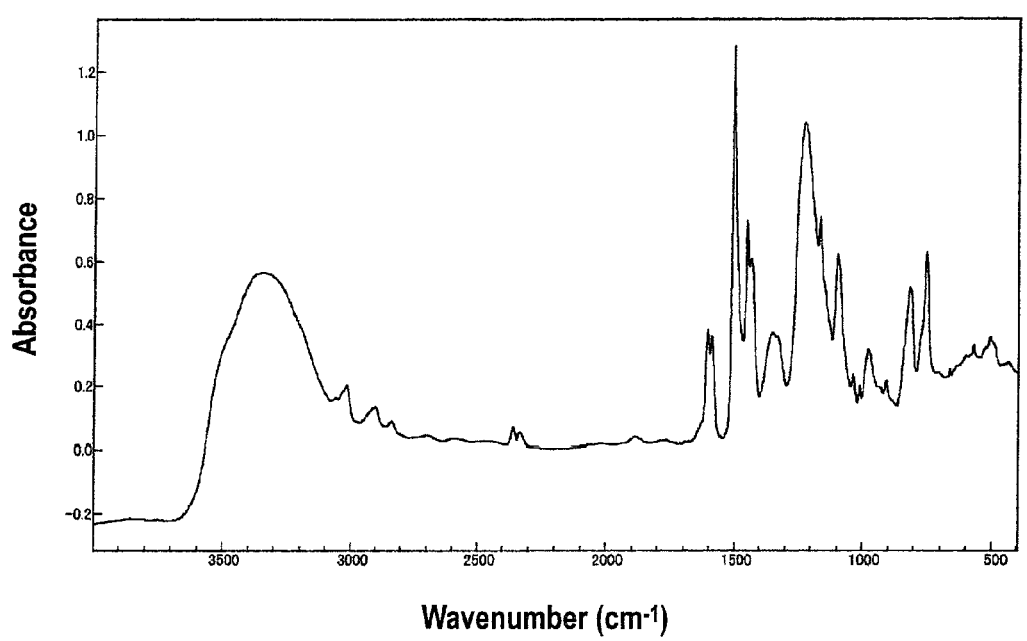
FIG. 39 is an IR spectrum of a curable resin according to the present invention (Synthesis example 22).

The product obtained was analyzed by $^1$H-NMR and IR measurements. Results of $^1$H-NMR measurement of the product (FIG. 38) showed that the number of the unreacted $R^2$ groups was 8.1% with respect to the number of $R^2$ groups in tetraethoxysilane and the content of volatile component remaining in the curable resin was 0.62% with respect to the total weight of the curable resin. Results of IR measurement of the product (FIG. 39) showed presence of a peak characteristic to Si—OR (aliphatic) derived from the raw material tetraethoxysilane at 1,110 to 1,000 cm$^{-1}$ and also a peak characteristic to Si—OAr at 920 to 970 cm$^{-1}$. The results above suggested an assumption that the product contained aryloxysilyl and ethoxysilyl groups.

2,2'-Biphenol used in Synthesis examples 1, 3, and 8 to 11 is a reagent manufactured by Tokyo Chemical Industry Co., Ltd., it contains: sodium ion at 600 ppm, potassium ion at 380 ppm, chloride ion at 610 ppm, phosphate ion at 130 ppm, and nitrate ion at 10 ppm, as determined by ion chromatography. A reagent manufactured by Tokyo Chemical Industry Co., Ltd. was used after purification as the 2,2'-biphenol in Synthesis examples 4 to 6 and 15. The concentrations of cations and anions after purification were respectively as follows: sodium ion at 60 ppm; and chloride ion at 9.0 ppm, and other ions detected before purification were not detected. A typical method of purifying 2,2'-biphenol will be described below.

(Purification of 2,2'-biphenol)

1,500 g of 2,2'-biphenol (reagent, manufactured by Tokyo Chemical Industry Co., Ltd.), 500 ml of toluene, and 1,000 ml of distilled water were placed in a 3,000-ml separable flask, and the mixture was dissolved under heat at approximately 90° C., to give a solution. The solution was stirred while heated at approximately 90° C. for 2.5 hours and left overnight, and the precipitated solid matter was filtered and washed (with 1,500 ml of distilled water). The solid matter was placed again in the 3,000-ml separable flask; 500 ml of toluene and 1,000 ml of distilled water were added thereto; and the mixture was heated to approximately 90° C., to give a solution. The solution was stirred while heated at approximately 90° C. for 2.5 hours and left overnight, and the precipitated solid matter was filtered and washed (with 1,500 ml of distilled water). The solid matter obtained was dried at 70° C. under vacuum, and then placed in a 2,000-ml separable flask; 500 ml of toluene was added thereto; the mixture was dissolved under heat into a solution; and remaining trace amount of water was removed by azeotropic distillation. Subsequently, the solution was left overnight, and the precipitated solid matter was filtered and dried, to give 1,340 g of purified 2,2'-biphenol.

In Synthesis examples 1, 3, and 8 to 11 in which 2,2'-biphenol (reagent, manufactured by Tokyo Chemical Industry Co., Ltd.) before purification was used, the reaction proceeded without catalyst. On the other hand, in Synthesis examples in which purified 2,2'-biphenol was used, the reaction did not proceed without catalyst. The fact suggests an assumption that the cations and/or anions contained in the 2,2'-biphenol (reagent, manufactured by Tokyo Chemical Industry Co., Ltd.) before purification functioned as reaction catalysts.

The reaction products (hereinafter, referred to as "curable resins") obtained in Synthesis examples 1 to 22 were analyzed in various ways, specifically in the following tests.

(1) $^1$H-NMR

Approximately 10 mg of a curable resin was dissolved in approximately 1 ml of deuterated acetone, and the solution was placed in a φ5 mm sample tube and analyzed in AV-300M manufactured by Bruker Biospin. The chemical shift is a value relative to $CHD_2C(=O)CD_3$ (2.04 ppm) contained in a trace amount in the solvent.

(2) IR

FTS 3000MX manufactured by Bio-Rad was used (by KBr method).

(3) Ion Chromatograph 5 g of a curable resin pulverized in a mortar and 50 g of distilled water were placed in a polypropylene container and heated at 95° C. for 20 hours. The extract obtained was filtered and analyzed by the following method. The contents of various ions in the curable resin, i.e., ionic concentrations, were determined by subtracting the blank values of the ions in water obtained when 50 g of distilled water was placed similarly in a polypropylene container and heated at 95° C. for 20 hours, from the measured values.

(3-1) Cations

Cations were determined in an ion chromatograph HIC-6A manufactured by Shimazu Corp. equipped with a guard column (Shim-pack IC-GC3) and a separation column (Shim-pack IC-C3), under the condition of an eluant of 1 mM aqueous oxalic acid solution/acetonitrile:5/1, a flow rate of 1.1 ml/min, and a column temperature of 30° C.

(3-2) Anions

Anions were determined in an ion chromatograph IC20 manufactured by DIONEX equipped with a guard column (IonPac AG9-HC) and a separation column (IonPac AS9-HC) under the condition of an eluant of 9 mM aqueous sodium carbonate solution, a flow rate of 1.0 ml/min, and a column temperature of 30° C.

(4) GPC (Gel Permeation Chromatography)

Approximately 3 mg of a resin was dissolved in approximately 3 ml of THF; the solution was fed with a pump (L-3300) manufactured by Hitachi into a guard column (TOSOH TSK-guard column HXL-H), a separation column (TOSOH TSK-GEL G200H8) and a separation column (TOSOH TSK-GEL G100H8) and eluted with an eluant of THF under the condition of a flow rate of 1.0 ml/min and a column temperature of 30° C., and the resin was detected with an RI detector (L-6200) manufactured by Hitachi. The "molecular weight" was calculated with a calibration curve prepared with polystyrene standard samples.

Preparation of Epoxy Resin Compositions and Evaluation of the Properties Thereof Examples 1 to 36 and Comparative Examples 1 to 12

Epoxy Resins (A)

Epoxy resin 1: biphenyl epoxy resin having an epoxy equivalent of 196 and a melting point of 106° C. (product name: "YX-4000H", manufactured by Japan Epoxy Resin Co., Ltd.)

Epoxy resin 2: o-cresol novolak epoxy resin having an epoxy equivalent of 195 and a softening point of 77° C. (product name: "ESCN-190-6", manufactured by Sumitomo Chemical Co., Ltd.)

Epoxy resin 3: o-cresol novolak epoxy resin having an epoxy equivalent of 195 and a softening point of 62° C. (product name: "ESCN-190-2", manufactured by Sumitomo Chemical Co., Ltd.)

Epoxy resin 4: aralkyl phenol resin epoxy compound having an epoxy equivalent of 282 and a softening point of 59° C. (product name: "NC-3000S", manufactured by Nippon Kayaku Co., Ltd.)

Epoxy resin 5: salicyl aldehyde epoxy resin having an epoxy equivalent of 168 and a softening point of 68° C. (product name: "EPPN-502H", manufactured by Nippon Kayaku Co., Ltd.)

Epoxy resin 6: salicyl aldehyde epoxy resin having an epoxy equivalent of 168 and a softening point 62° C. (product name: "1032H60", manufactured by Japan Epoxy Resin Co., Ltd.), Epoxy resin 7: naphthalene epoxy resin having an epoxy equivalent of 162 and a softening point of 93° C. (product name: "EXA-4700", manufactured by Dainippon Ink and Chemicals Inc.)

Curing Agent (B)

Curing agent 1: curable resin obtained in Synthesis example 1
Curing agent 2: curable resin obtained in Synthesis example 3
Curing agent 3: curable resin obtained in Synthesis example 2
Curing agent 4: curable resin obtained in Synthesis example 4
Curing agent 5: curable resin obtained in Synthesis example 5
Curing agent 6: curable resin obtained in Synthesis example 6
Curing agent 7: curable resin obtained in Synthesis example 7
Curing agent 8: curable resin obtained in Synthesis example 8
Curing agent 9: curable resin obtained in Synthesis example 9
Curing agent 10: curable resin obtained in Synthesis example 10
Curing agent 11: curable resin obtained in Synthesis example 11
Curing agent 12: curable resin obtained in Synthesis example 12
Curing agent 13: curable resin obtained in Synthesis example 13
Curing agent 14: curable resin obtained in Synthesis example 14
Curing agent 15: curable resin obtained in Synthesis example 15
Curing agent 16: curable resin obtained in Synthesis example 16
Curing agent 17: curable resin obtained in Synthesis example 21
Curing agent 18: curable resin obtained in Synthesis example 22
Curing agent A: phenol aralkyl resin having a hydroxyl equivalent of 176 and a softening point of 70° C. (product name: "Milex XL-225", manufactured by Mitsui Chemicals, Inc.)
Curing agent B: 2,2'-biphenol having a hydroxyl equivalent of 93 and a melting point of 108 to 110° C. (reagent, manufactured by Tokyo Chemical Industry Co., Ltd.)
Curing agent C: phenol aralkyl resin having a hydroxyl equivalent of 200 and a softening point 67° C. (product name: "MEH-7851", manufactured by Meiwa Plastic Industries, Ltd.)
Curing agent D: salicyl aldehyde phenol resin having a hydroxyl equivalent of 103 and a softening point of 86° C. (product name: "MEH-7500", manufactured by Meiwa Plastic Industries, Ltd.)
Curing agent E: para-cresol novolak having a hydroxyl equivalent of 116 and a softening point of 88° C. (pCr novolac, sample from Meiwa Plastic Industries, Ltd., molecular weight distribution shown by the GPC chart in FIG. 19).
Curing agent F: novolak phenol resin having a hydroxyl equivalent of 106 and a melting point of 82° C. (product name: "HP-850N", Hitachi Chemical Co., Ltd.)
Curing agent G: curable resin obtained in Synthesis example 20

Accelerator (C)

Accelerator 1: addition reaction product between triphenylphosphine and 1,4-benzoquinone
Accelerator 2: addition reaction product between tri-n-butylphosphine and 1,4-benzoquinone

Inorganic Filler (D)

Spherical fused silica having an average diameter of 17.5 μm and a specific surface area of 3.8 m²/g (Other Various Additives)
Coupling agent: epoxysilane (γ-glycidoxypropyltrimethoxysilane)
Colorant: carbon black (product name: "MA-100", manufactured by Mitsubishi Chemical Corp.)
Releasing agent: carnauba wax (manufactured by Cerarica Noda Co., Ltd.)

The components above were mixed in the composition (parts by weight) shown in Tables 1 to 4 and roll-kneaded under the condition of a kneading temperature of 80° C. and a kneading period of 15 minutes, to give respectively the epoxy resin compositions of Examples 1 to 36 and Comparative Examples 1 to 12.

[Table 1]

TABLE 1

| | Composition | | | | | | | | | | | |
|---|---|---|---|---|---|---|---|---|---|---|---|---|
| | Ex. | | | | | | | | Comp. | | | |
| Component | 1 | 2 | 3 | 4 | 5 | 6 | 7 | 8 | 1 | 2 | 3 | 4 |
| Epoxy resin 1 | 50 | | | | | 50 | | | 100 | | | 100 |
| Epoxy resin 2 | | 100 | 100 | | | | | | | 100 | 100 | |
| Epoxy resin 3 | 50 | | | 100 | 100 | 50 | 100 | 100 | | | | |
| Curing agent 1 | 51 | 51 | 51 | 51 | 51 | | | | | | | |
| Curing agent 2 | | | | | | 54 | 54 | 54 | | | | |
| Curing agent A | | | | | | | | | 88 | | | |
| Curing agent B | | | | | | | | | | 48 | 48 | 47 |
| Accelerator 1 | | 5.1 | | 5.1 | | | 5.1 | | 3.4 | 5.1 | | |
| Accelerator 2 | 6.3 | | 6.3 | | 6.3 | 6.3 | | 6.3 | | | 6.3 | 6.3 |
| Carnauba wax | 1 | 1 | 1 | 1 | 1 | 1 | 1 | 1 | 1 | 1 | 1 | 1 |
| Carbon black | 2.6 | 2.6 | 2.6 | 2.6 | 2.6 | 2.6 | 2.6 | 2.6 | 2.6 | 2.6 | 2.6 | 2.6 |
| Epoxy silane | 11 | 11 | 11 | 11 | 11 | 11 | 11 | 11 | 11 | 11 | 11 | 11 |
| Fused silica | 1258 | 1250 | 1259 | 1250 | 1259 | 1284 | 1276 | 1285 | 1513 | 1228 | 1236 | 1235 |
| Fused silica (wt %) | 88 | 88 | 88 | 88 | 88 | 88 | 88 | 88 | 88 | 88 | 88 | 88 |

TABLE 1-continued

| | Composition | | | | | | | | | | | |
|---|---|---|---|---|---|---|---|---|---|---|---|---|
| | Ex. | | | | | | | | Comp. | | | |
| Component | 1 | 2 | 3 | 4 | 5 | 6 | 7 | 8 | 1 | 2 | 3 | 4 |
| Fused silica (vol %) | 80 | 80 | 80 | 80 | 80 | 80 | 80 | 80 | 80 | 80 | 80 | 80 |

[Table 2]

TABLE 2

| | Composition | | | | | | | | | | | |
|---|---|---|---|---|---|---|---|---|---|---|---|---|
| | Ex. | | | | | Comp. | Ex. | | | Comp. | Ex. | Comp. |
| Component | 9 | 10 | 11 | 12 | 13 | 5 | 14 | 15 | 16 | 6 | 17 | 7 |
| Epoxy resin 1 | 50 | 50 | | | | | | | | | | |
| Epoxy resin 4 | 50 | 50 | 100 | 100 | 100 | 100 | | | | | | |
| Epoxy resin 5 | | | | | | | 100 | 100 | 100 | 100 | 100 | 100 |
| Curing agent 1 | 43 | | 35 | | | | 59 | | | | 59 | |
| Curing agent 2 | | 46 | | 38 | | | | 63 | | | | |
| Curing agent 3 | | | | | 43 | | | | 72 | | | |
| Curing agent C | | | | | | 71 | | | | | | |
| Curing agent D | | | | | | | | | | 61 | | 61 |
| Accelerator 1 | 6.9 | 7.6 | 6.1 | 6.8 | 6.1 | 3.4 | 5.1 | 5.6 | 5.1 | 1.5 | 4.6 | 1.5 |
| Carnauba wax | 1 | 1 | 1 | 1 | 1 | 1 | 1 | 1 | 1 | 1 | 1 | 1 |
| Carbon black | 2.6 | 2.6 | 2.6 | 2.6 | 2.6 | 2.6 | 2.6 | 2.6 | 2.6 | 2.6 | 2.6 | 2.6 |
| Epoxy silane | 11 | 11 | 11 | 11 | 11 | 11 | 11 | 11 | 11 | 11 | 11 | 11 |
| Fused silica | 1205 | 1232 | 1143 | 1166 | 1200 | 1385 | 1310 | 1344 | 1406 | 1301 | 1009 | 1005 |
| Fused silica (wt %) | 88 | 88 | 88 | 88 | 88 | 88 | 88 | 88 | 88 | 88 | 85 | 85 |
| Fused silica (vol %) | 80 | 80 | 80 | 80 | 80 | 80 | 80 | 80 | 80 | 80 | 75 | 75 |

[Table 3]

TABLE 3

| | Composition | | | | | | | | | | | | | |
|---|---|---|---|---|---|---|---|---|---|---|---|---|---|---|
| | Ex. | | | | | | | | | | | | Comp. | |
| Component | 18 | 19 | 20 | 21 | 22 | 23 | 24 | 25 | 26 | 27 | 28 | 29 | 8 | 9 |
| Epoxy resin 6 | 100 | 100 | 100 | 100 | 100 | 100 | 100 | 100 | 100 | 100 | 100 | | 100 | 100 |
| Epoxy resin 7 | | | | | | | | | | | | 100 | | |
| Curing agent 1 | 59 | | | | | | | | | | | 61 | | |
| Curing agent 2 | | 63 | | | | | | | | | | | | |
| Curing agent 3 | | | 72 | | | | | | | | | | | |
| Curing agent 4 | | | | 64 | | | | | | | | | | |
| Curing agent 5 | | | | | 63 | | | | | | | | | |
| Curing agent 6 | | | | | | 62 | | | | | | | | |
| Curing agent 7 | | | | | | | 71 | | | | | | | |
| Curing agent 8 | | | | | | | | 70 | | | | | | |
| Curing agent 9 | | | | | | | | | 76 | | | | | |
| Curing agent 10 | | | | | | | | | | 89 | | | | |
| Curing agent 11 | | | | | | | | | | | 103 | | | |
| Curing agent B | | | | | | | | | | | | | 55 | |
| Curing agent D | | | | | | | | | | | | | | 61 |
| Accelerator 1 | 4.0 | 4.0 | 2.5 | 4.0 | 4.0 | 4.0 | 2.5 | 3.5 | 4.5 | 4.5 | 3.0 | 4.0 | 5.0 | 1.5 |
| Carnauba wax | 1 | 1 | 1 | 1 | 1 | 1 | 1 | 1 | 1 | 1 | 1 | 1 | 1 | 1 |
| Carbon black | 2.6 | 2.6 | 2.6 | 2.6 | 2.6 | 2.6 | 2.6 | 2.6 | 2.6 | 2.6 | 2.6 | 2.6 | 2.6 | 2.6 |
| Epoxy silane | 11 | 11 | 11 | 11 | 11 | 11 | 11 | 11 | 11 | 11 | 11 | 11 | 11 | 11 |
| Fused silica | 1006 | 1030 | 1072 | 1036 | 1030 | 1023 | 1068 | 1064 | 1103 | 1177 | 1250 | 1018 | 991 | 1005 |
| Fused silica (wt %) | 85 | 85 | 85 | 85 | 85 | 85 | 85 | 85 | 85 | 85 | 85 | 85 | 85 | 85 |
| Fused silica (vol %) | 75 | 75 | 75 | 75 | 75 | 75 | 75 | 75 | 75 | 75 | 75 | 75 | 75 | 75 |

[Table 4]

TABLE 4

| | Composition | | | | | | | | | |
|---|---|---|---|---|---|---|---|---|---|---|
| | Ex. | | | | | Comp. | Ex. | | Comp. | |
| Component | 30 | 31 | 32 | 33 | 34 | 10 | 35 | 36 | 11 | 12 |
| Epoxy resin 6 | 100 | 100 | 100 | 100 | 100 | 100 | 100 | 100 | 100 | 100 |
| Curing agent 12 | 73 | | | | | | | | | |
| Curing agent 13 | | 73 | | | | | | | | |
| Curing agent 14 | | | 73 | | | | | | | |
| Curing agent 15 | | | | 71 | | | | | | |
| Curing agent 16 | | | | | 89 | | | | | |
| Curing agent 17 | | | | | | | 68 | | | |
| Curing agent 18 | | | | | | | | 64 | | |
| Curing agent E | | | | | | 69 | | | | |
| Curing agent F | | | | | | | | | 63 | |
| Curing agent G | | | | | | | | | | 72 |
| Accelerator 1 | 2.0 | 2.0 | 2.0 | 2.7 | 1.5 | 4.0 | 1.5 | 1.5 | 1.5 | 1.5 |
| Carnauba wax | 1 | 1 | 1 | 1 | 1 | 1 | 1 | 1 | 1 | 1 |
| Carbon black | 2.6 | 2.6 | 2.6 | 2.6 | 2.6 | 2.6 | 2.6 | 2.6 | 2.6 | 2.6 |
| Epoxy silane | 11 | 11 | 11 | 11 | 11 | 11 | 11 | 11 | 11 | 11 |
| Fused silica | 1076 | 1076 | 1072 | 1069 | 1164 | 1063 | 1043 | 1022 | 1015 | 1066 |
| Fused silica (wt %) | 85 | 85 | 85 | 85 | 85 | 85 | 85 | 85 | 85 | 85 |
| Fused silica (vol %) | 75 | 75 | 75 | 75 | 75 | 75 | 75 | 75 | 75 | 75 |

Then, each of the epoxy resin compositions obtained in Examples 1 to 36 and Comparative Examples 1 to 12 was evaluated in the tests shown below. Evaluation results are summarized in Tables 5 to 8. Each epoxy resin composition was molded in a transfer molding machine under the condition of a mold temperature of 180° C., a molding pressure of 6.9 MPa, and a curing period of 90 seconds. Post-curing was performed at 175° C. for 6 hours.

(1) Hot Hardness

An epoxy resin composition was molded into a circular disk of 50 mm in diameter and 3 mm in thickness under the condition above, and the hot hardness was determined by using a Shore D hardness meter immediately after molding.

(2) Glass Transition Temperature (Tg)

An epoxy resin composition was molded into a piece of 80 mm in length, 10 mm in width, and 3 mm in thickness under the condition above, and the test piece was post-cured. Then, the test piece was cut into a piece having a length of 55 m with a diamond cutter; the tan δ of the test sample was determined by using a viscoelasticity analyzer ARES (manufactured by Rheometric Scientific F. E.) in the dynamic mode under the condition of a programmed heating rate of 5° C. and a frequency of 6.28 rad/s; and the glass transition temperature (° C.) was calculated therefrom.

(3-1) Elastic Modulus at High-Temperature (240° C.)

The storage elasticity ($10^8$ pa) of the test piece at 240° C. was determined by the measurement in (2).

(3-2) Elastic Modulus at High-Temperature (270° C.)

The storage elasticity ($10^8$ pa) of the test piece at 270° C. was determined by the measurement in (2).

(4) Molding Shrinkage

An epoxy resin composition was molded into six test pieces having an external dimension of 80 mm in length, 10 mm in width, and 3 mm in thickness under the condition above, and the test pieces are post-cured. Then, the length thereof was determined with a vernier caliper at room temperature to an accuracy of three digits after the decimal point, and the shrinkage was determined from the length of the mold during molding (180° C.) previously determined.

(5) Void Resistance

An epoxy resin composition was molded on an aluminum foil into a test piece of a length of 80 mm, a width of 10 mm and a thickness of 3 mm under the condition above and post-cured, and the dilation of the aluminum adhesion surface and the voids on the hardened product surface were evaluated. In evaluation, a sample without dilation or void is indicated with "G" as in good, a sample with some dilation or voids, with "F" as in fair, while, a sample with much dilation and many voids, with "p" as in poor.

[Table 5]

TABLE 5

| | Evaluation of sample | | | | | | | | | | | |
|---|---|---|---|---|---|---|---|---|---|---|---|---|
| Evaluation | Ex. | | | | | | | | Comp. | | | |
| items | 1 | 2 | 3 | 4 | 5 | 6 | 7 | 8 | 1 | 2 | 3 | 4 |
| Hot hardness | 87 | 89 | 89 | 88 | 88 | 86 | 87 | 87 | 76 | 82 | 83 | Unmoldable |
| Tg(° C.) | 187 | 198 | 197 | 195 | 196 | 172 | 183 | 182 | 117 | 125 | 144 | |
| Elastic modulus (240° C.) | 16.4 | 20.4 | 20.1 | 19.5 | 19.3 | 11.4 | 14.6 | 14.4 | 2.0 | 4.3 | 7.1 | |

TABLE 5-continued

| Evaluation items | Ex. 1 | Ex. 2 | Ex. 3 | Ex. 4 | Ex. 5 | Ex. 6 | Ex. 7 | Ex. 8 | Comp. 1 | Comp. 2 | Comp. 3 | Comp. 4 |
|---|---|---|---|---|---|---|---|---|---|---|---|---|
| Elastic modulus (270° C.) | 15.6 | 19.5 | 19.1 | 19.2 | 18.4 | 10.1 | 14.1 | 13.2 | 2.1 | 4.2 | 6.8 | |
| Molding shrinkage | 0.1251 | 0.1025 | 0.1320 | 0.1014 | 0.1380 | 0.1384 | 0.1080 | 0.1172 | 0.3187 | 0.2082 | 0.2053 | |
| Void resistance | G | G | G | G | G | G | G | G | G | G | G | |

[Table 6]

TABLE 6

| Evaluation items | Ex. 9 | Ex. 10 | Ex. 11 | Ex. 12 | Ex. 13 | Comp. 5 | Ex. 14 | Ex. 15 | Ex. 16 | Comp. 6 | Ex. 17 | Comp. 7 |
|---|---|---|---|---|---|---|---|---|---|---|---|---|
| Hot hardness | 89 | 88 | 90 | 88 | 88 | 78 | 91 | 90 | 90 | 89 | 90 | 88 |
| Tg(° C.) | 184 | 144 | 186 | 149 | 170 | 127 | 210 | 200 | 200 | 223 | 222 | 224 |
| Elastic modulus (240° C.) | 12.8 | 4.6 | 12.2 | 6.2 | 9.4 | 2.4 | 31.0 | 19.6 | 21.2 | 15.2 | 34.6 | 10.9 |
| Elastic modulus (270° C.) | 12.0 | 4.0 | 11.6 | 5.5 | 9.1 | 2.5 | 27.0 | 17.4 | 20.2 | 12.8 | 29.9 | 8.8 |
| Molding shrinkage | 0.119 | 0.157 | 0.128 | 0.173 | 0.189 | 0.258 | 0.061 | 0.078 | 0.105 | 0.133 | 0.111 | 0.187 |
| Void resistance | G | G | G | G | G | G | G | G | G | G | G | G |

[Table 7]

TABLE 7

| Evaluation items | Ex. 18 | Ex. 19 | Ex. 20 | Ex. 21 | Ex. 22 | Ex. 23 | Ex. 24 | Ex. 25 | Ex. 26 | Ex. 27 | Ex. 28 | Ex. 29 | Comp. 8 | Comp. 9 |
|---|---|---|---|---|---|---|---|---|---|---|---|---|---|---|
| Hot hardness | 90 | 90 | 90 | 90 | 90 | 90 | 90 | 89 | 90 | 90 | 88 | 90 | 87 | 88 |
| Tg(° C.) | 224 | 207 | 192 | 215 | 217 | 214 | 195 | 217 | 217 | 197 | 187 | 230 | 160 | 230 |
| Elastic modulus (240° C.) | 41.5 | 18.0 | 12.2 | 29.2 | 28.8 | 27.1 | 13.6 | 28.3 | 19.9 | 14.2 | 7.7 | 42.0 | 6.3 | 11.3 |
| Elastic modulus (270° C.) | 35.0 | 15.2 | 12.1 | 24.9 | 24.7 | 23.1 | 13.2 | 24.0 | 18.1 | 13.6 | 7.8 | 30.9 | 6.3 | 8.4 |
| Molding shrinkage | 0.092 | 0.121 | 0.140 | 0.087 | 0.091 | 0.089 | 0.143 | 0.090 | 0.096 | 0.162 | 0.167 | 0.038 | 0.215 | 0.192 |
| Void resistance | G | G | G | G | G | G | G | G | G | G | G | G | G | G |

TABLE 8

| Evaluation items | Ex. | | | | | Comp. | Ex. | | Comp. | |
|---|---|---|---|---|---|---|---|---|---|---|
| | 30 | 31 | 32 | 33 | 34 | 10 | 35 | 36 | 11 | 12 |
| Hot hardness | 90 | 90 | 90 | 90 | 89 | 87 | 89 | 88 | 87 | 89 |
| Tg (°C.) | 207 | 214 | 212 | 206 | 206 | 193 | 229 | 226 | 218 | 222 |
| Elastic modulus (240° C.) | 21.1 | 19.1 | 17.4 | 24.8 | 15.9 | 6.9 | 28.8 | 20.6 | 15.4 | 21.2 |
| Elastic modulus (270° C.) | 18.9 | 17.5 | 15.1 | 21.8 | 14.5 | 6.8 | 22.3 | 16.5 | 13.5 | 17.6 |
| Molding shrinkage | 0.099 | 0.101 | 0.108 | 0.112 | 0.109 | 0.185 | 0.158 | 0.179 | 0.203 | 0.163 |
| Void resistance | G | G | G | G | G | G | F | F | G | P |

All of the samples obtained in Examples 1 to 36 containing the curable resin of the present invention as a curing agent were superior in hot hardness, glass transition temperature, elastic modulus at high temperature and void resistance. In contrast, the samples of Comparative Examples 1 to 11 not containing the curable resin of the present invention as a curing agent were lower in hot hardness, glass transition temperature and/or elastic modulus at high temperature, than the samples in Examples containing the same epoxy resin and filler respectively in the same amounts. The sample of Comparative Example 12, which contained a greater amount of volatile component, was inferior in void resistance. The glass transition temperature of the samples in Examples may be occasionally relatively lower than that of the corresponding samples in Comparative Examples because of the broadening of the tan δ peak, but the elastic modulus at high temperature, in particular at 270° C., was superior to that of Comparative Examples, and thus, the samples were superior in heat resistance. In addition, the curable resins of the present invention were also superior in void resistance, because they contain no volatile component or contain only an extremely small amount of volatile component. Thus obviously, the curable resin of the present invention is superior in heat resistance and gives a hardened product resistant to void formation or cracking.

What is claimed is:

1. A method of producing a curable resin, comprising a step of:
   allowing at least one compound (a) selected from the group consisting of the silane compounds represented by the following Formula (I-1) and the partial condensates thereof to react with phenol compounds (b):

(Wherein,
n denotes a number of 0 or 1;
$R^1$ each independently represents a group selected from the group consisting of a hydrogen atom and substituted or unsubstituted hydrocarbon groups having 1 to 18 carbon atoms, and may be identical or different from each other;
$R^2$ each independently represents a group selected from the group consisting of a halogen atom, a hydroxyl group, substituted or unsubstituted oxy groups having 1 to 18 carbon atoms, substituted or unsubstituted amino groups having 1 to 18 carbon atoms, and carbonyloxy groups having 2 to 18 carbon atoms, and may be identical or different from each other; and
two or more of $R^1$ and $R^2$ may bind to each other to form a cyclic structure);
wherein the phenol compounds (b) include a phenol compound cyclizable with the at least one compound (a) in a total amount of 50 wt % or more with respect to the total weight of the phenol compounds, and the cyclizable phenol compound is selected from the group consisting of compounds shown in Formulas (I-1b) and (I-1g) below:

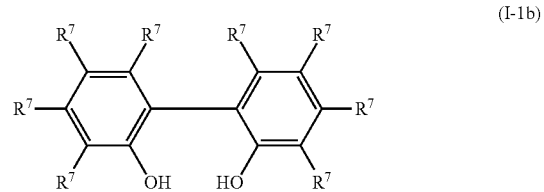

(Wherein, $R^7$ each independently represents a group selected from the group consisting of a hydrogen atom and substituted or unsubstituted organic groups having 1 to 18 carbon atoms and may be identical or different from each other; and two or more $R^7$ may bind to each other to form a cyclic structure); and

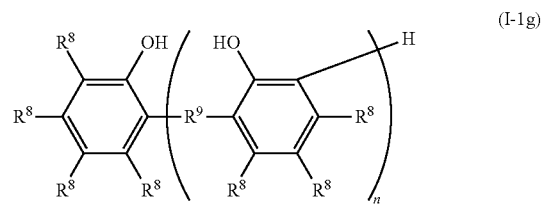

(Wherein, $R^8$ each independently represents a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 1 to 18 carbon atoms; and n is an average number of higher than 1).

2. The production method according to claim 1, wherein the reaction between the compounds (a) and (b) is performed under the presence of a catalyst selected from the group consisting of phosphine compounds, phosphonium salt compounds, cyclic amidine compounds, and cyclic amidinium salts.

3. A method of producing a curable resin, comprising a step of
allowing at least one compound (a) selected from the group consisting of the silane compounds represented by the following Formula (I-1) and partial condensates thereof to react with a phenol compound (b), under the presence of a catalyst selected from the group consisting of phosphine compounds, phosphonium salt compounds, cyclic amidine compounds, and cyclic amidinium salts:

(Wherein,
n denotes a number of 0 to 2;
R¹ each independently represents a group selected from the group consisting of a hydrogen atom and substituted or unsubstituted hydrocarbon groups having 1 to 18 carbon atoms, and may be identical or different from each other;
R² each independently represents a group selected from the group consisting of a halogen atom, a hydroxyl group, substituted or unsubstituted oxy groups having 1 to 18 carbon atoms, substituted or unsubstituted amino groups having 1 to 18 carbon atoms, and carbonyloxy groups having 2 to 18 carbon atom, and may be identical or different from each other; and
two or more of R¹ and R² may bind to each other to form a cyclic structure).

4. The production method according to claim 3, wherein the catalyst is a phosphine compound represented by the following Formula (I-5) or the intermolecular salt thereof:

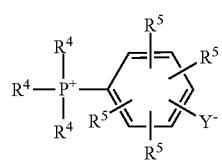

(Wherein,
R⁴ each independently represent a group selected from the group consisting of a hydrogen atom and substituted or unsubstituted hydrocarbon groups having 1 to 18 carbon atoms, and may be identical or different from each other; and two or more of R⁴ may bind to each other to form a cyclic structure;
R⁵ each independently represent a group selected from the group consisting of a hydrogen atom, a hydroxyl group, and substituted or unsubstituted organic groups having 1 to 18 carbon atoms, and may be identical or different from each other; and two or more of R⁵ may bind to each other to form a cyclic structure;
Y⁻ represents an organic group resulting from the release of a proton from an organic group having 0 to 18 carbon atoms and having one or more releasable protons (H⁺); and Y⁻ may bind to one or more R⁵ to form a cyclic structure).

5. An epoxy resin composition, comprising an epoxy resin (A) and a curing agent (B), wherein the curing agent (B) includes a curable resin obtained in reaction of at least one compound (a) selected from the group consisting of the silane compounds represented by the following Formula (I-1) and the partial condensates thereof with phenol compounds (b),
a remaining volatile component in an amount of 10 wt % or less with respect to the total weight of the curable resin, and
the number of the unreacted R² groups in an amount of 10% or less with respect to the total number of the R² groups in the silane compound (a) when the reaction is initiated;

(Wherein,
n denotes a number of 0 or 1;
R¹ each independently represents a group selected from the group consisting of a hydrogen atom and substituted or unsubstituted hydrocarbon groups having 1 to 18 carbon atoms, and may be identical or different from each other;
R² each independently represents a group selected from the group consisting of a halogen atom, a hydroxyl group, substituted or unsubstituted oxy groups having 1 to 18 carbon atoms, substituted or unsubstituted amino groups having 1 to 18 carbon atoms, and carbonyloxy groups having 2 to 18 carbon atoms, and may be identical or different from each other; and
two or more of R¹ and R² may bind to each other to form a cyclic structure);
wherein the phenol compounds (b) include a phenol compound (b1) which reacts with the at least one compound (a) to form a cyclic structure, in a total amount of 50 wt % or more with respect to the total weight of the phenol compounds (b), and the phenol compound (b1) is selected from the group consisting of compounds shown in Formulas (I-1b) and (I-1g) below:

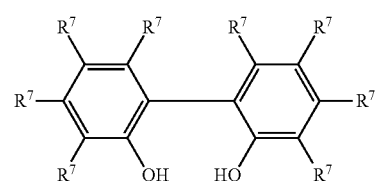

(Wherein, R⁷ each independently represents a group selected from the group consisting of a hydrogen atom and substituted or unsubstituted organic groups having 1 to 18 carbon atoms and may be identical or different from each other; and two or more R⁷ may bind to each other to form a cyclic structure); and

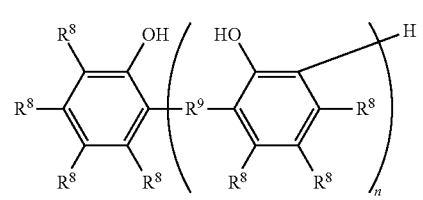

(Wherein, R⁸ each independently represents a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 1 to 18 carbon atoms; and n is an average number of higher than 1).

6. The epoxy resin composition according to claim 5, further including an accelerator (C).

7. The epoxy resin composition according to claim 5, further including an inorganic filler (D).

8. The epoxy resin composition according to claim 5, wherein the epoxy resin (A) includes at least one epoxy resin selected from the group consisting of biphenyl epoxy resins, stilbene epoxy resins, diphenylmethane epoxy resins, sulfur atom-containing epoxy resins, novolak epoxy resins, dicyclopentadiene epoxy resins, salicyl aldehyde epoxy resins, naphthol/phenols copolymerized epoxy resins, and aralkyl phenol resin epoxides, and naphthalene epoxy resins.

9. An electronic device, comprising an element sealed with the epoxy resin composition according to claim 5.

10. The epoxy resin composition according to claim 5, wherein $R^2$ in the at least one compound (a) represents a hydroxyl group or a monovalent oxy group.

11. An epoxy resin composition, comprising an epoxy resin (A) and a curing agent (B), wherein the curing agent (B) includes a curable resin having an aryloxysilyl (ArO—Si) bond, the curable resin comprising at least one structural unit selected from the group consisting of the structural units represented by the following Formulas (I-2a), (I-3a), (I-2b), and (I-3b):

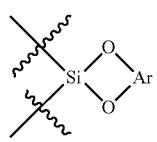

(I-2a)

(Wherein, Ar represents a divalent organic group which is derived from phenol compounds);

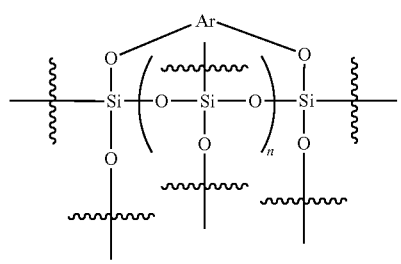

(I-3a)

(Wherein, Ar represents a divalent organic group which is derived from phenol compounds, and n denotes a number of 0 or more);

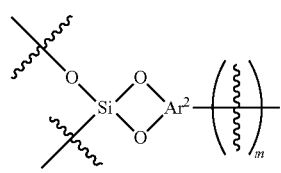

(I-2b)

(Wherein, $Ar^2$ represents a (m+2)-valent organic group which is derived from phenol compounds; and m denotes an integer of one or more); and

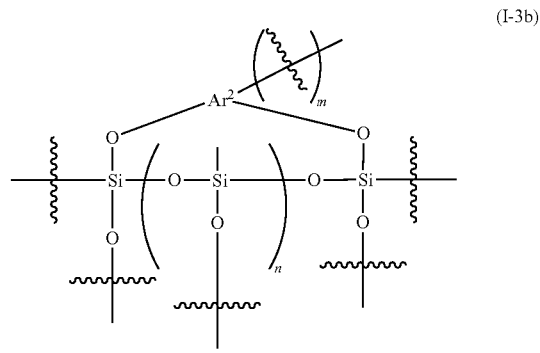

(I-3b)

(Wherein, $Ar^2$ represents a (m+2)-valent organic group which is derived from phenol compounds; n denotes a number of 0 or more; and m denotes an integer of one or more);

wherein the phenol compounds are selected from the group consisting of compounds shown in Formulas (I-1b), (I-1c) and (I-1g) below:

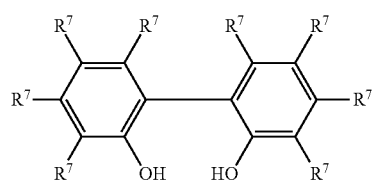

(I-1b)

(Wherein, $R^7$ each independently represents a group selected from the group consisting of a hydrogen atom and substituted or unsubstituted organic groups having 1 to 18 carbon atoms and may be identical or different from each other; and two or more $R^7$ may bind to each other to form a cyclic structure);

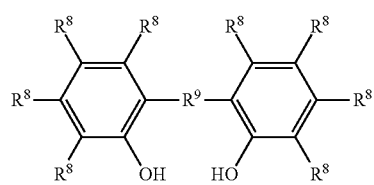

(I-1c)

(Wherein, $R^8$ each independently represents a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 1 to 18 carbon atoms); and

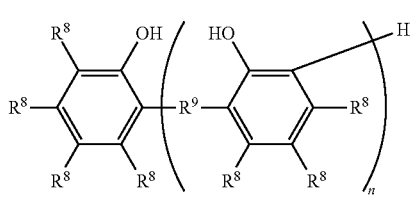

(Wherein, $R^8$ each independently represents a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 1 to 18 carbon atoms; and n is an average number of higher than 1).

12. The epoxy resin composition according to claim 11, further including an accelerator (C).

13. The epoxy resin composition according to claim 11, further including an inorganic filler (D).

14. An electronic device, comprising an element sealed with the epoxy resin composition according to claim 11.

15. The epoxy resin composition according to claim 11, wherein the content of the aryloxysilyl bonds forming the at least one structural unit selected from the group consisting of Formulas (I-2a), (I-3a), (I-2b), and (I-3b) is 30% or more with respect to the total number of the aryloxysilyl bonds in the curable resin.

16. The epoxy resin composition according to claim 11, wherein the curable resin includes a volatile component in an amount of 10 wt % or less with respect to the total weight of the curable resin.

17. A method of producing a curable resin, comprising a step of
allowing at least one compound (a) selected from the group consisting of the silane compounds represented by the following Formula (I-1) and the partial condensates thereof to react with phenol compounds (b):

$$R^1{}_n SiR^2{}_{(4-n)} \qquad (I-1)$$

(Wherein,
n denotes 0;
$R^1$ each independently represents a group selected from the group consisting of a hydrogen atom and substituted or unsubstituted hydrocarbon groups having 1 to 18 carbon atoms, and may be identical or different from each other;
$R^2$ each independently represents a group selected from the group consisting of a halogen atom, a hydroxyl group, substituted or unsubstituted oxy groups having 1 to 18 carbon atoms, substituted or unsubstituted amino groups having 1 to 18 carbon atoms, and carbonyloxy groups having 2 to 18 carbon atom, and may be identical or different from each other; and
two or more of $R^1$ and $R^2$ may bind to each other to form a cyclic structure);
wherein the phenol compounds (b) include a phenol compound cyclizable with the at least one compound (a) in a total amount of 50 wt % or more with respect to the total weight of the phenol compounds, and the cyclizable phenol compound is selected from the group consisting of compounds shown in Formulas (I-1b), (I 1c) and (I-1g) below:

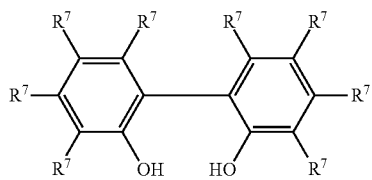

(Wherein, $R^7$ each independently represents a group selected from the group consisting of a hydrogen atom and substituted or unsubstituted organic groups having 1 to 18 carbon atoms and may be identical or different from each other; and two or more $R^7$ may bind to each other to form a cyclic structure); and

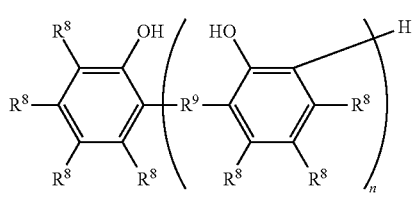

(Wherein, $R^8$ each independently represents a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 1 to 18 carbon atoms; and n is an average number of higher than 1).

18. The production method according to claim 17, wherein the reaction between the compounds (a) and (b) is performed under the presence of a catalyst selected from the group consisting of phosphine compounds, phosphonium salt compounds, cyclic amidine compounds, and cyclic amidinium salts.

19. An epoxy resin composition, comprising an epoxy resin (A) and a curing agent (B), wherein the curing agent (B) includes a curable resin, the curable resin comprising at least one of a compound having the structural unit represented by the following Formula (I-4a) and a compound having the structural unit represented by the following Formula (I-4b):

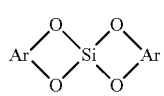

(Wherein, Ar represents a divalent organic group which is derived from phenol compounds); and

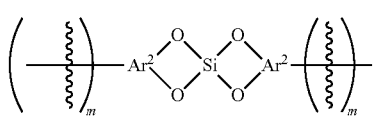

(Wherein, $Ar^2$ represents a (m+2)-valent organic group which is derived from phenol compounds, and each m independently denotes an integer of 1 or more);

wherein the phenol compounds (b) are selected from the group consisting of a compounds shown in Formulas (I-1b), (I-1c) and (I-1g) below:

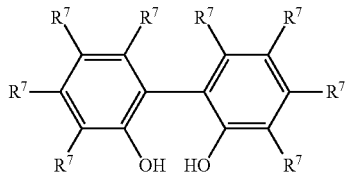
(I-1b)

(Wherein, $R^7$ each independently represents a group selected from the group consisting of a hydrogen atom and substituted or unsubstituted organic groups having 1 to 18 carbon atoms and may be identical or different from each other; and two or more $R^7$ may bind to each other to form a cyclic structure);

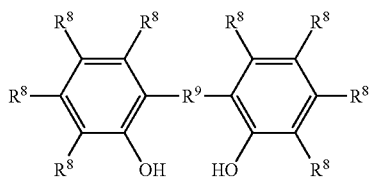
(I-1c)

(Wherein, $R^8$ each independently represents a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 1 to 18 carbon atoms); and

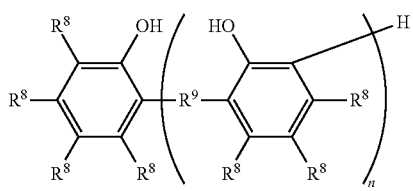
(I-1g)

(Wherein, $R^8$ each independently represents a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 1 to 18 carbon atoms; and n is an average number of higher than 1).

20. The epoxy resin composition according to claim 19, further including an accelerator (C).

21. The epoxy resin composition according to claim 19, further including an inorganic filler (D).

22. An electronic device, comprising an element sealed with the epoxy resin composition according to claim 19.

23. A method of producing a curable resin, comprising a step of
allowing at least one compound (a) selected from the group consisting of the silane compounds represented by the following Formula (I-1) and partial condensates thereof to react with phenol compounds (b), under the presence of a catalyst selected from the group consisting of phosphine compounds, phosphonium salt compounds, cyclic amidine compounds, and cyclic amidinium salts:

$$R^1{}_n SiR^2{}_{(4-n)}$$ (I-1)

(Wherein, n denotes a number of 0 to 2;

$R^1$ each independently represents a group selected from the group consisting of a hydrogen atom and substituted or unsubstituted hydrocarbon groups having 1 to 18 carbon atoms, and may be identical or different from each other;

$R^2$ each independently represents a group selected from the group consisting of a halogen atom, a hydroxyl group, substituted or unsubstituted oxy groups having 1 to 18 carbon atoms, substituted or unsubstituted amino groups having 1 to 18 carbon atoms, and carbonyloxy groups having 2 to 18 carbon atom, and may be identical or different from each other; and two or more of $R^1$ and $R^2$ may bind to each other to form a cyclic structure);

wherein the phenol compounds (b) include a phenol compound (b1) which reacts with the at least one compound (a) to form a cyclic structure, in a total amount of 50 wt % or more with respect to the total weight of the phenol compounds (b), and the phenol compound (b1) is selected from the group consisting of compounds shown in Formulas (I-1b), (I-1c) and (I-1g) below:

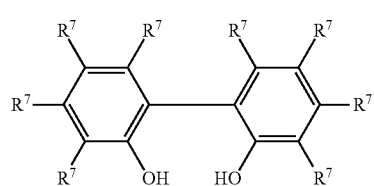
(I-1b)

(Wherein, $R^7$ each independently represents a group selected from the group consisting of a hydrogen atom and substituted or unsubstituted organic groups having 1 to 18 carbon atoms and may be identical or different from each other; and two or more $R^7$ may bind to each other to form a cyclic structure);

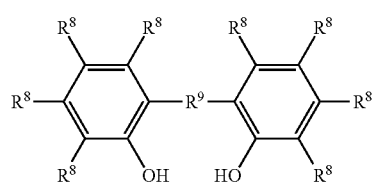
(I-1c)

(Wherein, $R^8$ each independently represents a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 1 to 18 carbon atoms); and

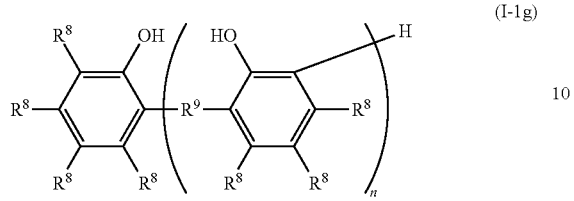

(I-1g)

(Wherein, $R^8$ each independently represents a group selected from the group consisting of a hydrogen atom and substituted or unsubstituted organic groups having 1 to 18 carbon atoms and may be identical or different from each other; two or more of $R^8$ may bind to each other to form a cyclic structure; and $R^9$ represents a divalent organic group having 1 to 18 carbon atoms; and n is an average number of higher than 1).

* * * * *